United States Patent
Hwang et al.

(10) Patent No.: US 12,520,648 B2
(45) Date of Patent: Jan. 6, 2026

(54) DISPLAY DEVICE WITH IMPROVED LIGHTING EFFICIENCY OF PIXELS

(71) Applicant: Samsung Display Co., LTD., Yongin-si (KR)

(72) Inventors: Yong Sik Hwang, Yongin-si (KR); Sang Ho Park, Yongin-si (KR); Seung Kyu Lee, Yongin-si (KR); Hoon Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 449 days.

(21) Appl. No.: 18/105,522

(22) Filed: Feb. 3, 2023

(65) Prior Publication Data

US 2023/0402491 A1     Dec. 14, 2023

(30) Foreign Application Priority Data

May 17, 2022    (KR) .................. 10-2022-0060247

(51) Int. Cl.
*H01L 27/15*     (2006.01)
*G09G 3/32*      (2016.01)
(Continued)

(52) U.S. Cl.
CPC ............. *H10H 29/142* (2025.01); *G09G 3/32* (2013.01); *H10H 20/821* (2025.01);
(Continued)

(58) Field of Classification Search
CPC .. H10H 29/142; H10H 20/821; H10H 20/831; H10H 20/84; G09G 2300/0426; G09G 3/32

See application file for complete search history.

(56) References Cited

U.S. PATENT DOCUMENTS

| 2018/0069162 A1* | 3/2018 | Abe .................. H10H 29/142 |
| 2022/0013543 A1* | 1/2022 | Hosoyachi .......... H10D 86/441 |

(Continued)

FOREIGN PATENT DOCUMENTS

| KR | 10-0601370 | 7/2006 |
| KR | 10-1429095 | 8/2014 |

(Continued)

OTHER PUBLICATIONS

KR10061370, machine translation of IDS reference (Year: 2006).*

(Continued)

*Primary Examiner* — Tracie Y Green
(74) *Attorney, Agent, or Firm* — Womble Bond Dickinson (US) LLP

(57) ABSTRACT

A display device includes a bank defining an emission area; a first passage in which a first light emitting element is disposed in the emission area; a second passage in which a second light emitting element is disposed in the emission area; a third passage in which a third light emitting element is disposed in the emission area; and a fourth passage in which a fourth light emitting element is disposed in the emission area, wherein the emission area has a rectangular shape comprising a first side extending in a first direction and a second side extending in a second direction intersecting the first direction and having a length longer than the first side, and the first passage, the second passage, the third passage, and the fourth passage are spaced apart from each other, and each extends in a third direction intersecting the first direction and the second direction.

9 Claims, 20 Drawing Sheets

(51) Int. Cl.
  *H01L 33/24*   (2010.01)
  *H01L 33/44*   (2010.01)
  *H10H 20/821*  (2025.01)
  *H10H 20/84*   (2025.01)
  *H10H 29/14*   (2025.01)

(52) U.S. Cl.
  CPC ..... *H10H 20/84* (2025.01); *G09G 2300/0819* (2013.01); *G09G 2300/0842* (2013.01)

(56) References Cited

U.S. PATENT DOCUMENTS

2022/0102421 A1* 3/2022 Yang ................... H10H 20/857
2022/0392947 A1* 12/2022 Oh ...................... H01L 25/0753

FOREIGN PATENT DOCUMENTS

| KR | 101476687 B1 * | 12/2014 | ............. H01L 24/83 |
| KR | 10-2018-0009014 | 1/2018 | |
| KR | 10-2018-0011404 | 2/2018 | |
| WO | WO-2021249120 A1 * | 12/2021 | ........... G09G 3/3426 |

OTHER PUBLICATIONS

KR1001429095, machine translation of IDS reference (Year: 2014).*
KR10, machine translation of 892 foreign reference (Year: 2014).*
KR1020180009014 machine translation of IDS reference (Year: 2018).*
KR1020180011404, machine translation of IDS reference (Year: 2018).*

\* cited by examiner

DISPLAY DEVICE WITH IMPROVED LIGHTING EFFICIENCY OF PIXELS

CROSS-REFERENCE TO RELATED APPLICATION

This application claims priority to and benefits of Korean Patent Application No. 10-2022-0060247 under 35 U.S.C. 119, filed on May 17, 2022 in the Korean Intellectual Property Office (KIPO), the entire contents of which are incorporated herein by reference.

BACKGROUND

1. Technical Field

The disclosure relates to a display device.

2. Description of the Related Art

The importance of display devices has steadily increased with the development of multimedia technology. In response thereto, various types of display devices such as an organic light emitting display (OLED), a liquid crystal display (LCD) and the like have been used.

A display device is a device that displays an image, and includes a display panel, such as an organic light emitting display panel or a liquid crystal display panel. The light emitting display panel may include light emitting elements, e.g., light emitting diodes (LED), and examples of the light emitting diode include an organic light emitting diode (OLED) using an organic material as a fluorescent material and an inorganic light emitting diode using an inorganic material as a fluorescent material.

An inorganic light emitting diode using an inorganic semiconductor as a fluorescent material has an advantage in that it has durability even in a high temperature environment, and has higher efficiency of blue light than an organic light emitting diode.

SUMMARY

Aspects of the disclosure provide a display device with improved lighting efficiency of pixels.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an embodiment of the disclosure, a display device includes, an external bank disposed on a substrate and defining an emission area; a first passage in which a first light emitting element is disposed in the emission area; a second passage in which a second light emitting element is disposed in the emission area; a third passage in which a third light emitting element is disposed in the emission area; and a fourth passage in which a fourth light emitting element is disposed in the emission area. The emission area has a rectangular shape including a first side extending in a first direction and a second side extending in a second direction intersecting the first direction and having a length longer than the first side, and the first passage, the second passage, the third passage, and the fourth passage are spaced apart from each other, and each extends in a third direction intersecting the first direction and the second direction.

In an embodiment, a length of each of the first passage, the second passage, the third passage, and the fourth passage may be substantially equal to or greater than one half of a length of the second side of the emission area.

In an embodiment, the length of each of the first passage, the second passage, the third passage, and the fourth passage may be substantially equal to or greater than about 44 µm.

In an embodiment, each of the first light emitting element, the second light emitting element, the third light emitting element and the fourth light emitting element may include an end having a first polarity; and another end having a second polarity different from the first polarity, and the another end of the first light emitting element may be electrically connected to one end of the second light emitting element, the another end of the second light emitting element may be electrically connected to the end of the third light emitting element, and the another end of the third light emitting element may be electrically connected to the end of the fourth light emitting element.

In an embodiment, a display device may further include an alignment electrode disposed between the substrate and the bank. The alignment electrode may include a first alignment electrode on which the end of the first light emitting element and the end of the second light emitting element are disposed; a second alignment electrode on which the another end of the first light emitting element, the another end of the second light emitting element, the another end of the third light emitting element, and the another end of the fourth light emitting element may be disposed; and a third alignment electrode on which the another end of the third light emitting element and the another end of the fourth light emitting element may be disposed. The first alignment electrode, the second alignment electrode, and the third alignment electrode may be spaced apart from each other, and each may extend in the third direction in the emission area, and the first light emitting element, the second light emitting element, the third light emitting element and the fourth light emitting element are spaced apart from each other.

In an embodiment, a display device may further include a circuit element layer disposed between the substrate and the alignment electrode. The first alignment electrode may be electrically connected to the circuit element layer to receive a first voltage, and the second alignment electrode may be electrically connected to the circuit element layer and may receive a second voltage.

In an embodiment, a display device may further include a first connection electrode electrically connected to the first alignment electrode and supplying the first voltage to the end of the first light emitting element; a second connection electrode that electrically connects the another end of the first light emitting element with the end of the second light emitting element; a third connection electrode that electrically connects the another end of the second light emitting element with the end of the third light emitting element; a fourth connection electrode that electrically connects the another end of the third light emitting element with the end of the fourth light emitting element; and a fifth connection electrode electrically connected to the second alignment electrode and supplying the second voltage to the another end of the fourth light emitting element. The first connection electrode, the second connection electrode, the third connection electrode, the fourth connection electrode, and the fifth connection electrode may be each spaced apart from each other.

In an embodiment, the second connection electrode may include a first portion disposed on the another end of the first light emitting element; a second portion disposed on the end of the second light emitting element; and a first connection portion that connects the first portion with the second portion. The fourth connection electrode may include a third portion disposed on the end of the third light emitting element; a fourth portion disposed on the another end of the fourth light emitting element; and a second connection portion that connects the third portion with the fourth portion. The first connection portion may pass through a separation space between the first passage and the second passage, and the second connection portion may pass through a separation space between the third passage and the fourth passage.

In an embodiment, the first alignment electrode and the circuit element layer may be electrically connected through a first contact hole that does not overlap the emission area in plan view, the second alignment electrode and the circuit element layer may be electrically connected through a second contact hole that does not overlap the emission area in plan view, the first connection electrode and the first alignment electrode may be electrically connected through a third contact hole that does not overlap the emission area in plan view, and the fifth connection electrode and the second alignment electrode may be electrically connected through a fourth contact hole that does not overlap the emission area in plan view.

According to an embodiment of the disclosure, a display device includes a bank disposed on a substrate and defining an emission area; a first passage in which a first light emitting element is disposed in the emission area; a second passage in which a second light emitting element is disposed in the emission area; a third passage in which a third light emitting element is disposed in the emission area; and a fourth passage in which a fourth light emitting element is disposed in the emission area. The emission area has a rectangular shape including a first side extending in a first direction and a second side extending in a second direction intersecting the first direction and having a length longer than the first side, and the first passage, the second passage, the third passage, and the fourth passage are spaced apart from each other, each of the first passage and the third passage extends in a third direction intersecting the first direction and the second direction, and each of the second passage and the fourth passage extends in a fourth direction intersecting the first direction, the second direction, and the third direction.

In an embodiment, a length of each of the first passage, the second passage, the third passage, and the fourth passage may be substantially equal to or greater than one half of a length of the second side of the emission area.

In an embodiment, the length of each of the first passage, the second passage, the third passage, and the fourth passage may be substantially equal to or greater than about 44 µm.

In an embodiment, each of the first light emitting element, the second light emitting element, the third light emitting element and the fourth light emitting element may include an end having a first polarity; and another end having a second polarity different from the first polarity, and the another end of the first light emitting element may be electrically connected to the end of the second light emitting element, the another end of the second light emitting element may be electrically connected to one end of the third light emitting element, and the other end of the third light emitting element may be electrically connected to the end of the fourth light emitting element.

In an embodiment, a display device may further include an alignment electrode disposed between the substrate and the external bank. The alignment electrode may include a first alignment electrode on which the end of the first light emitting element and the end of the second light emitting element are disposed; a second alignment electrode on which the another end of the first light emitting element and the another end of the second light emitting element are disposed; a third alignment electrode on which the end of the third light emitting element and the end of the fourth light emitting element are disposed; and a fourth alignment electrode on which the another end of the third light emitting element and the another end of the fourth light emitting element are disposed. The first alignment electrode, the second alignment electrode, the third alignment electrode, and the fourth alignment electrode may be spaced apart from each other.

According to an embodiment of the disclosure, a display device includes a bank disposed on a substrate and defining an emission area; a first passage in which a first light emitting element is disposed in the emission area; a second passage in which a second light emitting element is disposed in the emission area; a third passage in which a third light emitting element is disposed in the emission area; and a fourth passage in which a fourth light emitting element is disposed in the emission area. The emission area has a rectangular shape including a first side extending in a first direction and a second side extending in a second direction intersecting the first direction and having a length longer than the first side, and the first passage, the second passage, the third passage, and the fourth passage each have a shape curved at least once, and are spaced apart from each other.

In an embodiment, a length of each of the first passage, the second passage, the third passage, and the fourth passage may be substantially equal to or greater than one half of a length of the second side of the emission area.

In an embodiment, the length of each of the first passage, the second passage, the third passage, and the fourth passage may be substantially equal to or greater than about 44 µm.

In an embodiment, each of the first light emitting element, the second light emitting element, the third light emitting element and the fourth light emitting element may include an end having a first polarity; and another end having a second polarity different from the first polarity, and the another end of the first light emitting element may be electrically connected to the end of the second light emitting element, the another end of the second light emitting element may be electrically connected to the end of the third light emitting element, and the another end of the third light emitting element may be electrically connected to one end of the fourth light emitting element.

In an embodiment, a display device may further include an alignment electrode disposed between the substrate and the bank. The alignment electrode may include a first alignment electrode on which the end of the first light emitting element and the end of the second light emitting element may be disposed; a second alignment electrode on which the another end of the first light emitting element and the another end of the second light emitting element may be disposed; a third alignment electrode on which the end of the third light emitting element and the end of the fourth light emitting element may be disposed; and a fourth alignment electrode on which the another end of the third light emitting element and the another end of the fourth light emitting element may be disposed. The first alignment electrode, the second alignment electrode, the third alignment electrode, and the fourth alignment electrode may be spaced apart from each other.

In an embodiment, the first passage and the second passage may be disposed in a separation space between the first alignment electrode and the second alignment electrode, and the third passage and the fourth passage may be disposed in a separation space between the second alignment electrode and the third alignment electrode.

In the display device according to an embodiment, lighting efficiency of pixels may be improved.

However, the effects of the disclosure are not limited to the aforementioned effects, and various other effects are included in the disclosure.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
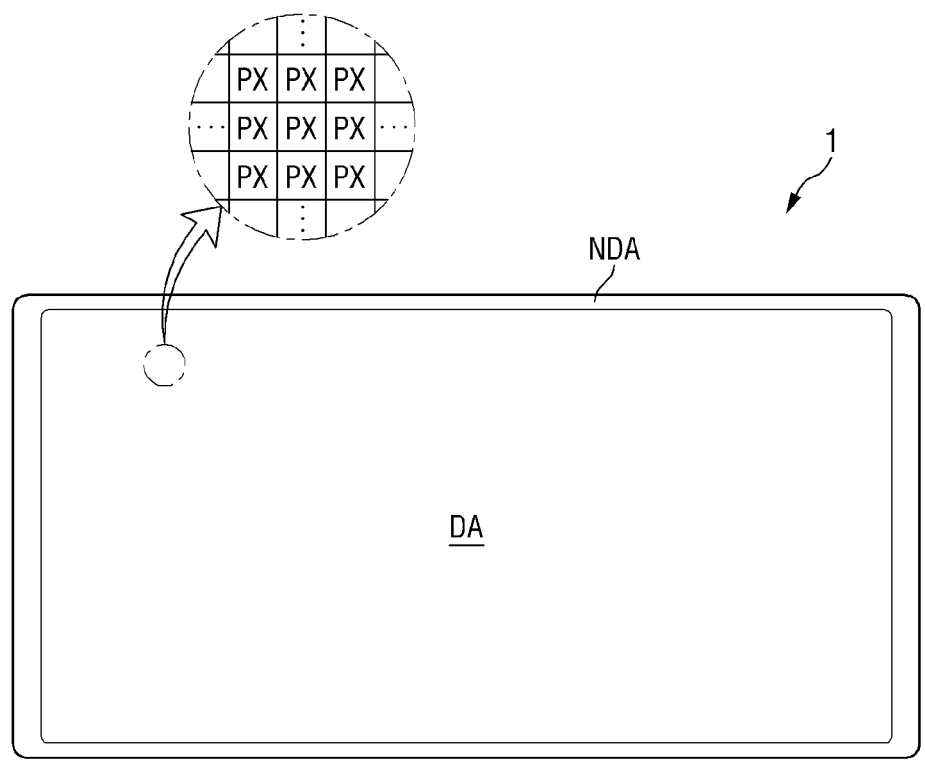
FIG. 1 is a schematic plan view of a display device according to an embodiment.
Figure 1:
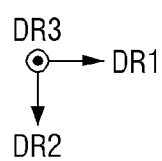

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be more thorough and complete, and will convey the scope of the disclosure to those skilled in the art.

The same reference numbers indicate the same components throughout the specification. When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. It may also be understood that if one part and another part are connected, they may be integral with each other.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Features of each of various embodiments of the disclosure may be partially or entirely combined with each other and may technically variously interwork with each other, and respective embodiments may be implemented independently of each other or may be implemented together in association with each other.

Spatially relative terms, such as "beneath," "below," "under," "lower," "on," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

The term "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The term "and/or" includes all combinations of one or more of which associated configurations may define. For example, "A and/or B" may be understood to mean "A, B, or A and B."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Hereinafter, illustrative embodiments will be described in detail with reference to the accompanying drawings.

FIG. 1 is a schematic plan view of a display device according to an embodiment.

A first direction DR1, a second direction DR2, and a third direction DR3 are defined as shown in FIG. 1. The first direction DR1 and the second direction DR2 may be perpendicular to each other, the first direction DR1 and the third direction DR3 may be perpendicular to each other, and the second direction DR2 and the third direction DR3 may be perpendicular to each other. It may be understood that the first direction DR1 refers to a horizontal direction in the drawing, the second direction DR2 refers to a vertical direction in the drawing, and the third direction DR3 refers to an upward and downward direction (e.g., a thickness direction) in the drawing.

In the following specification, unless otherwise stated, "direction" may refer to both of directions extending in the direction. Further, when it is necessary to distinguish both "directions" extending in both sides, a side will be referred to as "one side in the direction" and the other side will be referred to as "the other side in the direction." Referring to FIG. 1, a direction in which an arrow is directed is referred to as one side, and the opposite direction is referred to as the other side.

Hereinafter, for simplicity of description, in referring to a display device 1 or the surfaces of each member constituting the display device 1, one surface facing to one side in the direction in which an image is displayed, for example, the third direction DR3 is referred to as a top surface, and the opposite surface of the surface is referred to as a bottom surface. However, the disclosure is not limited thereto, and the surface and the other surface of the member may be referred to as a front surface and a rear surface, respectively, or may also be referred to as a first surface or a second surface. In addition, in describing the relative position of each of the members of the display device 1, one side in the third direction DR3 may be referred to as an upper side and the other side in the third direction DR3 may be referred to as a lower side.

Referring to FIG. 1, a display device 1 may display a moving image or a still image. The display device 1 may refer to any electronic device providing a display screen. Examples of the display device 1 may include a television, a laptop computer, a monitor, a billboard, an Internet of things (IoT) device, a mobile phone, a smartphone, a tablet personal computer (PC), an electronic watch, a smartwatch, a watch phone, a head-mounted display, a mobile communication terminal, an electronic notebook, an e-book reader, a portable multimedia player (PMP), a navigation device, a game machine, a digital camera, a camcorder and the like, which provide a display screen.

The display device 1 may include a display panel which provides a display screen. Examples of the display panel may include an inorganic light emitting diode display panel, an organic light emitting display panel, a quantum dot light emitting display panel, a plasma display panel and a field emission display panel. In the following description, a case where an inorganic light emitting diode display panel is applied as a display panel will be exemplified, but the disclosure is not limited thereto, and other display panels may be applied within the same scope of technical spirit.

The shape of the display device 1 may be variously modified. For example, the display device 1 may have a shape such as a rectangular shape elongated in a horizontal direction, a rectangular shape elongated in a vertical direction, a square shape, a quadrilateral shape with rounded corners (vertices), other polygonal shapes, and a circular shape. The shape of a display area DA of the display device 1 may also be similar to the overall shape of the display device 1. FIG. 1 illustrates the display device 1 having a rectangular shape elongated in a second direction DR2.

The display device 1 may include the display area DA and a non-display area NDA. The display area DA is an area where an image can be displayed, and the non-display area NDA is an area where an image is not displayed. The display area DA may also be referred to as an active region, and the non-display area NDA may also be referred to as a non-active region. The display area DA may substantially occupy the center of the display device 1.

The display area DA may include pixels PX. The pixels PX may be arranged in a matrix. The shape of each pixel PX may be a rectangular or square shape in plan view. However, the disclosure is not limited thereto, and it may be a rhombic shape in which each side is inclined with respect to a direction. The pixels PX may be arranged in a stripe type or an island type. Each of the pixels PX may include one or more light emitting elements that emit light of a specific wavelength band to display a specific color.

The non-display area NDA may be disposed around the display area DA. The non-display area NDA may completely or partially surround the display area DA. The display area DA may have a rectangular shape, and the non-display area NDA may be disposed adjacent to four sides of the display area DA. The non-display area NDA may form or include a bezel of the display device 1. Wires or circuit drivers included in the display device 1 may be disposed in the non-display area NDA, or external devices may be mounted thereon.

Figure 2:
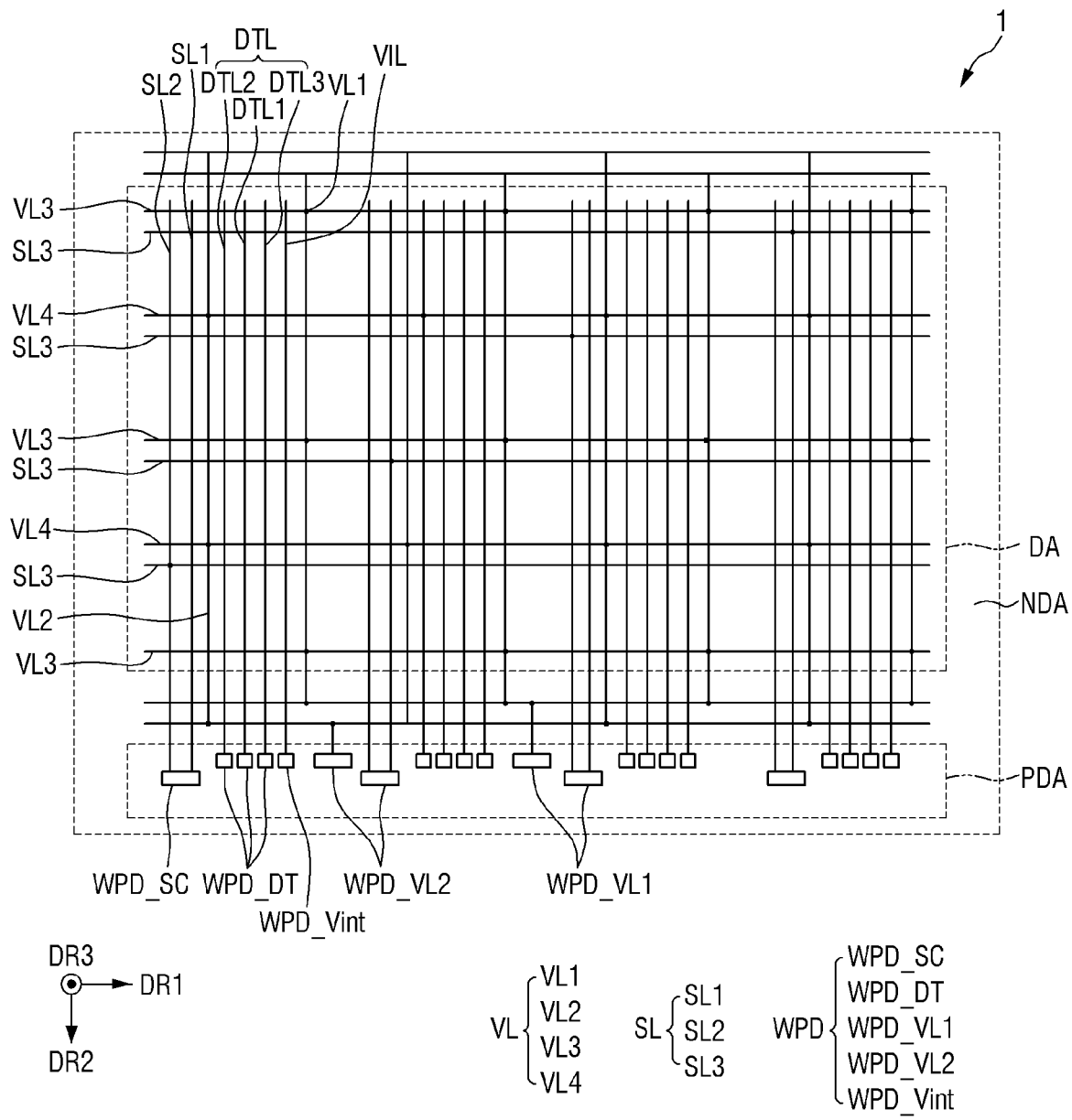
FIG. 2 is a schematic layout view illustrating a plurality of wires of a display device according to an embodiment.

FIG. 2 is a schematic layout view illustrating wires of a display device according to an embodiment.

Referring to FIG. 2, the display device 1 may include wires. The display device 1 may include scan lines SL (SL1, SL2, and SL3), data lines DTL (DTL1, DTL2, and DTL3), an initialization voltage line VIL, and voltage lines VL (VL1, VL2, VL3, and VL4). Although not shown in the drawing, other wires may be further provided in the display device 1. The wires may include wires formed as (or formed of) a first conductive layer and extending in a first direction DR1, and wires formed as a third conductive layer and extending in the second direction DR2. However, the extension directions of the wires are not limited thereto.

The first scan line SL1 and the second scan line SL2 may be disposed to extend in the second direction DR2. The first scan line SL1 and the second scan line SL2 may be disposed adjacent to each other, and may be disposed to be spaced apart from another first scan line SL1 and another second scan line SL2 in the first direction DR1. The first scan line SL1 and the second scan line SL2 may be connected to a scan line pad WPD_SC connected to a scan driver (not illustrated). The first scan line SL1 and the second scan line SL2 may be disposed to extend from a pad area PDA, disposed in the non-display area NDA, to the display area DA.

The third scan line SL3 may be disposed to extend in the second direction DR2, and may be disposed to be spaced apart from another third scan line SL3 in the first direction DR1. A third scan line SL3 may be connected to one or more first scan lines SL1 or one or more second scan lines SL2. The scan lines SL may have a mesh structure in the entire surface of the display area DA, but the disclosure is not limited thereto.

The data lines DTL may be disposed to extend in the first direction DR1. The data line DTL may include a first data line DTL1, a second data line DTL2, and a third data line DTL3, and each one of the first to third data lines DTL1, DTL2, and DTL3 may form a pair and may be disposed adjacent to each other. Each of the data lines DTL1, DTL2, and DTL3 may be disposed to extend from the pad area PDA disposed in the non-display area NDA to the display area DA. However, the disclosure is not limited thereto, and the data lines DTL may be spaced apart from each other at substantially equal intervals between a first voltage line VL1 and a second voltage line VL2 to be described below.

The initialization voltage line VIL may be disposed to extend in the first direction DR1. The initialization voltage line VIL may be disposed between the data lines DTL and the first voltage line VL1. The initialization voltage line VIL may be disposed to extend from the pad area PDA disposed in the non-display area NDA to the display area DA.

The first voltage line VL1 and the second voltage line VL2 may be disposed to extend in the second direction DR2, and the third voltage line VL3 and the fourth voltage line VL4 may be disposed to extend in the second direction DR1. The first voltage line VL1 and the second voltage line VL2 may be alternately disposed in the first direction DR1, and the third voltage line VL3 and the fourth voltage line VL4 may be alternately disposed in the second direction DR2. The third voltage line VL3 and the fourth voltage line VL4 may be disposed to extend in the first direction DR1 to cross (or intersect) the display area DA, and as for the first voltage line VL1 and the second voltage line VL2, some of the wires may be disposed in the display area DA and other wires may be disposed in the non-display area NDA positioned on sides of the display area DA in the first direction DR1. The first voltage line VL1 and the second voltage line VL2 may be formed as the first conductive layer, and the third voltage line VL3 and the fourth voltage line VL4 may be formed as the third conductive layer disposed on a layer different from the first conductive layer. The first voltage line VL1 may be connected to at least one third voltage line VL3, the second voltage line VL2 may be connected to at least one fourth voltage line VL4, and the voltage lines VL may have a mesh structure in the entire display area DA. However, the disclosure is not limited thereto.

The first scan line SL1, the second scan line SL2, the data line DTL, the initialization voltage line VIL, the first voltage line VL1, and the second voltage line VL2 may be electrically connected to at least one line pad WPD. Each line pad WPD may be disposed in the non-display area NDA. In an embodiment, each of the line pads WPD may be disposed in the pad area PDA positioned on a lower side, which is another side of the display area DA in the second direction DR2. The first scan line SL1 and the second scan line SL2 may be connected to the scan line pad WPD_SC disposed in the pad area PDA, and the data lines DTL may be connected to data line pads WPD_DT different from each other, respectively. The initialization voltage line VIL may be connected to an initialization line pad WPD_Vint, the first voltage line VL1 may be connected to a first voltage line pad WPD_VL1, and the second voltage line VL2 is connected to a second voltage line pad WPD_VL2. The external devices may be mounted on the line pads WPD. The external devices may be mounted on the line pads WPD by applying an anisotropic conductive film, ultrasonic bonding or the like. FIG. 2 illustrates as an example that each of the line pads WPD is disposed on the pad area PDA disposed on the lower side of the display area DA, but the disclosure is not limited thereto. Some of the line pads WPD may be disposed in an area on the upper side or on the left and right sides of the display area DA.

Each pixel PX or sub-pixel SPXn (where n is an integer of about 1 to about 3) of the display device 1 may include a pixel driving circuit. The above-described wires may pass through each pixel PX or the vicinity thereof to apply a driving signal to each pixel driving circuit. The pixel driving circuit may include transistors and capacitors. The number of the transistors and the capacitors of each pixel driving circuit may be variously modified. According to an embodiment, in each sub-pixel SPXn of the display device 1, the pixel driving circuit may have a 3T1C structure including three transistors and one capacitor. Hereinafter, the pixel driving circuit of the 3T1C structure will be described as an example, but the disclosure is not limited thereto, and various other modified structures such as a 2T1C structure, a 7T1C structure, and a 6T1C structure may be applied.

Figure 3:
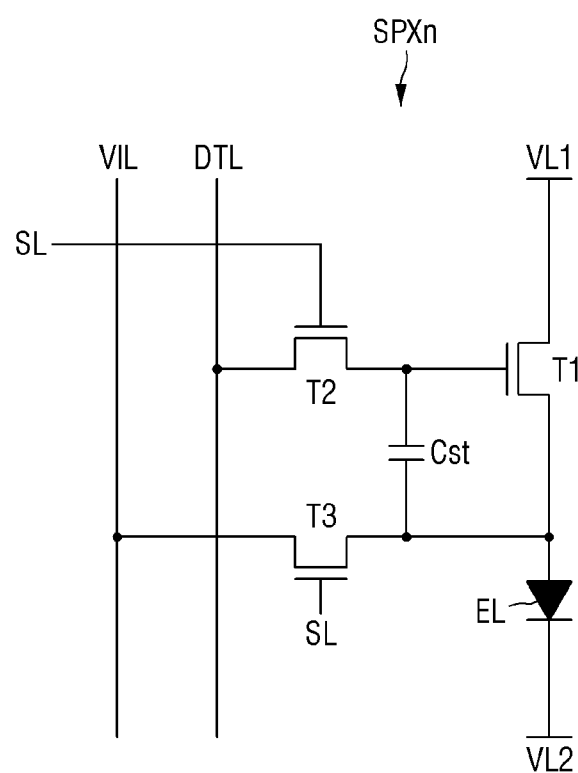
FIG. 3 is a schematic diagram of an equivalent circuit of a pixel of a display device according to an embodiment.

FIG. 3 is a schematic diagram of an equivalent circuit of a pixel of a display device according to an embodiment.

Referring to FIG. 3, each sub-pixel SPXn of the display device 1 according to an embodiment may include three transistors T1, T2 and T3 and one storage capacitor Cst in addition to a light emitting diode EL.

The light emitting diode EL may emit light by a current supplied through a first transistor T1. The light emitting diode EL may include a first electrode, a second electrode, and at least one light emitting element disposed between them. The light emitting element may emit light of a specific wavelength band by electrical signals transmitted from the first electrode and the second electrode.

An end of the light emitting diode EL may be connected to a source electrode of the first transistor T1, and another end thereof may be connected to the second voltage line VL2 to which a low-potential voltage (hereinafter a second power voltage) lower than a high-potential voltage (hereinafter a first power voltage) of the first voltage line VL1 is supplied.

The first transistor T1 may adjust a current flowing from the first voltage line VL1, to which the first power voltage is supplied, to the light emitting diode EL according to the voltage difference between a gate electrode and the source electrode. For example, the first transistor T1 may be a driving transistor for driving the light emitting diode EL. The gate electrode of the first transistor T1 may be connected to a source electrode of the second transistor T2, the source electrode of the first transistor T1 may be connected to the first electrode of the light emitting diode EL, and a drain electrode of the first transistor T1 may be connected to the first voltage line VL1 to which the first power voltage is applied.

The second transistor T2 may be turned on by a scan signal from the scan line SL to connect the data line DTL to the gate electrode of the first transistor T1. A gate electrode of the second transistor T2 may be connected to the scan line SL, a source electrode thereof may be connected to the gate electrode of the first transistor T1, and a drain electrode thereof may be connected to the data line DTL.

The third transistor T3 may be turned on by a scan signal from the scan line SL to connect the initialization voltage line VIL to an end of the light emitting diode EL. A gate electrode of the third transistor T3 may be connected to the scan line SL, a drain electrode thereof may be connected to the initialization voltage line VIL, and a source electrode thereof may be connected to the end of the light emitting diode EL or to the source electrode of the first transistor T1.

In an embodiment, the source electrode and the drain electrode of each of the transistors T1, T2, and T3 are not limited to those described above, and vice versa. Each of the transistors T1, T2, and T3 may be formed as a thin-film transistor. In FIG. 3, each of the transistors T1, T2, and T3 has been illustrated as being formed as an N-type metal oxide semiconductor field effect transistor (MOSFET), but the disclosure is not limited thereto. For example, each of the transistors T1, T2, and T3 may be formed as a P-type MOSFET. As another example, some of the transistors T1, T2, and T3 may be formed as an N-type MOSFET and the others may be formed as a P-type MOSFET.

The storage capacitor Cst may be formed between the gate electrode and the source electrode of the first transistor T1. The storage capacitor Cst may store a difference voltage between a gate voltage and a source voltage of the first transistor T1.

In the embodiment of FIG. 3, the gate electrode of the second transistor T2 may be connected to the scan line SL1, and the gate electrode of the third transistor T3 may be connected to the scan line SL2. In other words, the second transistor T2 and the third transistor T3 may be turned on in response to a scan signal applied from a same scan line. However, the disclosure is not limited thereto, and the second transistor T2 and the third transistor T3 may be connected to different scan lines to be turned on in response to scan signals applied from different scan lines.

Hereinafter, a structure of the pixel PX of the display device 1 according to an embodiment will be described.

Figure 4:
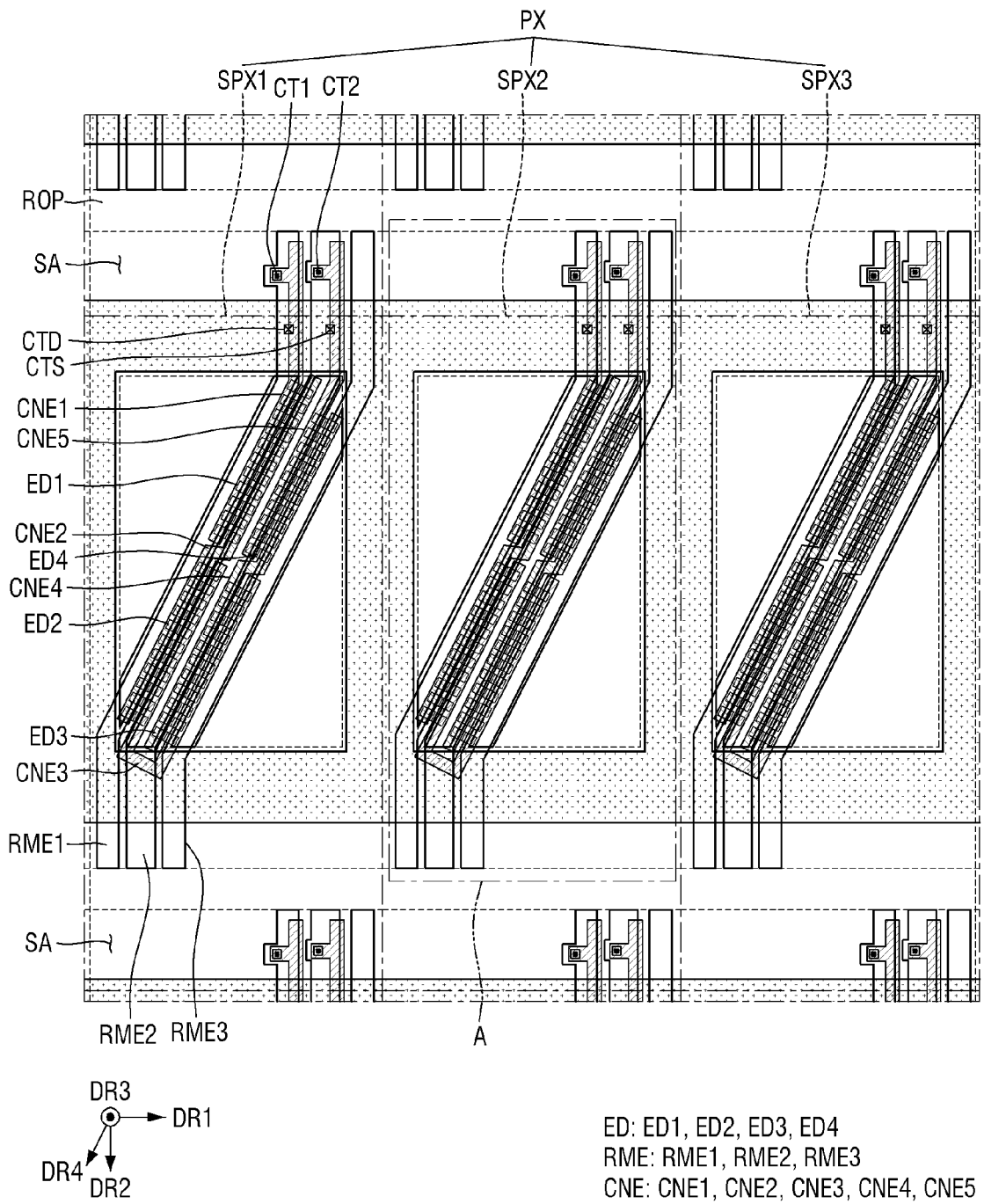
FIG. 4 is a schematic plan view illustrating a structure of a pixel of a display device according to an embodiment.
Figure 5:
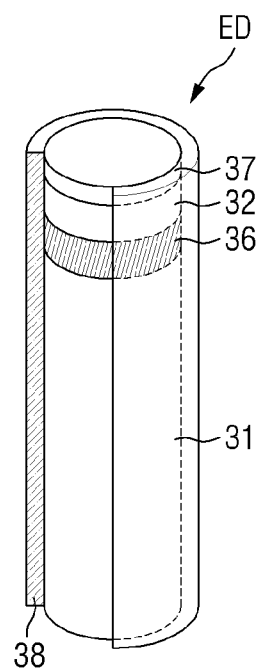
FIG. 5 is a schematic structural diagram of the light emitting element of FIG. 4.

FIG. 4 is a schematic plan view illustrating a structure of a pixel of a display device according to an embodiment. FIG. 5 is a schematic structural diagram of the light emitting element of FIG. 4.

FIG. 4 illustrates a planar disposition of alignment electrodes RME, a bank or external bank BNL (hereinafter "external bank"), light emitting elements ED, and a connection electrode CNE disposed in a pixel PX of the display device 1.

In FIG. 4, a fourth direction DR4 is additionally defined. The fourth direction DR4 may refer to an oblique direction passing between the first direction DR1 and the second direction DR2. With reference to FIG. 4, one side in the fourth direction DR4 may refer to a direction between one side in the second direction DR2 and the other side in the first direction DR1, and the other side in the fourth direction DR4 may refer to a direction between the other side in the second direction DR2 and one side in the first direction DR1. The fourth direction DR4 may be a direction on a plane defined by the first direction DR1 and the second direction DR2, and may be perpendicular to the third direction DR3.

Referring to FIG. 4, each of the pixels PX of the display device 1 may include sub-pixels SPXn. For example, a pixel PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. For example, the first color may be blue, the second color may be green, and the third color may be red. However, the disclosure is not limited thereto, and the sub-pixels SPXn may emit light of a same color. In an embodiment, each of the sub-pixels SPXn may emit blue light. Although FIG. 4 illustrates that a pixel PX includes three sub-pixels SPXn, the disclosure is not limited thereto, and the pixel PX may include a larger number of sub-pixels SPXn.

Each sub-pixel SPXn of the display device 1 may include an emission area EMA and a non-emission area. The emission area EMA may be an area in which the light emitting element ED is disposed to emit light of a specific wavelength band. The non-emission area may be an area in which the light emitting element ED is not disposed and from which light is not emitted because light emitted from the light emitting element ED does not reach the area.

The emission area EMA may be defined by the external bank BNL. In other words, the emission area EMA may be a space surrounded by the external bank BNL. The emission area EMA may have a rectangular shape including a short side in the first direction DR1 and a long side in the second direction DR2. This may be for facilitating ejection of the light emitting element ED using inkjet printing. A detailed description of the shape of the emission area EMA will be provided below.

The emission area EMA may include a region in which the light emitting element ED is disposed, and a region which is adjacent to the light emitting element ED and from which the lights emitted from the light emitting element ED are emitted. For example, the emission area EMA may further include a region in which the light emitted from the light emitting element ED is reflected or refracted by another member and emitted. The light emitting elements ED may be disposed in each sub-pixel SPXn, and the emission area EMA may be formed to include an area where the light emitting elements ED are disposed and an area adjacent thereto.

Although it is shown in the drawing that the sub-pixels SPXn have the emission areas EMA that are substantially identical in size, the disclosure is not limited thereto. In some embodiments, the emission areas EMA of the sub-pixels SPXn may have different sizes according to a color or wavelength band of light emitted from the light emitting element ED disposed in each sub-pixel SPXn.

Each sub-pixel SPXn may further include a sub-region SA disposed in the non-emission area. The sub-region SA may be a divided area according to the disposition of the alignment electrodes RME. The sub-region SA may be disposed on a side and the other side in the second direction DR2 in the emission area EMA. The emission areas EMA may be alternately arranged in the first direction DR1, and the sub-region SA may extend in the first direction DR1. Each of emission areas EMA and the sub-regions SA may be repeatedly disposed in the second direction DR2. Each of the emission areas EMA may be disposed between the sub-regions SA.

The sub-region SA may be a region shared by the sub-pixels SPXn adjacent to each other in the first direction DR1. For example, the first sub-pixel SPX1, the second sub-pixel SPX2, and the third sub-pixel SPX3 may share the sub-region SA. The sub-region SA may be a region shared by the sub-pixels SPXn adjacent to each other in the second direction DR2. For example, the sub-regions SA disposed on sides of an external bank BNL in the second direction DR2 illustrated in FIG. 4 may be shared by the sub-pixel SPXn illustrated in the drawing and the sub-pixels SPXn not illustrated in the drawing and adjacent to each other in the second direction DR2.

Light may not be emitted from the sub-region SA because the light emitting element ED is not disposed in the sub-region SA, but a portion of an alignment electrode RME disposed in each sub-pixel SPXn may be partially disposed in the sub-region SA. The alignment electrodes RME disposed in different sub-pixels SPXn may be disposed to be separated at a separation portion ROP of the sub-region SA.

Alignment electrodes RME and the connection electrodes CNE are disposed in each sub-pixel SPXn in a shape extending in the fourth direction DR4.

The alignment electrode RME may include a first alignment electrode RME1, a second alignment electrode RME2, and a third alignment electrode RME3. The first alignment electrode RME1, the second alignment electrode RME2, and the third alignment electrode RME3 may be disposed to be spaced apart from each other in the first direction DR1. The alignment electrodes RME may include passages EDA1, EDA2, EDA3, and EDA4 (see FIG. 7) spaced apart from each other in the first direction DR1, in which the light emitting element ED is disposed. A detailed description of the alignment electrodes RME will be described below.

The second alignment electrode RME2 may be disposed between the first alignment electrode RME1 and the third alignment electrode RME3. The second alignment electrode RME2 may extend through a central portion of the emission area EMA, the first alignment electrode RME1 may be disposed on another side of the second alignment electrode RME2 in the first direction DR1, and the third alignment electrode RME3 may be disposed on a side of the second alignment electrode RME2 in the first direction DR1.

The first alignment electrode RME1 and the second alignment electrode RME2 may be electrically connected to a circuit element layer to be described below through a contact hole penetrating the external bank BNL. The first alignment electrode RME1 may be electrically connected to a circuit element layer disposed under the external bank BNL through a first electrode contact hole CTD that does not overlap the emission area EMA, and the second alignment electrode RME2 may be electrically connected to a circuit element layer disposed under the external bank BNL through a second electrode contact hole CTS that does not overlap the emission area EMA (see FIG. 9).

In some embodiments, the third alignment electrode RME3 may not be electrically connected to a circuit element layer, but the disclosure is not limited thereto. For example, the third alignment electrode RME3 may also be electrically connected to the circuit element layer through a contact hole penetrating the external bank BNL. FIG. 4 illustrates that the third alignment electrode RME3 is not electrically connected to a circuit element layer.

The light emitting elements ED may be disposed on the alignment electrode RME.

Referring to FIG. 5, the light emitting element ED may be a light emitting diode. The light emitting element ED may be an inorganic light emitting diode that has a nanometer or micrometer size, and is made of an inorganic material. The light emitting element ED may be aligned between two electrodes having polarity in case that an electric field is formed in a specific direction between the two electrodes facing each other.

The light emitting element ED according to an embodiment may have a shape elongated in a direction. The light emitting element ED may have a shape of a cylinder, a rod, a wire, a tube, or the like. However, the shape of the light emitting element ED is not limited thereto, and the light emitting element ED may have a polygonal prism shape such as a regular cube, a rectangular parallelepiped and a hexagonal prism, or may have various shapes such as a shape elongated in a direction and having an outer surface partially inclined.

The light emitting element ED may include a semiconductor layer doped with any conductivity type (e.g., p-type or n-type) dopant. The semiconductor layer may emit light of a specific wavelength band by receiving an electrical signal applied from an external power source. The light emitting element ED may include a first semiconductor layer 31, a second semiconductor layer 32, a light emitting layer 36, an electrode layer 37 and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may be at least one of AlGaInN, GaN, AlGaN, InGaN, AlN and InN doped with an n-type dopant. The n-type dopant doped into the first semiconductor layer 31 may be Si, Ge, Sn, Se, or the like.

The second semiconductor layer 32 is disposed on the first semiconductor layer 31 with the light emitting layer 36 therebetween. The second semiconductor layer 32 may be a p-type semiconductor, and the second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may be at least one of AlGaInN, GaN, AlGaN, InGaN, AlN and InN doped with a p-type dopant. The p-type dopant doped into the second semiconductor layer 32 may be Mg, Zn, Ca, Ba, or the like.

Although FIG. 5 illustrates that the first semiconductor layer 31 and the second semiconductor layer 32 are configured as a layer, the disclosure is not limited thereto. Depending on the material of the light emitting layer 36, the first semiconductor layer 31 and the second semiconductor layer 32 may further include a larger number of layers, such as a cladding layer or a tensile strain barrier reducing (TSBR) layer. For example, the light emitting element ED may further include another semiconductor layer disposed between the first semiconductor layer 31 and the light emitting layer 36 or between the second semiconductor layer 32 and the light emitting layer 36. The semiconductor layer disposed between the first semiconductor layer 31 and the light emitting layer 36 may be at least one of AlGaInN, GaN, AlGaN, InGaN, AlN, InN and SLs doped with an n-type dopant, and the semiconductor layer disposed between the second semiconductor layer 32 and the light emitting layer 36 may be at least one of AlGaInN, GaN, AlGaN, InGaN, AlN and InN doped with a p-type dopant.

The light emitting layer 36 is disposed between the first semiconductor layer 31 and the second semiconductor layer 32. The light emitting layer 36 may include a material having a single or multiple quantum well structure. In case that the light emitting layer 36 includes a material having a multiple quantum well structure, quantum layers and well layers may be stacked alternately each other. The light emitting layer 36 may emit light by combination of electron-hole pairs according to an electrical signal applied through the first semiconductor layer 31 and the second semiconductor layer 32. The light emitting layer 36 may include a material such as AlGaN, AlGaInN, or InGaN. In case that the light emitting layer 36 has a multiple quantum well structure in which quantum layers and well layers are alternately stacked each other, the quantum layer may include a material such as AlGaN or AlGaInN, and the well layer may include a material such as GaN or AlInN.

The light emitting layer 36 may have a structure in which semiconductor materials having a large band gap energy and semiconductor materials having a small band gap energy are alternately stacked each other, and may include other group III to V semiconductor materials according to the wavelength band of the emitted light. The light emitted by the light emitting layer 36 is not limited to the light of the blue wavelength band, but the light emitting layer 36 may also emit light of a red or green wavelength band in some embodiments.

The electrode layer 37 may be an ohmic connection electrode. However, the disclosure is not limited thereto, and it may be a Schottky connection electrode. The light emitting element ED may include at least one electrode layer 37. The light emitting element ED may include one or more electrode layers 37, but the disclosure is not limited thereto, and the electrode layer 37 may be omitted.

In the display device 1, in case that the light emitting element ED is electrically connected to an electrode or a connection electrode, the electrode layer 37 may reduce the resistance between the light emitting element ED and the electrode or connection electrode. The electrode layer 37 may include a conductive metal. For example, the electrode layer 37 may include at least one of aluminum (Al), titanium (Ti), indium (In), gold (Au), silver (Ag), ITO, IZO, or ITZO. With the above-described configuration, ends of each of the light emitting elements ED may have different polarities. A description thereof will be given below.

The insulating film 38 is arranged to surround the outer surfaces of the semiconductor layers and electrode layers described above. For example, the insulating film 38 may be disposed to surround at least the outer surface of the light emitting layer 36, and may be formed to expose ends of the light emitting element ED in a longitudinal direction. Further, in a cross-sectional view, the insulating film 38 may have a top surface, which is rounded in a region thereof adjacent to at least one end of the light emitting element ED.

The insulating film 38 may include at least one of materials having insulating properties, for example, silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$). FIG. 5 illustrates that the insulating film 38 is formed as a single layer, but the disclosure is not limited thereto. In some embodiments, the insulating film 38 may be formed in a multilayer structure having layers stacked each other therein.

The insulating film 38 may perform a function of protecting the semiconductor layers and the electrode layer of the light emitting element ED. The insulating film 38 may prevent an electrical short circuit that is likely to occur at the light emitting layer 36 in case that an electrode to which an electrical signal is transmitted directly contacts the light emitting element ED. The insulating film 38 may prevent a decrease in luminous efficiency of the light emitting element ED.

Further, the insulating film 38 may have an outer surface which is surface-treated. The light emitting elements ED may be aligned by spraying the ink, in which the light emitting elements ED are dispersed, on the electrodes. The surface of the insulating film 38 may be treated to have a hydrophobic property or hydrophilic property in order to keep the light emitting elements ED dispersed without being aggregated with other adjacent light emitting elements ED in the ink.

Referring back to FIG. 4, the light emitting element ED may include a first light emitting element ED1, a second light emitting element ED2, a third light emitting element ED3, and a fourth light emitting element ED4. The first light emitting element ED1 and the second light emitting element ED2 may be disposed on the separation space between the first alignment electrode RME1 and the second alignment electrode RME2, and the third light emitting element ED3 and the fourth light emitting element ED4 may be disposed on the separation space between the second alignment electrode RME2 and the third alignment electrode RME3. The first light emitting element ED1, the second light emitting element ED2, the third light emitting element ED3, and the fourth light emitting element ED4 may be distinguished by a connection relationship with the connection electrodes CNE to be described below. A detailed description thereof will be given below.

The connection electrode CNE may be disposed on the light emitting elements ED. The connection electrode CNE may include a first connection electrode CNE1, a second connection electrode CNE2, a third connection electrode CNE3, a fourth connection electrode CNE4, and a fifth connection electrode CNE5.

A portion of the first connection electrode CNE1 may be connected to the first alignment electrode RME1 through a first contact portion CT1 that does not overlap the emission area EMA, and another portion of the first connection electrode CNE1 may be connected to an end of the first light emitting element ED1.

A portion of the second connection electrode CNE2 may be connected to another end of the first light emitting element ED1, and another portion of the second connection electrode CNE2 may be connected to an end of the second light emitting element ED2.

A portion of the third connection electrode CNE3 may be connected to another end of the second light emitting element ED2, and another portion of the third connection electrode CNE3 may be connected to an end of the third light emitting element ED3.

A portion of the fourth connection electrode CNE4 may be connected to another end of the third light emitting element ED3, and another portion of the fourth connection electrode CNE4 may be connected to an end of the fourth light emitting element ED4.

A portion of the fifth connection electrode CNE5 may be connected to another end of the fourth light emitting element ED4, and another portion of the fifth connection electrode CNE5 may be connected to the second alignment electrode RME2 through a second contact portion CT2 that does not overlap the emission area EMA.

Each of the first connection electrode CNE1, the second connection electrode CNE2, the third connection electrode CNE3, the fourth connection electrode CNE4, and the fifth connection electrode CNE5 may have a shape extending substantially in the fourth direction DR4. A detailed description of the shapes of the connection electrodes CNE will be provided below.

Hereinafter, disposition relationships among the alignment electrodes RME, the connection electrodes CNE, and the light emitting elements ED disposed in a sub-pixel SPXn will be described in detail.

Figure 6:
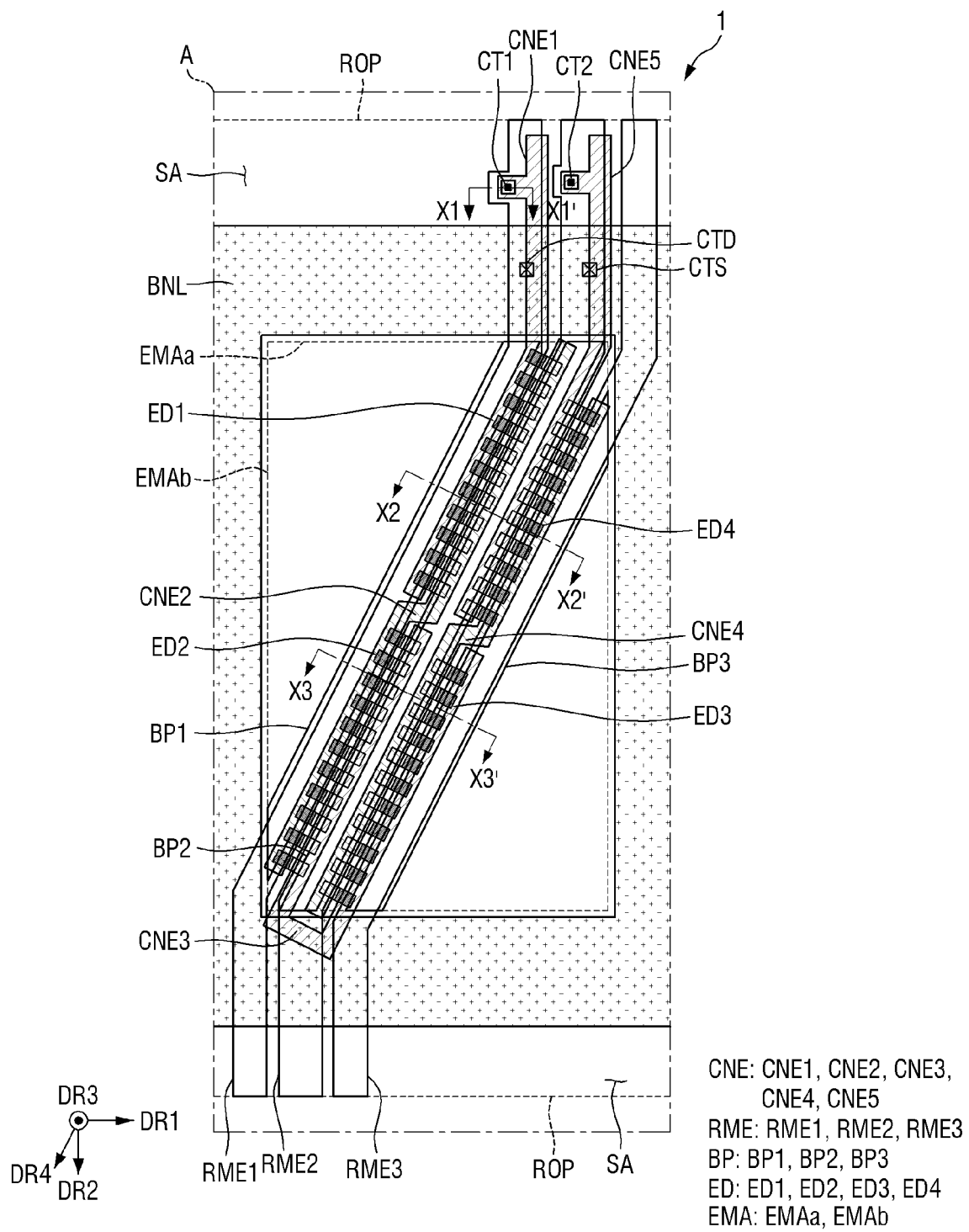
FIG. 6 is a schematic enlarged view of area A of FIG. 4.
Figure 7:
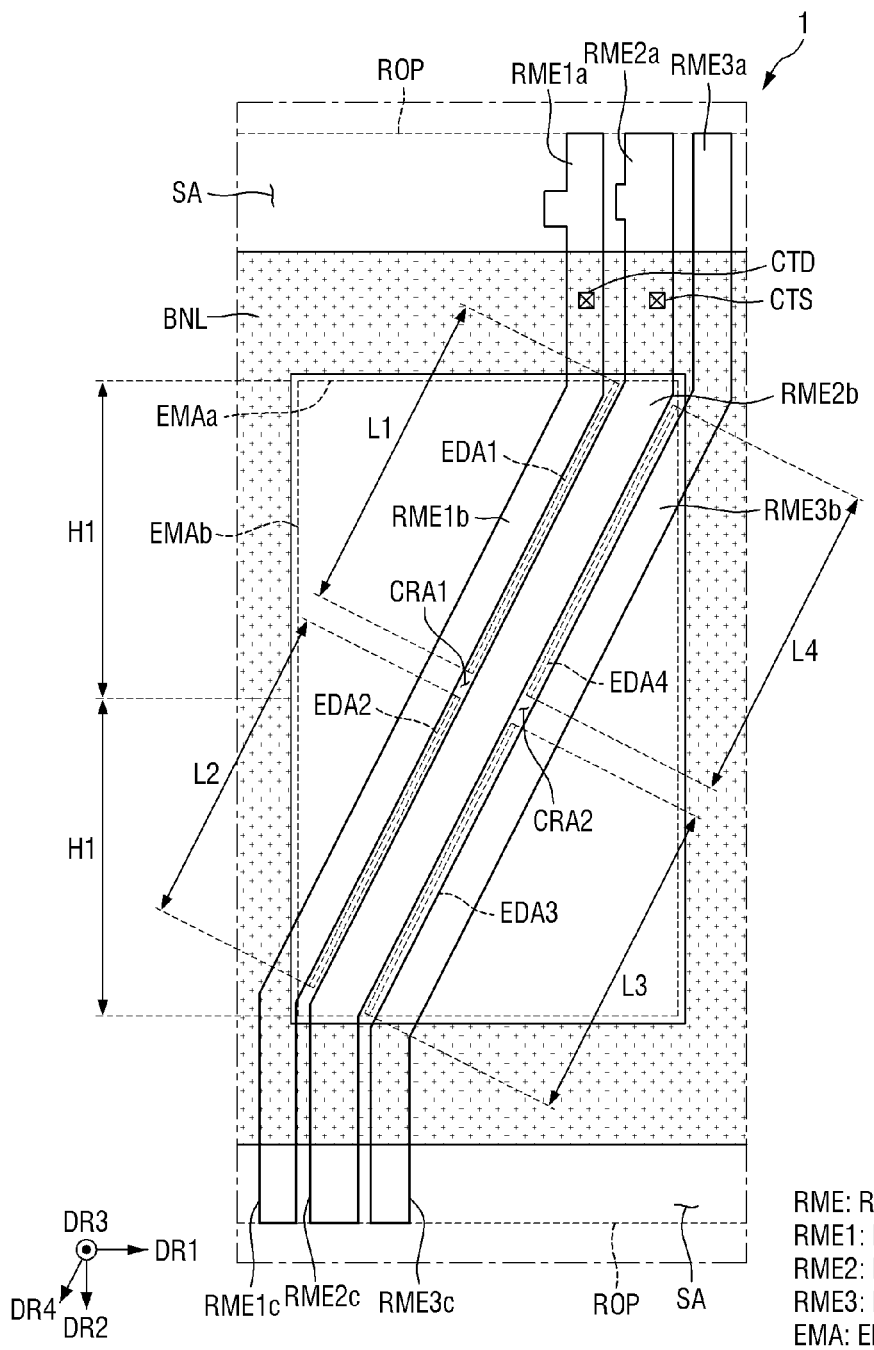
FIG. 7 is a schematic plan view illustrating the disposition of the alignment electrode of FIG. 6.
Figure 8:
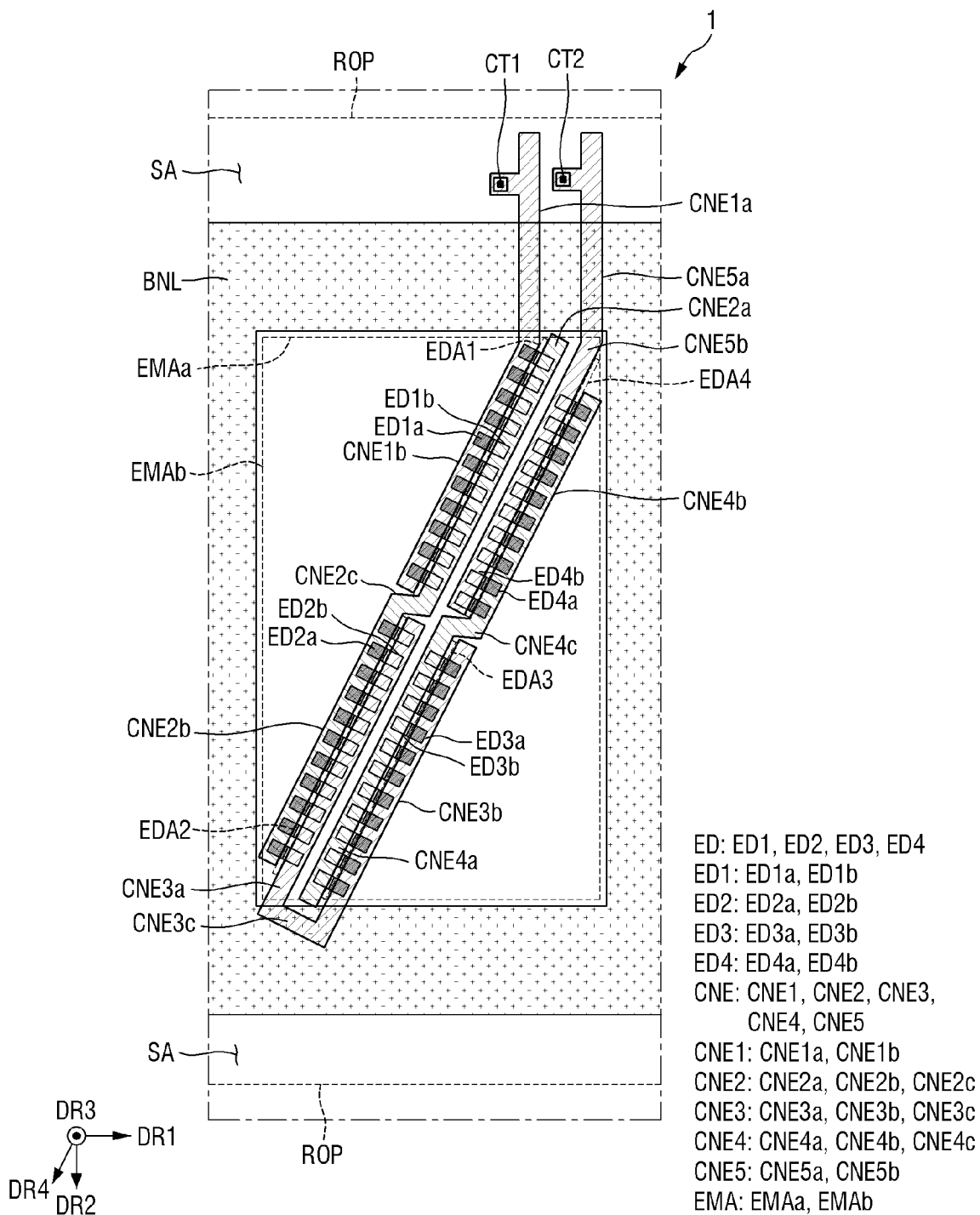
FIG. 8 is a schematic plan view illustrating the disposition of the connection electrode and the light emitting element of FIG. 6.

FIG. 6 is a schematic enlarged view of area A of FIG. 4. FIG. 7 is a schematic plan view illustrating the disposition of the alignment electrode of FIG. 6. FIG. 8 is a schematic plan view illustrating the disposition of the connection electrode and the light emitting element of FIG. 6.

FIG. 7 illustrates the disposition of the alignment electrodes RME with respect to the external bank BNL illustrated in a sub-pixel SPXn of FIG. 6, and FIG. 8 illustrates the disposition of the light emitting elements ED and the connection electrode CNE with respect to the external bank BNL illustrated in a sub-pixel SPXn of FIG. 6.

Referring to FIGS. 6 to 7, the display device 1 according to an embodiment may include the external bank BNL distinguishing the emission area EMA and the sub-region SA, an internal bank BP disposed in the emission area EMA, the alignment electrodes RME disposed in the emission area EMA to extend in the fourth direction DR4, the light emitting elements ED disposed between the respective alignment electrodes RME and arranged in the fourth direction DR4, and the connection electrodes CNE electrically connecting the light emitting elements ED.

The external bank BNL may define the emission area EMA having a rectangular shape including a short side EMAa extending in the first direction DR1 and a long side EMAb extending in the second direction DR2 in plan view. In other words, the external bank BNL may be a barrier wall surrounding the emission area EMA, and may surround the emission area EMA in a rectangular shape in plan view. Accordingly, in case that the light emitting element ED is ejected to the emission area EMA by an inkjet method in a manufacturing process of the display device 1, it is possible to prevent the light emitting element ED from being ejected beyond the emission area EMA.

The length of the short side EMAa and the length of the long side EMAb of the emission area EMA may have a standard determined according to the resolution of the display device 1. The resolution of the display device 1 and the size of the emission area EMA may have a substantially inversely proportional relationship. As the resolution of the display device 1 increases, the number of pixels PX per unit area should increase, and accordingly, the size of the emission area EMA should be reduced. For example, as the resolution of the display device 1 increases, the length of the short side EMAa and the length of the long side EMAb of the emission area EMA may decrease. In some embodiments, the length of the short side EMAa of the emission area EMA may be about 42 μm, and the length of the long side EMAb may be about 81 μm, but are not limited thereto.

However, in case that the size of the emission area EMA is reduced as the resolution of the display device 1 increases, the number of light emitting elements ED disposed in the emission area EMA is reduced, such that the luminance of each pixel PX may be reduced. Accordingly, in order to increase the luminance of each pixel PX while increasing the resolution of the display device 1, it is necessary to increase the number of light emitting elements ED disposed in the emission area EMA having a limited area. Accordingly, by arranging the light emitting elements ED in the fourth direction DR4, the number of light emitting elements ED disposed in the emission area EMA having a limited area may be increased. A detailed description thereof will be given below.

The internal banks BP may be disposed in the emission area EMA and may have a shape extending in the fourth direction DR4. The internal bank BP may include a first internal bank BP1, a second internal bank BP2, and a third internal bank BP3.

With respect to the emission area EMA, the first internal bank BP1 may be biased toward the other side in the first direction DR1, the third internal bank BP3 may be biased toward one side in the first direction DR1, and the second internal bank BP2 may be disposed between the first internal bank BP1 and the second internal bank BP2.

The first internal bank BP1, the second internal bank BP2, and the third internal bank BP3 may be spaced apart from each other in the first direction DR1. The light emitting elements ED may be arranged in separation spaces among the first internal bank BP1, the second internal bank BP2, and the third internal bank BP3. For example, the first light emitting elements ED1 and the second light emitting elements ED2 may be arranged in the separation space between the first internal bank BP1 and the second internal bank BP2, and the third light emitting elements ED3 and the fourth light emitting elements ED4 may be arranged in the separation space between the second internal bank BP2 and the third internal bank BP3.

The first internal bank BP1, the second internal bank BP2, and the third internal bank BP3 may extend in the fourth direction DR4, such that separation spaces among the first internal bank BP1, the second internal bank BP2 and the third internal bank BP3 may also extend in the fourth direction DR4. Accordingly, the light emitting elements ED may also be arranged in the fourth direction DR4.

The alignment electrodes RME may be disposed on the internal bank BP. The first alignment electrode RME1 may be disposed on the first internal bank BP1, the second alignment electrode RME2 may be disposed on the second internal bank BP2, and the third alignment electrode RME3 may be disposed on the third internal bank BP3.

The first alignment electrode RME1 may include a first portion RME1a extending in the second direction DR2, a second portion RME1b extending in the fourth direction DR4, and a third portion RME1c extending in the second direction DR2.

The first portion RME1a of the first alignment electrode RME1 may cross (or intersect) the external bank BNL and the sub-region SA disposed on the upper side of the emission area EMA, for example, on the other side in the second direction DR2. The first portion RME1a may extend to the separation portion ROP. The first portion RME1a may be electrically connected to a circuit element layer to be described below through the first electrode contact hole CTD penetrating the external bank BNL.

In some embodiments, the first portion RME1a may include a portion protruding to the other side in the first direction DR1. The portion of the first portion RME1a that protrudes to the other side in the first direction DR1 may be a portion electrically contacting the first connection electrode CNE1.

The second portion RME1b of the first alignment electrode RME1 may be a portion disposed in the emission area EMA and may cross the emission area EMA in the fourth direction DR4. The second portion RME1b may extend from a side of the first portion RME1a in the second direction DR2 to another side of the third portion RME1c in the second direction DR2.

The third portion RME1c of the first alignment electrode RME1 may cross the external bank BNL and the sub-region SA disposed on the lower side of the emission area EMA, for example, on one side in the second direction DR2. The third portion RME1c may extend to the separation portion ROP.

A first portion RME2a of the second alignment electrode RME2 may cross the external bank BNL and the sub-region SA disposed on the upper side of the emission area EMA, for example, on the other side in the second direction DR2. The first portion RME2a may extend to the separation portion ROP. The first portion RME2a may be electrically connected to a circuit element layer to be described below through the second electrode contact hole CTS penetrating the external bank BNL.

In some embodiments, the first portion RME2a may include a portion protruding to the other side in the first direction DR1. The portion of the first portion RME2a that protrudes to the other side in the first direction DR1 may be a portion electrically contacting the fifth connection electrode CNE5.

A second portion RME2b of the second alignment electrode RME2 may be a portion disposed in the emission area EMA and may cross the emission area EMA in the fourth direction DR4. The second portion RME2b may extend from a side of the first portion RME2a in the second direction DR2 to another side of a third portion RME2c in the second direction DR2.

The third portion RME2c of the second alignment electrode RME2 may cross the external bank BNL and the sub-region SA disposed on the lower side of the emission area EMA, for example, on a side in the second direction DR2. The third portion RME2c may extend to the separation portion ROP.

A first portion RME3a of the third alignment electrode RME3 may cross the external bank BNL and the sub-region SA disposed on the upper side of the emission area EMA, for example, on the other side in the second direction DR2. The first portion RME3a may extend to the separation portion ROP.

A second portion RME3b of the third alignment electrode RME3 may be a portion disposed in the emission area EMA and may cross the emission area EMA in the fourth direction DR4. The second portion RME3b may extend from a side of the first portion RME3a in the second direction DR2 to another side of a third portion RME3c in the second direction DR2.

The third portion RME3c of the third alignment electrode RME3 may cross the external bank BNL and the sub-region SA disposed on the lower side of the emission area EMA, for example, on a side in the second direction DR2. The third portion RME3c may extend to the separation portion ROP.

As illustrated in FIG. 7, the first alignment electrode RME1, the second alignment electrode RME2, and the third alignment electrode RME3 may be spaced apart from each other in the first direction DR1, and separation spaces among the first alignment electrode RME1, the second alignment electrode RME2, and the third alignment electrode RME3 in the emission area EMA may define the passages EDA1, EDA2, EDA3, and EDA4 in which the light emitting elements ED are arranged.

The separation space between the second portion RME1b of the first alignment electrode RME1 and the second portion RME2b of the second alignment electrode RME2 may include a first passage EDA1 in which the first light emitting elements ED1 are arranged and a second passage EDA2 in which the second light emitting elements ED2 are arranged. The first passage EDA1 may be disposed on a side of the second passage EDA2 in the second direction DR2. The separation space between the second portion RME1b of the first alignment electrode RME1 and the second portion RME2b of the second alignment electrode RME2 may cross the emission area EMA in the fourth direction DR4, and the first passage EDA1 and the second passage EDA2 may also cross the emission area EMA in the fourth direction DR4. The first passage EDA1 and the second passage EDA2 may be spaced apart from each other with a first separation space CRA1 therebetween. The first separation space CRA1 may be a space in which a connection portion CNE2c of the second connection electrode CNE2 to be described below is disposed.

The separation space between the second portion RME2b of the second alignment electrode RME2 and the second portion RME3b of the third alignment electrode RME3 may include a third passage EDA3 in which the third light emitting elements ED3 are arranged and a fourth passage EDA4 in which the fourth light emitting elements ED4 are arranged. The fourth passage EDA4 may be disposed on a side of the third passage EDA3 in the second direction DR2. The separation space between the second portion RME2b of the second alignment electrode RME2 and the second portion RME3b of the third alignment electrode RME3 may cross the emission area EMA in the fourth direction DR4, and the third passage EDA3 and the fourth passage EDA4 may also cross the emission area EMA in the fourth direction DR4. The third passage EDA3 and the fourth passage EDA4 may be spaced apart from each other with a second separation space CRA2 therebetween. The second separation space CRA2 may be a space in which a connection portion CNE4c of the fourth connection electrode CNE4 to be described below is disposed.

In each of the light emitting elements ED illustrated in FIGS. 6 to 8, for example, the first light emitting element ED1, the second light emitting element ED2, the third light emitting element ED3, and the fourth light emitting element ED4, portions having different polarities are divided. Hereinafter, for simplicity of description, a hatched portion of the light emitting element ED will be referred to as "an end" and an unhatched portion will be referred to as "another end."

For example, an end of the light emitting element ED may be a portion adjacent to the second semiconductor layer 32 with respect to the light emitting element ED illustrated in FIG. 5, and another end of the light emitting element ED may be a portion adjacent to the first semiconductor layer 31. Accordingly, an end and another end of a light emitting element ED may have different polarities, but an end of each of the different light emitting elements ED may have a same polarity and another end thereof may have a same polarity. An end ED1a of the first light emitting element ED1, an end ED2a of the second light emitting element ED2, an end ED3a of the third light emitting element ED3, and an end ED4a of the fourth light emitting element ED4 may have a same polarity, and another end ED1b of the first light emitting element ED1, another end ED2b of the second light emitting element ED2, another end ED3b of the third light emitting element ED3, and another end ED4b of the fourth light emitting element ED4 may have a same polarity.

In the manufacturing process of the display device 1 according to an embodiment, the disposition of the light emitting element ED may be performed through a process of ejecting ink, in which the light emitting element ED is dispersed, onto the alignment electrode RME, and aligning the light emitting element ED by applying different voltages to the alignment electrode RME. For example, in case that an electrical signal is applied to each of the first alignment electrode RME1, the second alignment electrode RME2, and the third alignment electrode RME3, an electric field may be generated in the ink in which the light emitting element ED is dispersed, and the light emitting element ED may receive a dielectrophoresis (DEP) force by the electric field and be seated in the separation space among the first alignment electrode RME1, the second alignment electrode RME2, and the third alignment electrode RME3 while the orientation direction and the position are changed.

In case that a same electrical signal is applied to the first alignment electrode RME1 and the third alignment electrode RME3, and an electrical signal different from the electrical signal applied to the first alignment electrode RME1 and the third alignment electrode RME3 is applied to the second alignment electrode RME2, an end of each of the light emitting elements ED may be arranged on the first alignment electrode RME1 or the third alignment electrode RME3, and another end of each of the light emitting elements ED may be arranged on the second alignment electrode RME2. Accordingly, an end ED1a of the first light emitting element ED1 may be disposed on the first alignment electrode RME1, another end ED1b of the first light emitting element ED1 may be disposed on the second alignment electrode RME2, an end ED2a of the second light emitting element ED2 may be disposed on the first alignment electrode RME1, another end ED2b of the second light emitting element ED2 may be disposed on the second alignment electrode RME2, an end ED3a of the third light emitting element ED3 may be disposed on the third alignment electrode RME3, another end ED3b of the third light emitting element ED3 may be disposed on the second alignment electrode RME2, an end ED4a of the fourth light emitting element ED4 may be disposed on the third alignment electrode RME3, and another end ED4b of the fourth light emitting element ED4 may be disposed on the second alignment electrode RME2.

The first passage EDA1 and the second passage EDA2 may be a portion of the separation space between the first alignment electrode RME1 and the second alignment electrode RME2, and may have a relative position that shares a straight line parallel to the fourth direction DR4. Accordingly, the first light emitting element ED1 and the second light emitting element ED2 may also have a relative position that shares a straight line parallel to the fourth direction DR4. The end ED1a of the first light emitting element ED1 and the end ED2a of the second light emitting element ED2 may have a relative position that shares a straight line parallel to the fourth direction DR4, and the another end ED1b of the first light emitting element ED1 and the another end ED2b of the second light emitting element ED2 may have a relative position that shares a straight line parallel to the fourth direction DR4. However, the end ED1a of the first light emitting element ED1 and the another end ED2b of the second light emitting element ED2 may be disposed at a relative position that does not share a straight line parallel to the fourth direction DR4 and may not overlap each other in the fourth direction DR4, and the another ED1b of the first light emitting element ED1 and the end ED2a of the second light emitting element ED2 may be disposed at a relative position that does not share a straight line parallel to the fourth direction DR4 and may not overlap each other in the fourth direction DR4.

Similarly, the third passage EDA3 and the fourth passage EDA4 may be a portion of the separation space between the second alignment electrode RME2 and the third alignment electrode RME3, and may have a relative position that shares a straight line parallel to the fourth direction DR4. Accordingly, the third light emitting element ED3 and the fourth light emitting element ED4 may also have a relative position that shares a straight line parallel to the fourth direction DR4. The end ED3a of the third light emitting element ED3 and the end ED4a of the fourth light emitting element ED4 may have a relative position that shares a straight line parallel to the fourth direction DR4, and the another end ED3b of the third light emitting element ED3 and the another end ED4b of the fourth light emitting element ED4 may have a relative position that shares a straight line parallel to the fourth direction DR4. However, the end ED3a of the third light emitting element ED3 and the another end ED4b of the fourth light emitting element ED4 may be disposed at a relative position that does not share a straight line parallel to the fourth direction DR4 and may not overlap each other in the fourth direction DR4, and the another end ED3b of the third light emitting element ED3 and the end ED4a of the fourth light emitting element ED4 may be disposed at a relative position that does not share a straight line parallel to the fourth direction DR4 and may not overlap each other in the fourth direction DR4.

An end and another end of the different light emitting elements ED may be electrically connected by the connection electrode CNE.

The connection electrode CNE may be disposed on the light emitting element ED. The connection electrode CNE may include the first connection electrode CNE1, the second connection electrode CNE2, the third connection electrode CNE3, the fourth connection electrode CNE4, and the fifth connection electrode CNE5 that are disposed to be spaced apart from each other as described above.

The first connection electrode CNE1 may include a first portion CNE1a extending substantially in the second direction DR2 and a second portion CNE1b extending in the fourth direction DR4 in the emission area EMA.

The first portion CNE1a of the first connection electrode CNE1 may include a portion protruding toward the other side in the first direction DR1. The portion of the first portion CNE1a protruding toward the other side in the first direction DR1 may overlap a portion of the above-described first alignment electrode RME1 protruding toward the other side in the first direction DR1, in the third direction DR3, and these portions may be electrically connected to each other through the first contact portion CT1. Accordingly, the first power voltage may be supplied to the first connection electrode CNE1.

The second portion CNE1b of the first connection electrode CNE1 may contact an end ED1a of each of the first light emitting elements ED1. Since the first power voltage is supplied to the first connection electrode CNE1 through the first contact portion CT1, the first power voltage may be supplied to the end ED1a of each of the first light emitting elements ED1.

The second portion CNE1b may extend in the fourth direction DR4, and may extend to a portion in which the first passage EDA1 is disposed. In other words, the second portion CNE1b may overlap the first passage EDA1 in the first direction DR1 and may not overlap the second passage EDA2 in the first direction DR1. In other words, the second portion CNE1b may extend to only a vicinity of the center of the emission area EMA, for example, a vicinity in which the first light emitting elements ED1 are arranged.

The second connection electrode CNE2 may extend substantially in the fourth direction DR4, and may serve to electrically connect another end ED1b of the first light emitting element ED1 with an end ED2a of the second light emitting element ED2. The second connection electrode CNE2 may include a first portion CNE2a extending in the fourth direction DR4, a second portion CNE2b extending in the fourth direction DR4, and the connection portion CNE2c connecting the first portion CNE2a with the second portion CNE2b.

The first portion CNE2a of the second connection electrode CNE2 may contact the another end ED1b of each of the first light emitting elements ED1. The first portion CNE2a may extend in the fourth direction DR4 to a vicinity in which the second portion CNE1b of the first connection electrode CNE1 extends, for example, to a vicinity in which the first light emitting elements ED1 are arranged.

The second portion CNE2b of the second connection electrode CNE2 may contact an end ED2a of each of the second light emitting elements ED2. The second portion CNE2b may extend in the fourth direction DR4 to a vicinity in which the second light emitting elements ED2 are arranged in the emission area EMA.

The connection portion CNE2c of the second connection electrode CNE2 may serve to connect the first portion CNE2a with the second portion CNE2b. As described above, since the first portion CNE2a and the second portion CNE2b are disposed on the another end ED1b of the first light emitting element ED1 and the end ED2a of the second light emitting element ED2, respectively, the relative positions thereof may be different. Accordingly, the first portion CNE2a and the second portion CNE2b may be connected through the connection portion CNE2c crossing the first separation space CRA1 between the first passage EDA1 and the second passage EDA2 in a direction intersecting the fourth direction DR4.

The third connection electrode CNE3 may serve to electrically connect the another end ED2b of the second light emitting element ED2 with the end ED3a of the third light emitting element ED3. The third connection electrode CNE3 may include a first portion CNE3a extending in the fourth direction DR4, a second portion CNE3b extending in the fourth direction DR4, and a connection portion CNE3c connecting the first portion CNE3a with the second portion CNE3b.

The first portion CNE3a of the third connection electrode CNE3 may contact the another end ED2b of each of the second light emitting elements ED2. The first portion CNE3a may extend in the fourth direction DR4 to a vicinity in which the second light emitting elements ED2 are arranged in the emission area EMA. In other words, the first portion CNE3a of the third connection electrode CNE3 may extend to a vicinity in which the connection portion CNE2c of the second connection electrode CNE2 is disposed.

The second portion CNE3b of the third connection electrode CNE3 may contact an end ED3a of each of the third light emitting elements ED3. The second portion CNE3b may extend in the fourth direction DR4 to a vicinity in which the third light emitting element ED3 is arranged in the emission area EMA.

The connection portion CNE3c of the third connection electrode CNE3 may serve to connect the first portion CNE3a with the second portion CNE3b. The third connection electrode CNE3 may extend in a direction intersecting the fourth direction DR4 to connect the first portion CNE3a with the second portion CNE3b. In some embodiments, the connection portion CNE3c may overlap the external bank BNL positioned at one side in the second direction DR2 in the emission area EMA, in the third direction DR3, but the disclosure is not limited thereto.

The fourth connection electrode CNE4 may extend substantially in the fourth direction DR4, and may serve to electrically connect the another end ED3b of the third light emitting element ED3 with the end ED4a of the fourth light emitting element ED4. The fourth connection electrode CNE4 may include a first portion CNE4a extending in the fourth direction DR4, a second portion CNE4b extending in the fourth direction DR4, and the connection portion CNE4c connecting the first portion CNE4a with the second portion CNE4b.

The first portion CNE4a of the fourth connection electrode CNE4 may contact the another end ED3b of each of the third light emitting elements ED3. The first portion CNE4a may extend in the fourth direction DR4 to a vicinity in which the third light emitting element ED3 is arranged.

The second portion CNE4b of the fourth connection electrode CNE4 may contact the end ED4a of each of the fourth light emitting elements ED4. The second portion CNE4b may extend in the fourth direction DR4 to a vicinity in which the fourth light emitting element ED4 is arranged in the emission area EMA.

The connection portion CNE4c of the fourth connection electrode CNE4 may serve to connect the first portion CNE4a with the second portion CNE4b. As described above, since the first portion CNE4a and the second portion CNE4b are disposed on the another end ED3b of the third light emitting element ED3 and the Rend ED4a of the fourth light emitting element ED4, respectively, the relative positions thereof may be different. Accordingly, the first portion CNE4a and the second portion CNE4b may be connected through the connection portion CNE4c crossing the second separation space CRA2 between the third passage EDA3 and the fourth passage EDA4 in a direction intersecting the fourth direction DR4.

The fifth connection electrode CNE5 may include a first portion CNE5a extending substantially in the second direction DR2 and a second portion CNE5b extending in the fourth direction DR4 in the emission area EMA.

The first portion CNE5a of the fifth connection electrode CNE5 may include a portion protruding toward the other side in the first direction DR1. The portion of the first portion CNE5a protruding toward the other side in the first direction DR1 may overlap a portion of the above-described second alignment electrode RME2 protruding toward the other side in the first direction DR1, in the third direction DR3, and may be electrically connected to each other through the second contact portion CT2. Accordingly, the second power voltage may be supplied to the fifth connection electrode CNE5.

The second portion CNE5b of the fifth connection electrode CNE5 may contact the another end ED4b of each of the fourth light emitting elements ED4. Since the second power voltage is supplied to the fifth connection electrode CNE5 through the second contact portion CT2, the second power voltage may be supplied to the another end ED4b of each of the fourth light emitting elements ED4.

By the above-described configuration, the first light emitting element ED1, the second light emitting element ED2, the third light emitting element ED3, and the fourth light emitting element ED4 may be electrically connected in series, such that the luminance of the pixel PX may increase.

The length of each of the first passage EDA1, the second passage EDA2, the third passage EDA3, and the fourth passage EDA4 in the fourth direction DR4 may be substantially equal to or greater than a half of the length of a long side EMAb of the emission area EMA in the second direction DR2. The length of the long side EMAb of the emission area EMA in the second direction DR2 may be substantially equal to twice a first width H1 in the second direction DR2, and a length L1 of the first passage EDA1 in the fourth direction DR4, a length L2 of the second passage EDA2 in the fourth direction DR4, a length L3 of the third passage EDA3 in the fourth direction DR4, and a length L4 of the fourth passage EDA4 in the fourth direction DR4 may be substantially equal to or greater than the length of the first width H1.

In case that the alignment electrodes RME extend in the second direction DR2 in the emission area EMA and the light emitting elements ED are arranged in the second direction DR2, the space through which the connection portion CNE2c of the second connection electrode CNE2 and the connection portion CNE4c of the fourth connection electrode CNE4 pass must be considered, and thus the length of the passage in which the light emitting elements ED are arranged may be smaller than the length of the first width H1. Accordingly, in the emission area EMA, a larger number of light emitting elements ED may be arranged as compared with a case where the alignment electrodes RME extend in the second direction DR2 and the light emitting elements ED are arranged in the second direction DR2.

Each of the length L1 of the first passage EDA1 in the fourth direction DR4, the length L2 of the second passage EDA2 in the fourth direction DR4, the length L3 of the third passage EDA3 in the fourth direction DR4, and the length L4 of the fourth passage EDA4 in the fourth direction DR4 may be substantially equal to or greater than about 44 μm. In general, as the length of the passage increases, the number of light emitting elements ED disposed in the passage increases, such that luminous efficiency may increase. In case that each of the length L1 of the first passage EDA1 in the fourth direction DR4, the length L2 of the second passage EDA2 in the fourth direction DR4, the length L3 of the third passage EDA3 in the fourth direction DR4, and the length L4 of the fourth passage EDA4 in the fourth direction DR4 is substantially equal to or greater than about 44 μm, the number of the light emitting elements ED providing the minimum luminous efficiency required to display the screen of the display device 1 may be secured. In case that each of the length L1 of the first passage EDA1 in the fourth direction DR4, the length L2 of the second passage EDA2 in the fourth direction DR4, the length L3 of the third passage EDA3 in the fourth direction DR4, and the length L4 of the fourth passage EDA4 in the fourth direction DR4 is less than about 44 μm, the highest luminous efficiency required by the display device 1 may not be provided.

Accordingly, in case that the length of the passages EDA1, EDA2, EDA3, and EDA4 in which the light emitting elements ED are arranged is increased as a diagonal, the number of light emitting elements ED providing the minimum luminous efficiency required by the display device may be readily secured.

Hereinafter, a stacked structure of elements constituting the display device 1 according to an embodiment will be described.

Figure 9:
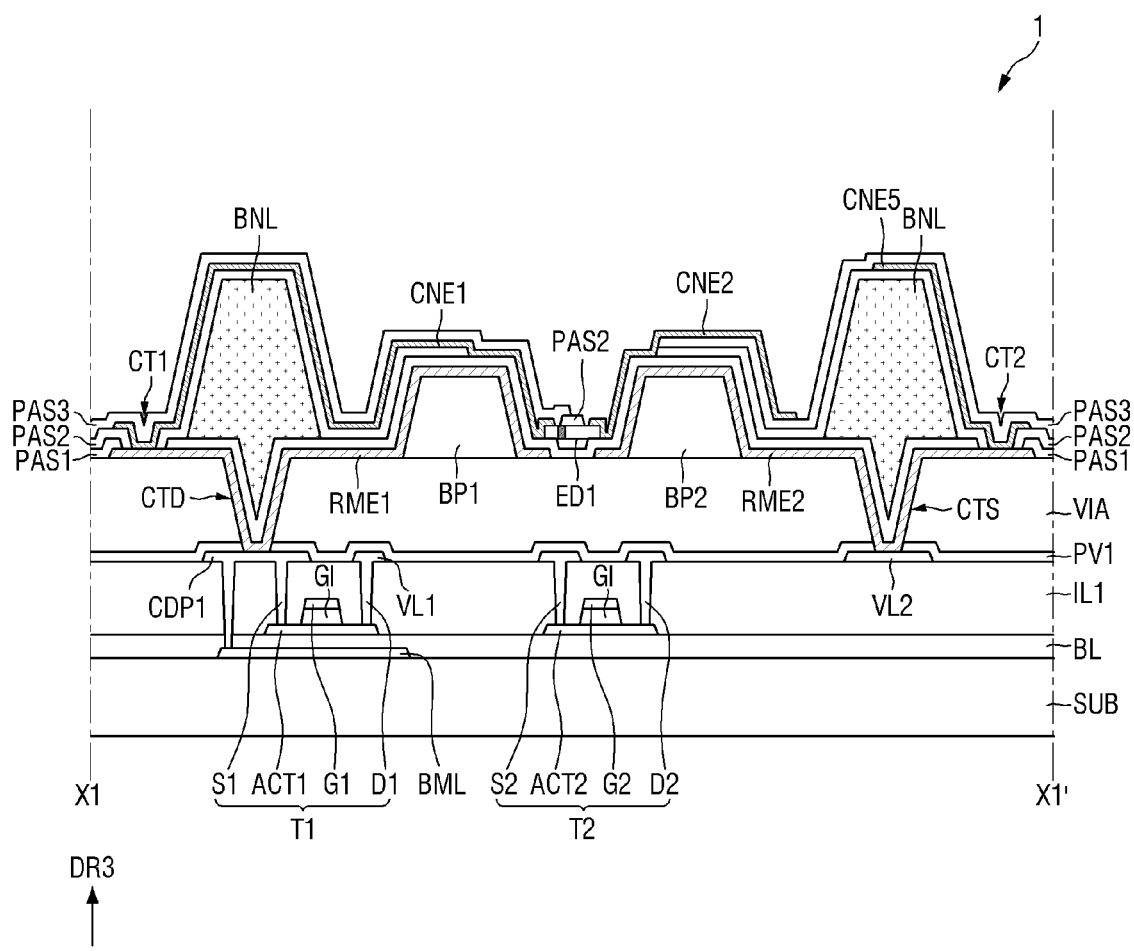
FIG. 9 is a schematic cross-sectional view illustrating a cross section taken along line X1-X1' of FIG. 6.
Figure 10:
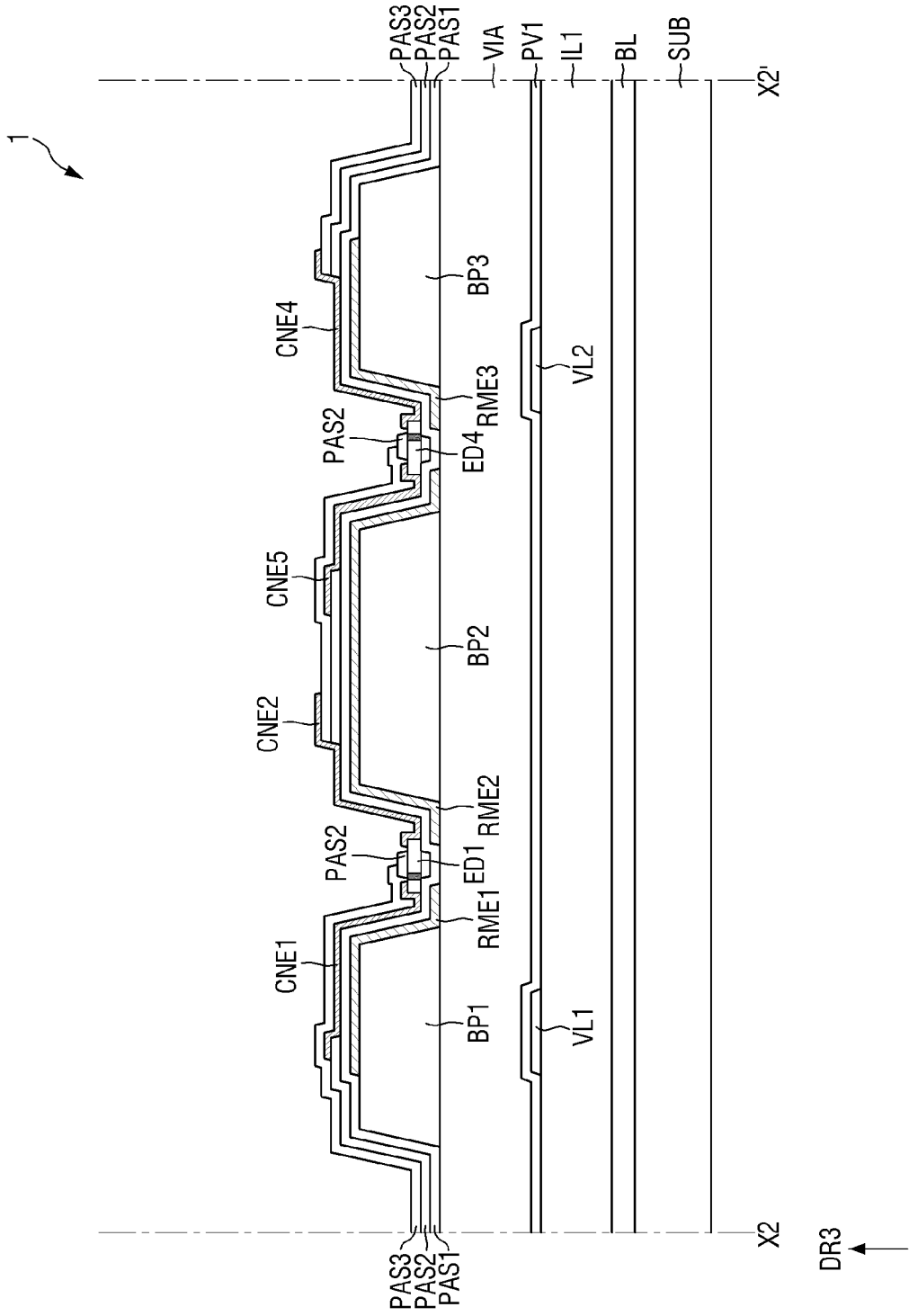
FIG. 10 is a schematic cross-sectional view illustrating a cross section taken along line X2-X2' of FIG. 6.
Figure 11:
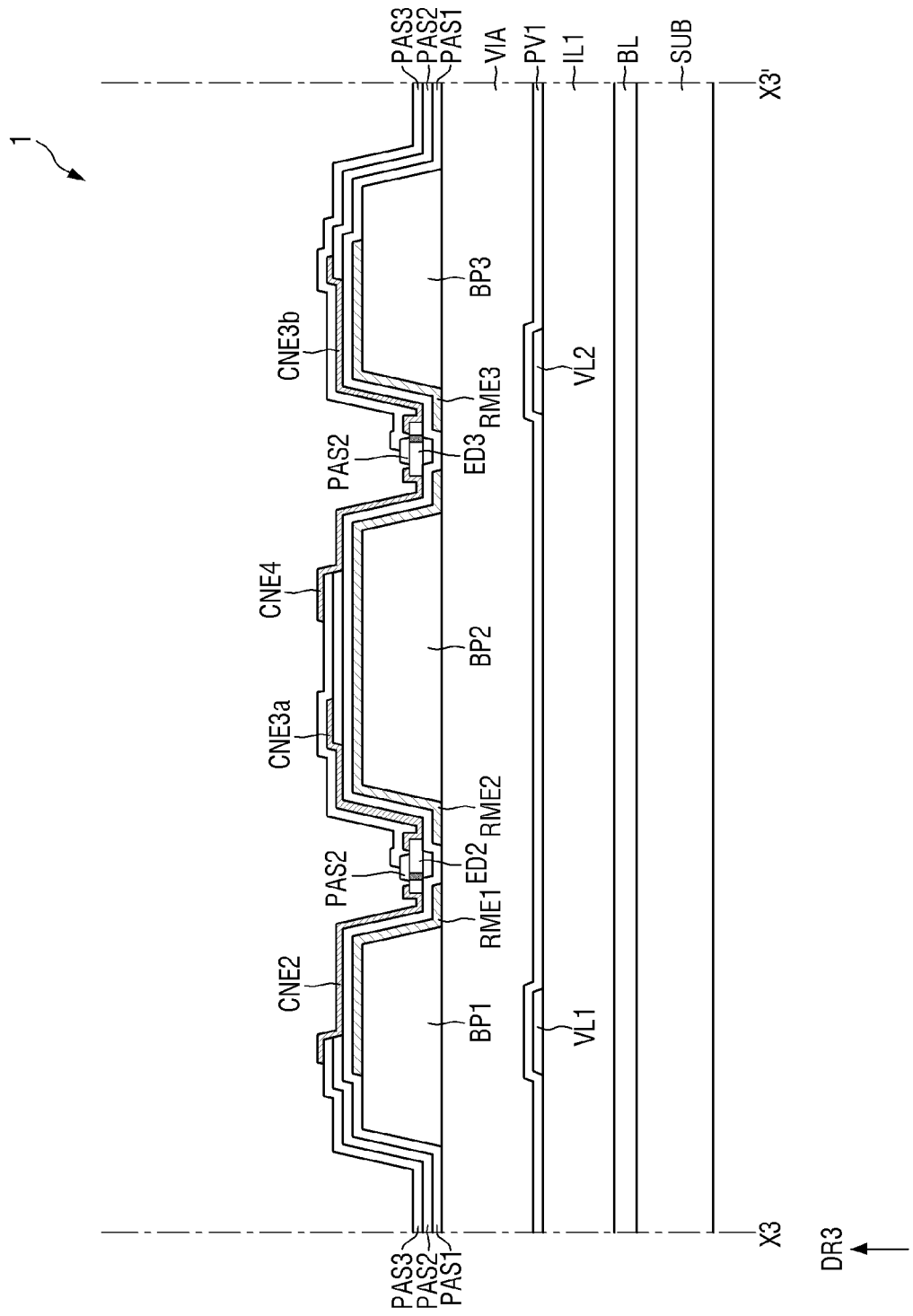
FIG. 11 is a schematic cross-sectional view illustrating a cross section taken along line X3-X3' of FIG. 6.

FIG. 9 is a schematic cross-sectional view illustrating a cross section taken along line X1-X1' of FIG. 6. FIG. 10 is a schematic cross-sectional view illustrating a cross section taken along line X2-X2' of FIG. 6. FIG. 11 is a schematic cross-sectional view illustrating a cross section taken along line X3-X3' of FIG. 6.

FIG. 9 illustrates a cross section crossing the first and second electrode contact holes CTD and CTS and the contact portions CT1 and CT2, FIG. 10 illustrates a cross section crossing ends of each of the first light emitting element ED1 and the fourth light emitting element ED4, and FIG. 11 illustrates a cross section crossing ends of each of the second light emitting element ED2 and the third light emitting element ED3.

A cross-sectional structure of the display device 1 will be described with reference to FIGS. 9 to 11, and the display device 1 may include a substrate SUB, and a semiconductor layer, conductive layers, and insulating layers, disposed on the substrate SUB. As described above, the display device 1 may include electrodes RME, the light emitting element ED, and the connection electrode CNE. Each of the semiconductor layer, the conductive layer, and the insulating layer may constitute (or form) a circuit element layer of the display device 1.

The substrate SUB may be made of (or include) an insulating material such as glass, quartz, or polymer resin. Further, the substrate SUB may be a rigid substrate or a flexible substrate which can be bent, folded or rolled.

The circuit element layer may be disposed on the substrate SUB. In the circuit element layer, various wires that transmit electrical signals to the light emitting element ED disposed on the substrate SUB may be disposed. A circuit layer CCL may include a first conductive layer, a semiconductor layer, a second conductive layer and a third conductive layer as conductive layers as illustrated in FIGS. 9 to 11, and may include a buffer layer BL, a first gate insulating layer GI, a first interlayer insulating layer IL1, a first passivation layer PV1, and the like as insulating layers.

A first conductive layer may be disposed on the substrate SUB. The first conductive layer includes a lower metal layer BML that is disposed to overlap a first active layer ACT1 of a first transistor T1. The lower metal layer BML may prevent light from entering the first active layer ACT1 of the first transistor T1, or may be electrically connected to the first active layer ACT1 to stabilize electrical characteristics of the first transistor T1. However, the lower metal layer BML may be omitted.

The buffer layer BL may be disposed on the lower metal layer BML and the substrate SUB. The buffer layer BL may be formed on the substrate SUB to protect the transistors of the pixel PX from moisture permeating through the substrate SUB susceptible to moisture permeation, and may perform a surface planarization function.

The semiconductor layer is disposed on the buffer layer BL. The semiconductor layer may include the first active layer ACT1 of the first transistor T1 and a second active layer ACT2 of the second transistor T2. The first active layer ACT1 and the second active layer ACT2 may be disposed to partially overlap a first gate electrode G1 and a second gate electrode G2 of a second conductive layer to be described below, respectively.

The semiconductor layer may include polycrystalline silicon, monocrystalline silicon, oxide semiconductor, and the like. In another embodiment, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO).

Although FIG. 9 illustrates that the first transistor T1 and the second transistor T2 are disposed in the pixel PX of the display device 1, the disclosure is not limited thereto, and the display device 1 may include a larger number of transistors.

A first gate insulating layer GI is disposed on the semiconductor layer in the display area DA. The first gate insulating layer GI may serve as a gate insulating layer of each of the first and second transistors T1 and T2. Although FIG. 9 illustrates that the first gate insulating layer GI is patterned together with the first and second gate electrodes G1 and G2 of the second conductive layer to be described below and partially disposed between the second conductive layer and the first and second active layers ACT1 and ACT2 of the semiconductor layer. However, the disclosure is not limited thereto. In some embodiments, the first gate insulating layer GI may be entirely disposed on the buffer layer BL.

The second conductive layer may be disposed on the first gate insulating layer GI. The second conductive layer may include a first gate electrode G1 of the first transistor T1 and a second gate electrode G2 of the second transistor T2. The first gate electrode G1 may be disposed to overlap a channel region of the first active layer ACT1 in a third direction DR3 that is a thickness direction, and the second gate electrode G2 may be disposed to overlap a channel region of the second active layer ACT2 in the third direction DR3 that is the thickness direction.

A first interlayer insulating layer IL1 may be disposed on the second conductive layer. The first interlayer insulating layer IL1 may function as an insulating film between the second conductive layer and other layers disposed thereon, and may protect the second conductive layer.

A third conductive layer may be disposed on the first interlayer insulating layer IL1. The third conductive layer may include the first voltage line VL1 and the second voltage line VL2, a first conductive pattern CDP1, a first source electrode S1 and a first drain electrode D1 of the transistor T1, and a second source electrode S2 and a second drain electrode D2 of the transistor T2 that are disposed in the display area DA.

The first voltage line VL1 may be applied with a high-potential voltage (or a first power voltage) transmitted to the first alignment electrode RME1, and the second voltage line VL2 may be applied with a low-potential voltage (or a second power voltage) transmitted to the second alignment electrode RME2. The first voltage line VL1 may partially contact the first active layer ACT1 of the first transistor T1 through a contact hole that penetrates the first interlayer insulating layer IL1. The first voltage line VL1 may serve as a first drain electrode D1 of the first transistor T1. The first voltage line VL1 may be directly connected to the first alignment electrode RME1, and the second voltage line VL2 may be directly connected to the second alignment electrode RME2.

The first conductive pattern CDP1 may contact the first active layer ACT1 of the first transistor T1 through the contact hole penetrating the first interlayer insulating layer IL1. The first conductive pattern CDP1 may contact the lower metal layer BML, through another contact hole penetrating the first interlayer insulating layer IL1 and the buffer layer BL. The first conductive pattern CDP1 may serve as a first source electrode S1 of the first transistor T1. Further, the first conductive pattern CDP1 may be connected to the first electrode RME1 or the first connection electrode CNE1 to be described below. The first transistor T1 may transmit the first power voltage, applied from the first voltage line VL1, to the first electrode RME1 or the first connection electrode CNE1.

The second source electrode S2 and the second drain electrode D2 may contact the second active layer ACT2 of the second transistor T2 through the contact holes penetrating the first interlayer insulating layer IL1.

A first passivation layer PV1 may be disposed on the third conductive layer. The first passivation layer PV1 may function as an insulating layer between the third conductive layer and other layers and may protect the third conductive layer.

The buffer layer BL, the first gate insulating layer GI, the first interlayer insulating layer IL1, and the first passivation layer PV1 described above may be formed as inorganic layers stacked each other in an alternating manner. For example, the buffer layer BL, the first gate insulating layer GI, the first interlayer insulating layer IL1, and the first passivation layer PV1 may be formed as a double layer formed by stacking inorganic layers including at least one of silicon oxide ($SiO_x$), silicon nitride ($SiN_x$), and silicon oxynitride ($SiO_xN_y$), or as a multilayer formed by alternately stacking the inorganic layers.

A via insulating layer VIA may be disposed on the circuit element layer. The via insulating layer VIA may be disposed on the first passivation layer PV1 of the circuit element layer. The via insulating layer VIA may include an organic insulating material, for example, polyimide, and may form a flat top surface while compensating for a height difference (or step or thickness difference) due to various wires inside the circuit element layer.

The internal bank BP is disposed on the top surface of the via insulating layer VIA. In other words, the via insulating layer VIA and the internal bank BP may directly contact each other.

The internal banks BP may be disposed on the via insulating layer VIA. The internal bank BP may have a side surface that is inclined or bent with a curvature (e.g., a predetermined or selectable curvature), and the light emitted from the light emitting element ED may be reflected from the alignment electrode RME disposed on the internal bank BP and be emitted to one side in the third direction DR3. The internal banks BP may include an organic insulating material such as polyimide, but the disclosure is not limited thereto.

The internal bank BP may include the first internal bank BP1, the second internal bank BP2, and the third internal bank BP3. The second internal bank BP2 may be disposed between the first internal bank BP1 and the third internal bank BP3.

The alignment electrodes RME may be disposed on the internal bank BP and the via insulating layer VIA. The first alignment electrode RME1 may be disposed on the first internal bank BP1 and extend in a direction toward the second internal bank BP2, and the second alignment electrode RME2 may be disposed on the second internal bank BP2 and extend in a direction toward the first internal bank BP1 and a direction toward the third internal bank BP3.

The first alignment electrode RME1 may be disposed at least on the inclined side surface of the first internal bank BP1 and on the top surface of the via insulating layer VIA positioned in the separation space between the inclined side surface of the first internal bank BP1 and the second internal bank BP2.

The second alignment electrode RME2 may be disposed at least on one inclined side surface of the second internal bank BP2 and on the top surface of the via insulating layer VIA positioned in the separation space between an inclined side surface of the second internal bank BP2 and the first internal bank BP1, and may be disposed on the top surface of the via insulating layer VIA positioned in the separation space between another inclined side surface of the second internal bank BP2 and the third internal bank BP3.

The third alignment electrode RME3 may be disposed at least on the top surface of the via insulating layer VIA positioned in the separation space between the inclined side surface of the third internal bank BP3 and the second internal bank BP2.

The gap in which the first alignment electrode RME1, the second alignment electrode RME2, and the third alignment electrode RME3 are spaced apart from each other may be narrower than the gap among the first internal bank BP1, the second internal bank BP2, and the third internal bank BP3. The gap in which the first alignment electrode RME1 and the second alignment electrode RME2 are spaced apart from each other may be narrower than the gap between the first internal bank BP1 and the second internal bank BP2, and the gap in which the second alignment electrode RME2 and the third alignment electrode RME3 are spaced apart from each other may be narrower than the gap between the second internal bank BP2 and the third internal bank BP3. At least a partial area of the first alignment electrode RME1, the second alignment electrode RME2, and the third alignment electrode RME3 may be directly disposed on the via insulating layer VIA and be disposed on a same plane.

The light emitting element ED disposed between the internal banks BP may emit light in end directions (or both end directions), and the emitted light may be directed to the alignment electrode RME disposed on the internal bank BP. Accordingly, the light emitted from the light emitting element ED may be reflected by the alignment electrode RME and emitted in the third direction DR3.

As illustrated in FIG. 9, each of the alignment electrodes RME may directly contact the third conductive layer through the first and second electrode contact holes CTD and CTS in a portion in which the alignment electrodes RME and the external bank BNL overlap each other. The first electrode contact hole CTD may be formed in an area in which the external bank BNL and the first alignment electrode RME1 overlap each other, and the second electrode contact hole CTS may be formed in an area in which the external bank BNL and the second alignment electrode RME2 overlap each other. The first alignment electrode RME1 may contact the first conductive pattern CDP1 through the first electrode contact hole CTD penetrating the via insulating layer VIA and the first passivation layer PV1. The second alignment electrode RME2 may contact the second voltage line VL2 through the second electrode contact hole CTS penetrating the via insulating layer VIA and the first passivation layer PV1. The first alignment electrode RME1 may be electrically connected to the first transistor T1 through the first conductive pattern CDP1 to be applied with the first power voltage, and the second alignment electrode RME2 may be electrically connected to the second voltage line VL2 to be applied with the second power voltage.

The alignment electrodes RME may include a conductive material having high reflectivity. For example, the alignment electrodes RME may contain a metal such as silver (Ag), copper (Cu), or aluminum (Al), or may contain an alloy including aluminum (Al), nickel (Ni), lanthanum (La), or the like. As another example, the electrodes RME may have a structure in which a metal layer such as titanium (Ti), molybdenum (Mo), and niobium (Nb) and the alloy are stacked each other. In some embodiments, the alignment electrodes RME may be formed as a double layer or a multilayer formed by stacking at least one metal layer made of an alloy including aluminum (Al) and titanium (Ti), molybdenum (Mo), and niobium (Nb).

However, the disclosure is not limited thereto, and each alignment electrode RME may further include a transparent conductive material. For example, each alignment electrode RME may include a material such as ITO, IZO, and ITZO. In some embodiments, each of the alignment electrodes RME may have a structure in which at least one transparent conductive material and at least one metal layer having high reflectivity are stacked each other, or may be formed as a layer including them. For example, each alignment electrode RME may have a stacked structure of ITO/Ag/ITO, ITO/Ag/IZO, ITO/Ag/ITZO/IZO, or the like. The alignment electrodes RME may be electrically connected to the light emitting element ED, and may reflect some of the lights emitted from the light emitting element ED in an upward direction of the substrate SUB.

A first insulating layer PAS1 may be disposed in the entire display area DA and may be disposed on the via insulating layer VIA and the alignment electrodes RME. The first insulating layer PAS1 may include an insulating material to protect the alignment electrodes RME and insulate different alignment electrodes RME from each other. As the first insulating layer PAS1 is disposed to cover the alignment electrodes RME before the external bank BNL is formed, in a process in which the alignment electrodes RME form the external bank BNL, the alignment electrode RME may be prevented from being damaged. The first insulating layer PAS1 may prevent the light emitting element ED disposed thereon from being damaged by directly contacting other members.

In an embodiment, the first insulating layer PAS1 may have stepped portions such that the top surface thereof is partially depressed between the alignment electrodes RME spaced apart from each other. The light emitting element ED may be disposed on the top surface of the first insulating layer PAS1, where the stepped portions are formed, and thus a space may remain between the light emitting element ED and the first insulating layer PAS1.

As illustrated in FIG. 9, the first insulating layer PAS1 may include contact portions CT1 and CT2. The contact portions CT1 and CT2 may be disposed to overlap the different alignment electrodes RME, respectively. For example, the contact portions CT1 and CT2 may include first contact portions CT1 disposed to overlap the first alignment electrode RME1 and second contact portions CT2 disposed to overlap the second alignment electrode RME2. The first contact portions CT1 and the second contact portions CT2 may penetrate the first insulating layer PAS1 to partially expose the top surface of the first alignment electrode RME1 or the second alignment electrode RME2 thereunder. Each of the first contact portion CT1 and the second contact portion CT2 may further penetrate some of the other insulating layers disposed on the first insulating layer PAS1. The alignment electrode RME exposed by each of the contact portions CT1 and CT2 may contact the connection electrode CNE.

The external bank BNL may be disposed on the first insulating layer PAS1. The external bank BNL may include a portion extending in the first direction DR1 and the second direction DR2 and surround each of the pixels PX. The external bank BNL may surround and divide each pixel PX, and may surround an outermost portion of the display area DA and divide the display area DA and the non-display area NDA.

The light emitting elements ED may be electrically connected to the circuit element layers under the alignment electrode RME and the via insulating layer VIA by contacting the connection electrodes CNE, and may emit light of a specific wavelength band by being applied with an electrical signal.

The external bank BNL may have a height (e.g., a predetermined or selectable height) similar to (or close to) the height of the internal bank. In some embodiments, the height of a top surface of the external bank BNL may be higher than the height of the internal bank BP, and a thickness thereof may be substantially equal to or greater than the thickness of the internal bank BP. The external bank BNL forms a barrier wall having a rectangular shape in plan view to define the emission area EMA, such that it is possible to effectively prevent ink from overflowing into the adjacent pixels PX in an inkjet printing process during the manufacturing process of the display device 1. The external bank BNL may include an organic insulating material such as polyimide in the same manner as the internal bank.

A second insulating layer PAS2 may be disposed on the light emitting elements ED, the first insulating layer PAS1, and the external bank BNL. The second insulating layer PAS2 includes a pattern portion extending in the first direction DR1 between the internal banks to be disposed on the light emitting elements ED. The pattern portion is disposed to partially surround the outer surface of the light emitting element ED, and may not cover sides (or both sides) or ends (or both ends) of the light emitting element ED. The pattern portion may form a linear or island-like pattern in each pixel PX in plan view. The pattern portion of the second insulating layer PAS2 may protect the light emitting element ED and fix the light emitting elements ED during a manufacturing process of the display device 1. Further, the second insulating layer PAS2 may be disposed to fill the space between the light emitting element ED and the first insulating layer PAS1 thereunder. A portion of the second insulating layer PAS2 may be disposed on the external bank BNL.

As illustrated in FIG. 9, the second insulating layer PAS2 may include the contact portions CT1 and CT2. The second insulating layer PAS2 may include the first contact portion CT1 disposed to overlap the first alignment electrode RME1, and the second contact portion CT2 disposed to overlap the second alignment electrode RME2. The contact portions CT1 and CT2 may penetrate the second insulating layer PAS2 in addition to the first insulating layer PAS1. The first contact portions CT1 and the second contact portions CT2 may partially expose the top surface of the first alignment electrode RME1 or the second alignment electrode RME2 disposed thereunder.

The connection electrodes CNE may be disposed on the alignment electrodes RME and the internal banks BP.

Each of the first connection electrode CNE1, the third connection electrode CNE3, and the fifth connection electrode CNE5 may be disposed on the second insulating layer PAS2 as illustrated in FIGS. 9 and 10, and may contact the light emitting elements ED.

The first connection electrode CNE1 may partially overlap the first alignment electrode RME1 and may contact an end of each of the first light emitting elements ED1. As illustrated in FIG. 9, the first connection electrode CNE1 may partially overlap the first alignment electrode RME1 and may be disposed to extend from the emission area EMA over the external bank BNL. The first connection electrode CNE1 may contact the first alignment electrode RME1 through the first contact portion CT1 penetrating the first insulating layer PAS1 and the second insulating layer PAS2. Accordingly, the first connection electrode CNE1 may be electrically connected to the first transistor T1 to be applied with the first power voltage.

As illustrated in FIGS. 10 and 11, the third connection electrode CNE3 may partially overlap the second alignment electrode RME2 and the third alignment electrode RME3 to contact another end of each of the second light emitting elements ED2 and an end of each of the third light emitting elements ED3. The first portion CNE3a of the third connection electrode CNE3 may partially overlap the second alignment electrode RME2 to contact another end of each of the second light emitting elements ED2, and the second portion CNE3b of the third connection electrode CNE3 may partially overlap the third alignment electrode RME3 to contact an end of each of the third light emitting elements ED3.

As illustrated in FIG. 10, the fifth connection electrode CNE5 may partially overlap the third alignment electrode RME3 and may contact another end of each of the fourth light emitting elements ED4. As illustrated in FIG. 9, the fifth connection electrode CNE5 may partially overlap the third alignment electrode RME3 and may be disposed to extend from the emission area EMA over the external bank BNL. The fifth connection electrode CNE5 may contact the third alignment electrode RME3 through the second contact portion CT2 penetrating the first insulating layer PAS1 and the second insulating layer PAS2. Accordingly, the fifth connection electrode CNE5 may be electrically connected to the second voltage line VL2 to be applied with the second power voltage.

A third insulating layer PAS3 may be disposed on the first connection electrode CNE1, the third connection electrode CNE3, the fifth connection electrode CNE5, and the second insulating layer PAS2. The third insulating layer PAS3 may be entirely (or substantially entirely) disposed on the second insulating layer PAS2, and thus the third insulating layer PAS3 may be disposed to cover the first connection electrode CNE1, the third connection electrode CNE3, and the fifth connection electrode CNE5. The second connection electrode CNE2 and the fourth connection electrode CNE4 may be disposed on the third insulating layer PAS3. The third insulating layer PAS3 may insulate the first connection electrode CNE1, the third connection electrode CNE3, and the fifth connection electrode CNE5 from the second connection electrode CNE2 and the fourth connection electrode CNE4, such that they do not directly contact each other.

Each of the second connection electrode CNE2 and the fourth connection electrode CNE4 may be disposed on the third insulating layer PAS3 and may contact the light emitting elements ED.

As illustrated in FIGS. 10 and 11, the second connection electrode CNE2 may partially overlap the first alignment electrode RME1 and the second alignment electrode RME2 and contact another end of each of the first light emitting elements ED1 and an end of each of the second light emitting elements ED2.

As illustrated in FIGS. 10 and 11, the fourth connection electrode CNE4 may partially overlap the second alignment electrode RME2 and the third alignment electrode RME3 and contact other ends of each of the third light emitting elements ED3 and ends of the fourth light emitting elements ED4.

The connection electrodes CNE may include a conductive material. For example, they may include ITO, IZO, ITZO, aluminum (Al), or the like. As an example, the connection electrodes CNE may include a transparent conductive material, and light emitted from the light emitting element ED may pass through the connection electrodes CNE to be emitted.

Each of the first insulating layer PAS1, the second insulating layer PAS2 and the third insulating layer PAS3 described above may include an inorganic insulating material or an organic insulating material. In an embodiment, each of the first insulating layer PAS1, the second insulating layer PAS2, and the third insulating layer PAS3 may be at least one of silicon oxide ($SiO_x$), silicon nitride ($SiN_x$), and silicon oxynitride ($SiO_xN_y$). The first insulating layer PAS1, the second insulating layer PAS2, and the third insulating layer PAS3 may be made of a same material or different materials. As another example, some of them may be made of the same material and some of them may be made of different materials.

Hereinafter, other embodiments of the display device 1 will be described. In the following embodiments, description of the same components as those of the above-described embodiment, which are denoted by like reference numerals, will be omitted or simplified, and differences will be mainly described.

Figure 12:
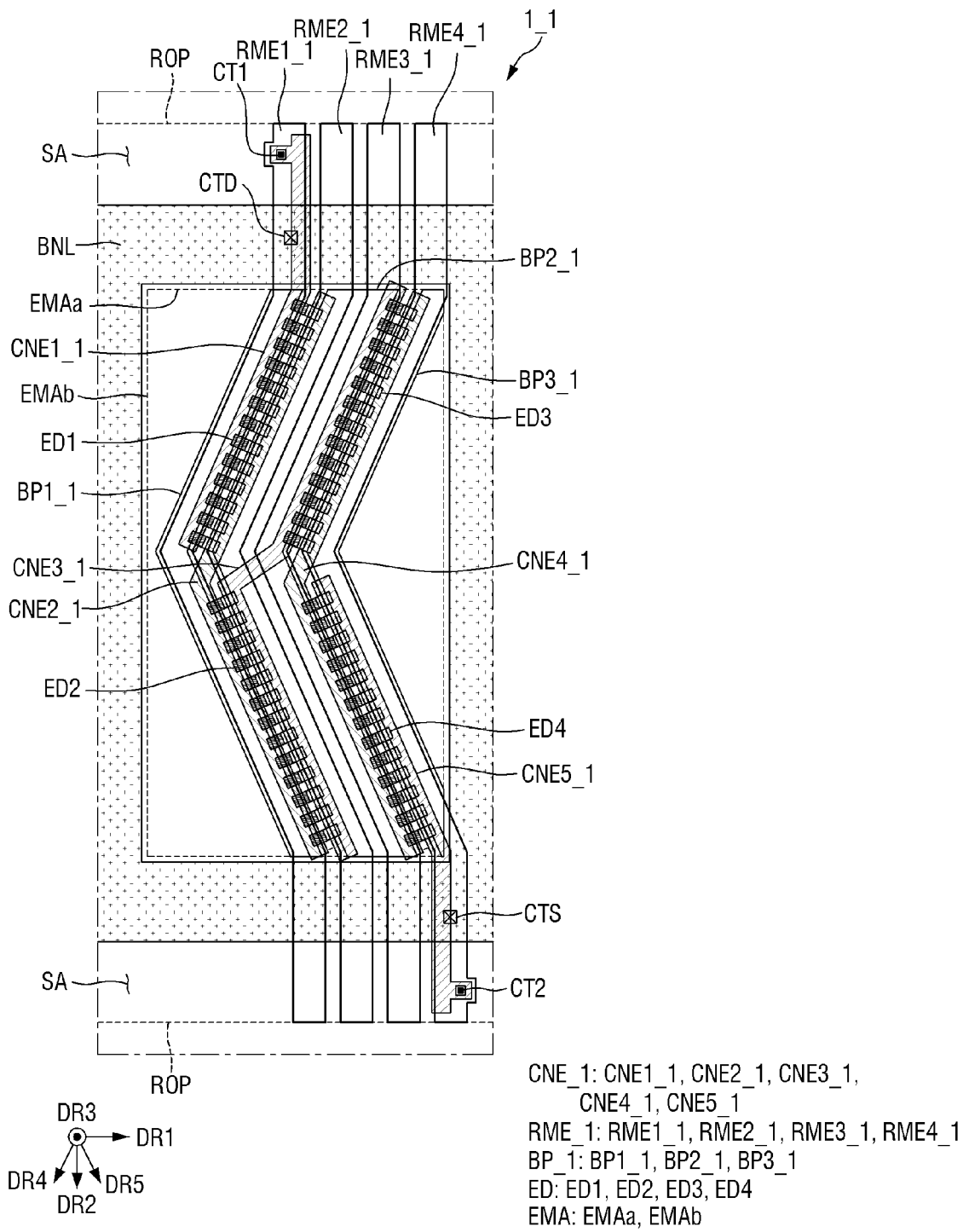
FIG. 12 is a schematic plan view illustrating a structure of a pixel of a display device according to another embodiment.
Figure 13:
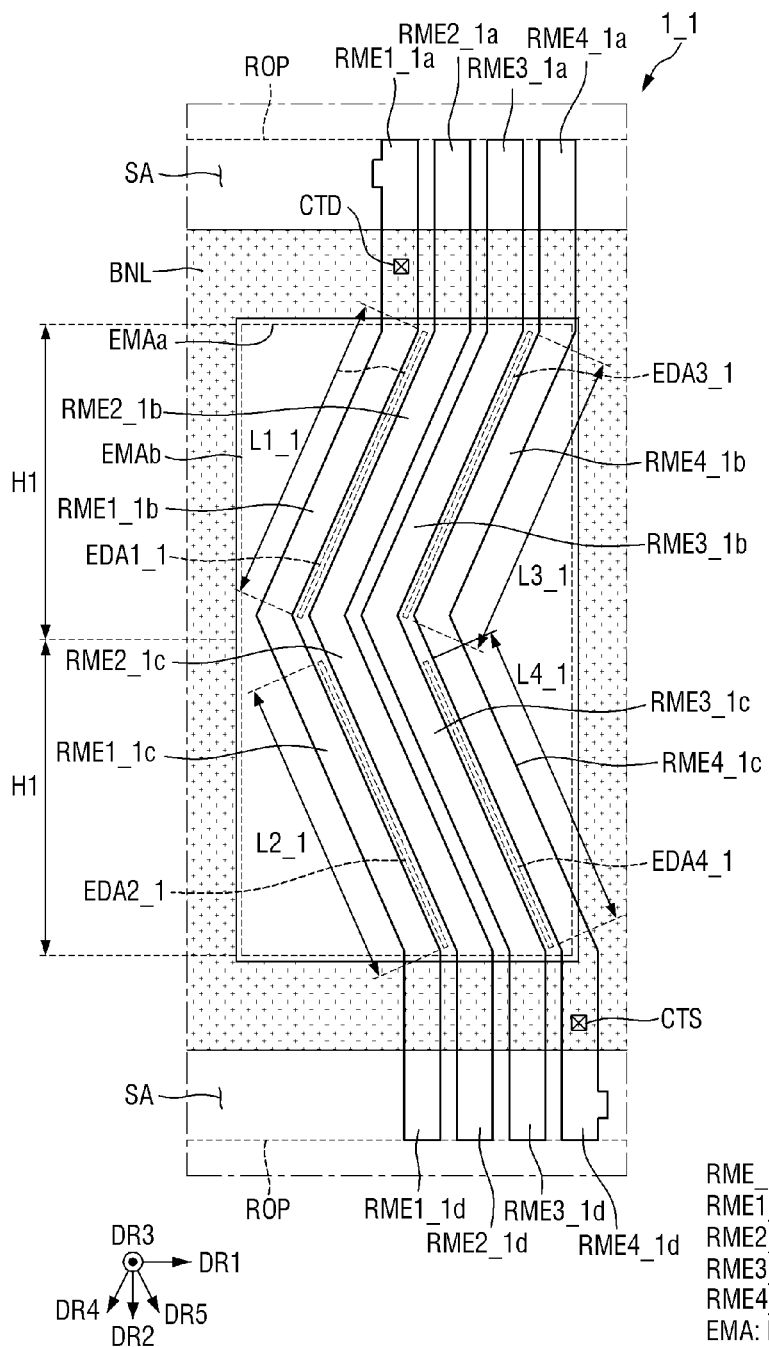
FIG. 13 is a schematic plan view illustrating the disposition of the alignment electrode of FIG. 12.
Figure 14:
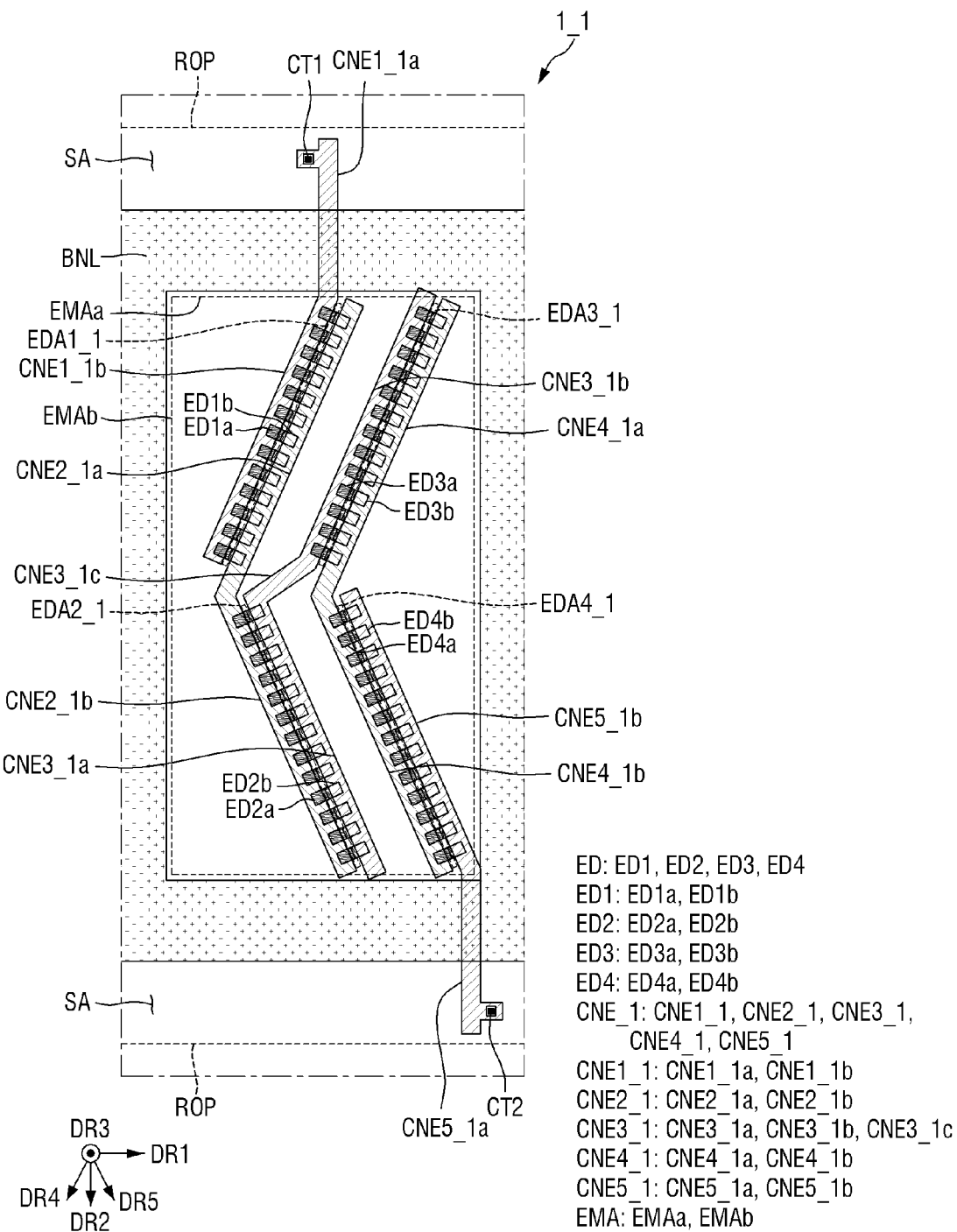
FIG. 14 is a schematic plan view illustrating the disposition of the connection electrode and the light emitting element of FIG. 12.

FIG. 12 is a schematic plan view illustrating a structure of a pixel of a display device according to another embodiment. FIG. 13 is a schematic plan view illustrating the disposition of the alignment electrode of FIG. 12. FIG. 14 is a schematic plan view illustrating the disposition of the connection electrode and the light emitting element of FIG. 12.

Referring to FIGS. 12 to 14, a display device 1_1 according to another embodiment illustrates that passages EDA1_1, EDA2_1, EDA3_1, and EDA4_1 may be arranged in the shape of an inequality sign (<). An internal bank BP_1, an alignment electrode RME_1, and a connection electrode CNE_1 included in the display device 1_1 according to another embodiment may be arranged to correspond to a shape in which the passages are disposed.

In FIG. 12, a fifth direction DR5 is additionally defined. The fifth direction DR5 may refer to an oblique direction passing between the first direction DR1 and the second direction DR2. With reference to FIG. 12, one side in the fifth direction DR5 may refer to a direction pointing between one side in the first direction DR1 and one side in the second direction DR2, and the other side in the fifth direction DR5 may refer to a direction pointing between the other side in the first direction DR1 and the other side in the second direction DR2. The fifth direction DR5 may be a direction on a plane formed by the first direction DR1 and the second direction DR2, and may be perpendicular to the third direction DR3. The fifth direction DR5 may intersect the fourth direction DR4 on a same plane.

The internal banks BP_1 may be disposed in the emission area EMA and may have a shape bent in an inequality sign (<) shape convex toward the other side in the first direction DR1. The internal bank BP_1 may include a first internal bank BP1_1, a second internal bank BP2_1, and a third internal bank BP3_1.

Each of the first internal bank BP1_1, the second internal bank BP2_1, and the third internal bank BP3_1 may have a portion extending in the fourth direction DR4 and a portion extending in the fifth direction DR5. The first internal bank BP1_1, the second internal bank BP2_1, and the third internal bank BP_1 extend in the fourth direction DR4 or the fifth direction DR5, such that separation spaces among the first internal bank BP1_1, the second internal bank BP2_1, and the third internal bank BP3_1 may also extend in the fourth direction DR4 or the fifth direction DR5. Accordingly, the light emitting elements ED may also be arranged in the fourth direction DR4 or the fifth direction DR5.

Alignment electrodes RME_1 may be disposed on the internal bank BP_1. The alignment electrode RME_1 may include a first alignment electrode RME1_1, a second alignment electrode RME2_1, a third alignment electrode RME3_1, and a fourth alignment electrode RME4_1 that are disposed to be spaced apart from each other. The first alignment electrode RME1_1 may be disposed on the first internal bank BP1_1, the second alignment electrode RME2_1 and the third alignment electrode RME3_1 may be disposed on the second internal bank BP2_1, and the fourth alignment electrode RME4_1 may be disposed on the third internal bank BP3_1.

The first alignment electrode RME1_1 may have a curved shape in an inequality sign (<) shape protruding substantially toward the other side in the first direction DR1. The first alignment electrode RME1_1 may include a first portion RME1_1a extending in the second direction DR2, a second portion RME1_1b extending in the fourth direction DR4, a third portion RME1_1c extending in the fifth direction DR5, and a fourth portion RME1_1d extending in the second direction DR2.

The first portion RME1_1a of the first alignment electrode RME1_1 may cross the external bank BNL and the sub-region SA disposed on the upper side of the emission area EMA, for example, on the other side in the second direction DR2. The first portion RME1_1a may extend to the separation portion ROP. The first portion RME1_1a may be electrically connected to the above-described circuit element layer through the first electrode contact hole CTD penetrating the external bank BNL The second portion RME1_1b of the first alignment electrode RME1_1 may be a portion disposed in the emission area EMA, and may extend in the fourth direction DR4 in the emission area EMA. The second portion RME1_1b may extend from a side of the first portion RME1_1a in the second direction DR2 to another side of the third portion RME1_1c in the second direction DR2.

The third portion RME1_1c of the first alignment electrode RME1_1 may be a portion disposed in the emission area EMA, and may extend in the fifth direction DR5 in the emission area EMA. The third portion RME1_1c may extend from a side of the second portion RME1_1b in the second direction DR2 to another side of the fourth portion RME1_1d in the second direction DR2.

The fourth portion RME1_1d of the first alignment electrode RME1_1 may cross the external bank BNL and the sub-region SA disposed on the lower side of the emission area EMA, for example, on a side in the second direction DR2. The fourth portion RME1_1d may extend to the separation portion ROP.

The second alignment electrode RME2_1 may have a curved shape in an inequality sign (<) shape protruding substantially toward the other side in the first direction DR1. The second alignment electrode RME2_1 may include a first portion RME2_1a extending in the second direction DR2, a second portion RME2_1b extending in the fourth direction DR4, a third portion RME2_1c extending in the fifth direction DR5, and a fourth portion RME2_1d extending in the second direction DR2.

The first portion RME2_1a of the second alignment electrode RME2_1 may cross the external bank BNL and the sub-region SA disposed on the upper side of the emission area EMA, for example, on the other side in the second direction DR2. The first portion RME2_1a may extend to the separation portion ROP.

The second portion RME2_1b of the second alignment electrode RME2_1 may be a portion disposed in the emission area EMA, and may extend in the fourth direction DR4 in the emission area EMA. The second portion RME2_1b may extend from a side of the first portion RME2_1a in the second direction DR2 to another side of the third portion RME2_1c in the second direction DR2.

The third portion RME2_1c of the second alignment electrode RME2_1 may be a portion disposed in the emission area EMA, and may extend in the fifth direction DR5 in the emission area EMA. The third portion RME2_1c may extend from a side of the second portion RME2_1b in the second direction DR2 to another side of the fourth portion RME2_1d in the second direction DR2.

The fourth portion RME2_1d of the second alignment electrode RME2_1 may cross the external bank BNL and the sub-region SA disposed on the lower side of the emission area EMA, for example, on a side in the second direction DR2. The fourth portion RME2_1*d* may extend to the separation portion ROP.

The third alignment electrode RME3_1 may have a curved shape in an inequality sign (<) shape protruding substantially toward the other side in the first direction DR1. The third alignment electrode RME3_1 may include a first portion RME3_1*a* extending in the second direction DR2, a second portion RME3_1*b* extending in the fourth direction DR4, a third portion RME3_1*c* extending in the fifth direction DR5, and a fourth portion RME3_1*d* extending in the second direction DR2.

The first portion RME3_1*a* of the third alignment electrode RME3_1 may cross the external bank BNL and the sub-region SA disposed on the upper side of the emission area EMA, for example, on the other side in the second direction DR2. The first portion RME3_1*a* may extend to the separation portion ROP.

The second portion RME3_1*b* of the third alignment electrode RME3_1 may be a portion disposed in the emission area EMA, and may extend in the fourth direction DR4 in the emission area EMA. The second portion RME3_1*b* may extend from a side of the first portion RME3_1*a* in the second direction DR2 to another side of the third portion RME3_1*c* in the second direction DR2.

The third portion RME3_1*c* of the third alignment electrode RME3_1 may be a portion disposed in the emission area EMA, and may extend in the fifth direction DR5 in the emission area EMA. The third portion RME3_1*c* may extend from a side of the second portion RME3_1*b* in the second direction DR2 to another side of the fourth portion RME3_1*d* in the second direction DR2.

The fourth portion RME3_1*d* of the third alignment electrode RME3_1 may cross the external bank BNL and the sub-region SA disposed on the lower side of the emission area EMA, for example, on a side in the second direction DR2. The fourth portion RME3_1*d* may extend to the separation portion ROP.

The fourth alignment electrode RME4_1 may have a shape bent in an inequality sign (<) shape protruding substantially toward the other side in the first direction DR1. The fourth alignment electrode RME4_1 may include a first portion RME4_1*a* extending in the second direction DR2, a second portion RME4_1*b* extending in the fourth direction DR4, a third portion RME4_1*c* extending in the fifth direction DR5, and a fourth portion RME4_1*d* extending in the second direction DR2.

The first portion RME4_1*a* of the fourth alignment electrode RME4_1 may cross the external bank BNL and the sub-region SA disposed on the upper side of the emission area EMA, for example, on the other side in the second direction DR2. The first portion RME4_1*a* may extend to the separation portion ROP.

The second portion RME4_1*b* of the fourth alignment electrode RME4_1 may be a portion disposed in the emission area EMA, and may extend in the fourth direction DR4 in the emission area EMA. The second portion RME4_1*b* may extend from a side of the first portion RME4_1*a* in the second direction DR2 to another side of the third portion RME4_1*c* in the second direction DR2.

The third portion RME4_1*c* of the fourth alignment electrode RME4_1 may be a portion disposed in the emission area EMA, and may extend in the fifth direction DR5 in the emission area EMA. The third portion RME4_1*c* may extend from a side of the second portion RME4_1*b* in the second direction DR2 to another side of the fourth portion RME4_1*d* in the second direction DR2.

The fourth portion RME4_1*d* of the fourth alignment electrode RME4_1 may cross the external bank BNL and the sub-region SA disposed on the lower side of the emission area EMA, for example, on a side in the second direction DR2. The fourth portion RME4_1*d* may extend to the separation portion ROP. The fourth portion RME4_1*d* may be electrically connected to the above-described circuit element layer through the second electrode contact hole CTS penetrating the external bank BNL.

As illustrated in FIG. 13, the first alignment electrode RME1_11, the second alignment electrode RME2_1, the third alignment electrode RME3_1, and the fourth alignment electrode RME4_1 may be spaced apart from each other in the first direction DR1, and the separation space between the first alignment electrode RME1_1 and the second alignment electrode RME2_1, and the separation space between the third alignment electrode RME3_1 and the fourth alignment electrode RME4_1 in the emission area EMA may define the passages EDA1_1, EDA2_1, EDA3_1, and EDA4_1 in which the light emitting elements ED are arranged.

A first passage EDA1_1 may be disposed in the separation space between the first portion RME1_1*a* of the first alignment electrode RME1_1 and the first portion RME2_1*a* of the second alignment electrode RME2_1, a second passage EDA2_1 may be disposed in the separation space between the second portion RME1_1*b* of the first alignment electrode RME1_1 and the second portion RME2_1*b* of the second alignment electrode RME2_1, a third passage EDA3_1 may be disposed in the separation space between the first portion RME3_1*a* of the third alignment electrode RME3_1 and the first portion RME4_1*a* of the fourth alignment electrode RME4_1, and a fourth passage EDA4_1 may be disposed in the separation space between the second portion RME3_1*b* of the third alignment electrode RME3_1 and the second portions RME4_1*b* of the fourth alignment electrode RME4_1.

Accordingly, the first passage EDA1_1 and the third passage EDA3_1 may extend in the fourth direction DR4, and the second passage EDA2_1 and the fourth passage EDA4_1 may extend in the fifth direction DR5. A separation space between the first passage EDA1_1 and the second passage EDA2_1 may be a space in which a first portion CNE2_1*a* of a second connection electrode CNE2_1 to be described below is disposed, and the separation space between the third passage EDA3_1 and the fourth passage EDA4_1 may be a space in which a first portion CNE4_1*a* of a fourth connection electrode CNE4_1 to be described below is disposed. The separation space between the first passage EDA1_1 and the second passage EDA2_1, and the separation space between the third passage EDA3_1 and the fourth passage EDA4_1 may be positioned in the central portion of the emission area EMA.

In case that a first electrical signal is applied to the first alignment electrode RME1_1 and the third alignment electrode RME3_1, and a second electrical signal is applied to the second alignment electrode RME2_1 and the fourth alignment electrode RME4_1, an end of each of the light emitting elements ED may be arranged on the first alignment electrode RME1_1 and the third alignment electrode RME3_1, and another end of each of the light emitting elements ED may be arranged on the second alignment electrode RME2_1 and the fourth alignment electrode RME4_1. Accordingly, an end ED_1*a* of the first light emitting element ED1 may be disposed on the first alignment electrode RME1_1, another end ED1*b* of the first light emitting element ED1 may be disposed on the second alignment electrode RME2_1, an end ED2*a* of the second light emitting element ED2 may be disposed on the first alignment electrode RME1_1, another end ED2b of the second light emitting element ED2 may be disposed on the second alignment electrode RME2_1, an end ED3a of the third light emitting element ED3 may be disposed on the third alignment electrode RME3_1, another end ED3b of the third light emitting element ED3 may be disposed on the fourth alignment electrode RME4_1, an end ED4a of the fourth light emitting element ED4 may be disposed on the third alignment electrode RME3_1, and another end ED4b of the fourth light emitting element ED4 may be disposed on the fourth alignment electrode RME4_1.

The end and the another end of each of the different light emitting elements ED may be electrically connected by the connection electrode CNE_1.

The connection electrode CNE_1 may be disposed on the light emitting element ED. The connection electrode CNE_1 may include a first connection electrode CNE1_1, a second connection electrode CNE2_1, a third connection electrode CNE3_1, a fourth connection electrode CNE4_1, and a fifth connection electrode CNE5_1 that are disposed to be spaced apart from each other.

The first connection electrode CNE1_1 may include a first portion CNE1_1a extending substantially in the second direction DR2 and a second portion CNE1_1b extending in the fourth direction DR4 in the emission area EMA.

The first portion CNE1_1a of the first connection electrode CNE1_1 may be disposed on the other side in the second direction DR2 in the emission area EMA to overlap the first alignment electrode RME1_1 in the third direction DR3, and may be electrically connected to the first alignment electrode RME1_1 through the first contact portion CT1.

The second portion CNE1_1b of the first connection electrode CNE1_1 may contact an end ED1a of each of the first light emitting elements ED1. The second portion CNE1_1b may extend in the fourth direction DR4, and may extend to a portion in which the first passage EDA1_1 is disposed. In other words, the second portion CNE1_1b may extend to only a vicinity of the center of the emission area EMA, for example, a vicinity in which the first light emitting elements ED1 are arranged.

The second connection electrode CNE2_1 may have a shape bent in an inequality sign (<) shape protruding substantially toward the other side in the first direction DR1. The second connection electrode CNE2_1 may serve to electrically connect another end ED1b of the first light emitting element ED1 with an end ED2a of the second light emitting element ED2. The second connection electrode CNE2_1 may include the first portion CNE2_1a extending in the fourth direction DR4 and a second portion CNE2_1b extending in the fifth direction DR5.

The first portion CNE2_1a of the second connection electrode CNE2_1 may contact another end ED1b of each of the first light emitting elements ED1. The first portion CNE2_1a may extend in the fourth direction DR4 to a vicinity in which the second portion CNE1_1b of the first connection electrode CNE1_1 extends, for example, to a vicinity in which the first light emitting elements ED1 are arranged. The first portion CNE2_1a may be connected to the second portion CNE2_1b across the separation space between the first passage EDA1_1 and the second passage EDA2_1 described above.

The second portion CNE2_1b of the second connection electrode CNE2_1 may contact an end ED2a of each of the second light emitting elements ED2. The second portion CNE2_1b may extend in the fifth direction DR5 to a vicinity in which the second light emitting elements ED2 are arranged in the emission area EMA.

The third connection electrode CNE3_1 may serve to electrically connect another end ED2b of the second light emitting element ED2 with an end ED3a of the third light emitting element ED3. The third connection electrode CNE3_1 may include a first portion CNE3_1a extending in the fifth direction DR5, a second portion CNE3_1b extending in the fourth direction DR4, and a connection portion CNE3_1c connecting the first portion CNE3_1a with the second portion CNE3_1b.

The first portion CNE3_1a of the third connection electrode CNE3_1 may contact another end ED2b of each of the second light emitting elements ED2. The first portion CNE3_1a may extend in the fifth direction DR5 to a vicinity in which the second light emitting elements ED2 are arranged in the emission area EMA. In other words, the first portion CNE3_1a of the third connection electrode CNE3_1 may extend to a vicinity in which the second portion CNE2_1b of the second connection electrode CNE2_1 is disposed.

The second portion CNE3_1b of the third connection electrode CNE3_1 may contact an end ED3a of each of the third light emitting elements ED3. The second portion CNE3_1b may extend in the fourth direction DR4 to a vicinity in which the third light emitting element ED3 is arranged in the emission area EMA.

The connection portion CNE3_1c of the third connection electrode CNE3_1 may serve to connect the first portion CNE3_1a with the second portion CNE3_1b. The third connection electrode CNE3_1 may connect another side of the first portion CNE3_1a in the second direction DR2 with a side of the second portion CNE3_1b in the second direction DR2. The third connection electrode CNE3_1 may extend in a direction crossing the fourth direction DR4 or the fifth direction DR5 to connect the first portion CNE3_1a with the second portion CNE3_1b. In some embodiments, the connection portion CNE3_1c may be positioned at the central portion of the emission area EMA.

The fourth connection electrode CNE4_1 may have a curved shape in an inequality sign (<) shape protruding substantially toward the other side in the first direction DR1. The fourth connection electrode CNE4_1 may serve to electrically connect another end ED3b of the third light emitting element ED3 with an end ED4a of the fourth light emitting element ED4. The fourth connection electrode CNE4_1 may include the first portion CNE4_1a extending in the fourth direction DR4 and a second portion CNE4_1b extending in the fifth direction DR5.

The first portion CNE4_1a of the fourth connection electrode CNE4_1 may contact another end ED3b of each of the third light emitting elements ED3. The first portion CNE4_1a may extend in the fourth direction DR4 to a vicinity in which the second portion CNE3_1b of the third connection electrode CNE3_1 extends, for example, to a vicinity in which the third light emitting elements ED3 are arranged. The first portion CNE4_1a may be connected to the second portion CNE4_1b across the separation space between the third passage EDA3_1 and the fourth passage EDA4_1 described above.

The second portion CNE4_1b of the fourth connection electrode CNE4_1 may contact an end ED4a of each of the fourth light emitting elements ED4. The second portion CNE4_1b may extend in the fifth direction DR5 to a vicinity in which the fourth light emitting elements ED4 are arranged in the emission area EMA.

The fifth connection electrode CNE5_1 may include a first portion CNE5_1a extending substantially in the second direction DR2 and a second portion CNE5_1b extending in the fifth direction DR5 in the emission area EMA.

The first portion CNE5_1a of the fifth connection electrode CNE5_1 may overlap the fourth alignment electrode RME4_1 in the third direction DR3, and may be electrically connected to the fourth alignment electrode RME4_1 through the second contact portion CT2.

The second portion CNE5_1b of the fifth connection electrode CNE5_1 may contact another end ED4b of each of the fourth light emitting elements ED4. The second portion CNE5_1b may extend in the fifth direction DR5, and may extend to a portion in which the fourth passage EDA4_1 is disposed. In other words, the second portion CNE5_1b may extend to only a vicinity of the center of the emission area EMA, for example, a vicinity in which the fourth light emitting elements ED4 are arranged.

Similar to the case of the display device 1 according to an embodiment, the length of each of the first passage EDA1_1, the second passage EDA2_1, the third passage EDA3_1, and the fourth passage EDA4_1 in the fourth direction DR4 according to another embodiment may be substantially equal to or greater than a half of the length of the long side EMAb of the emission area EMA in the second direction DR2. A length L1_1 of the first passage EDA1_1 in the fourth direction DR4, a length L2_1 of the second passage EDA2_1 in the fifth direction DR5, a length L3_1 of the third passage EDA3_1 in the fourth direction DR4, and a length L4_1 of the fourth passage EDA4_1 in the fifth direction DR5 may be substantially equal to or greater than the length of the first width H1.

Each of the length L1_1 of the first passage EDA1_1 in the fourth direction DR4, the length L2_1 of the second passage EDA2_1 in the fifth direction DR5, the length L3_1 of the third passage EDA3_1 in the fourth direction DR4, and the length L4_1 of the fourth passage EDA4_1 in the fifth direction DR5 may be substantially equal to or greater than about 44 μm.

With the above-described configuration, the number of light emitting elements ED that provides the minimum luminous efficiency required by the display device while the light emitting elements ED are freely disposed, may be readily secured.

Figure 15:
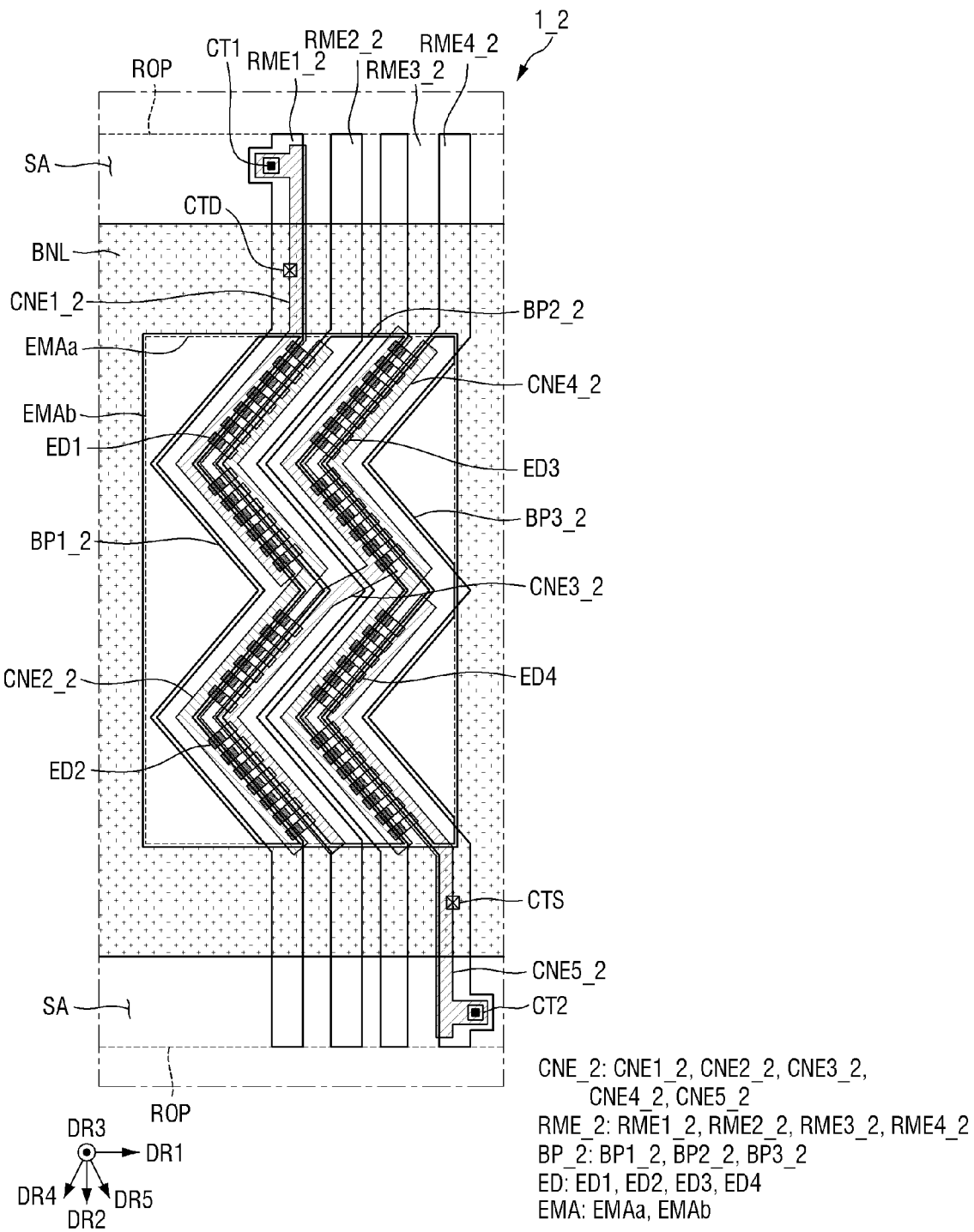
FIG. 15 is a schematic plan view illustrating a structure of a pixel of a display device according to yet another embodiment.
Figure 16:
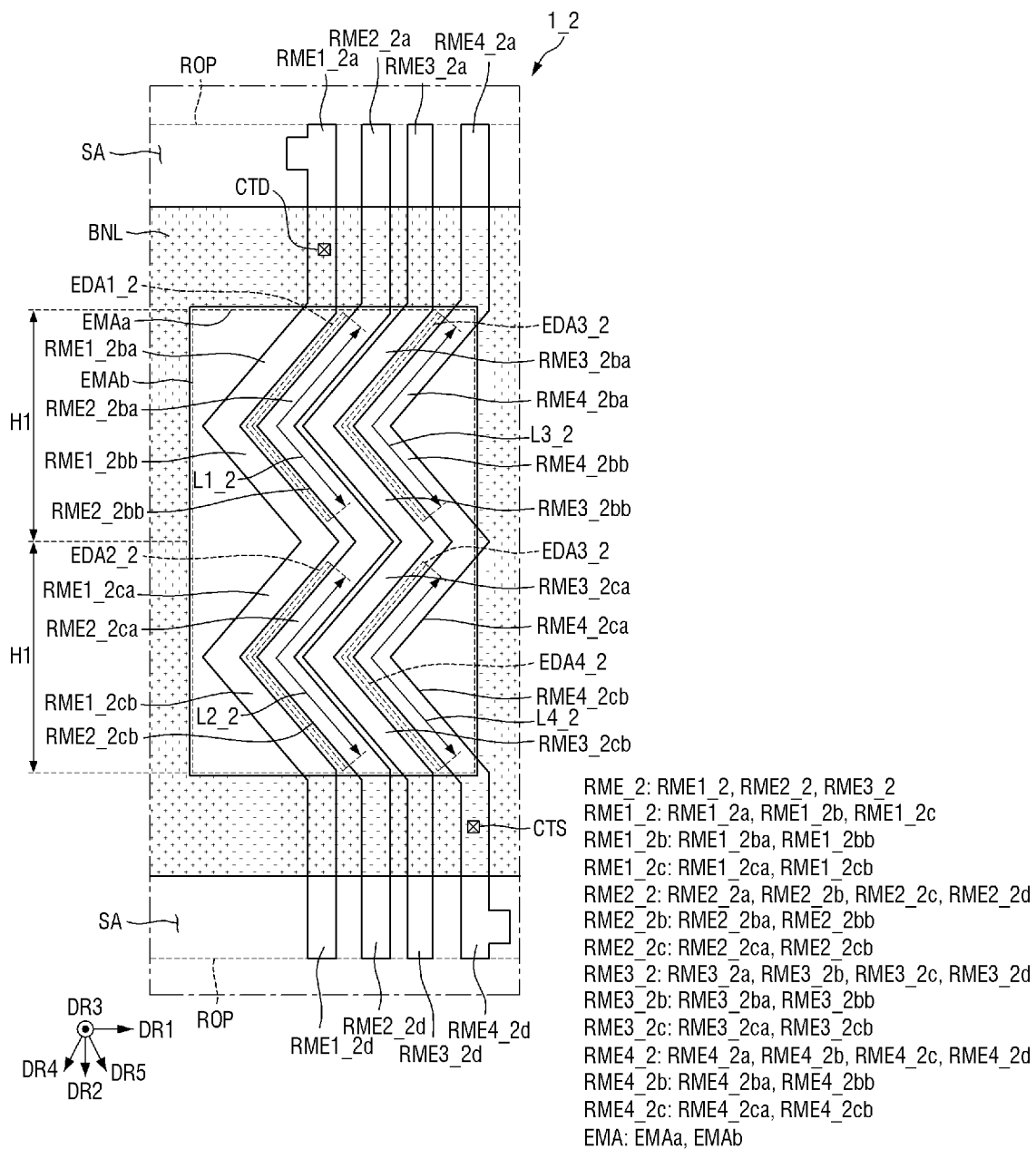
FIG. 16 is a schematic plan view illustrating the disposition of the alignment electrode of FIG. 15.
Figure 17:
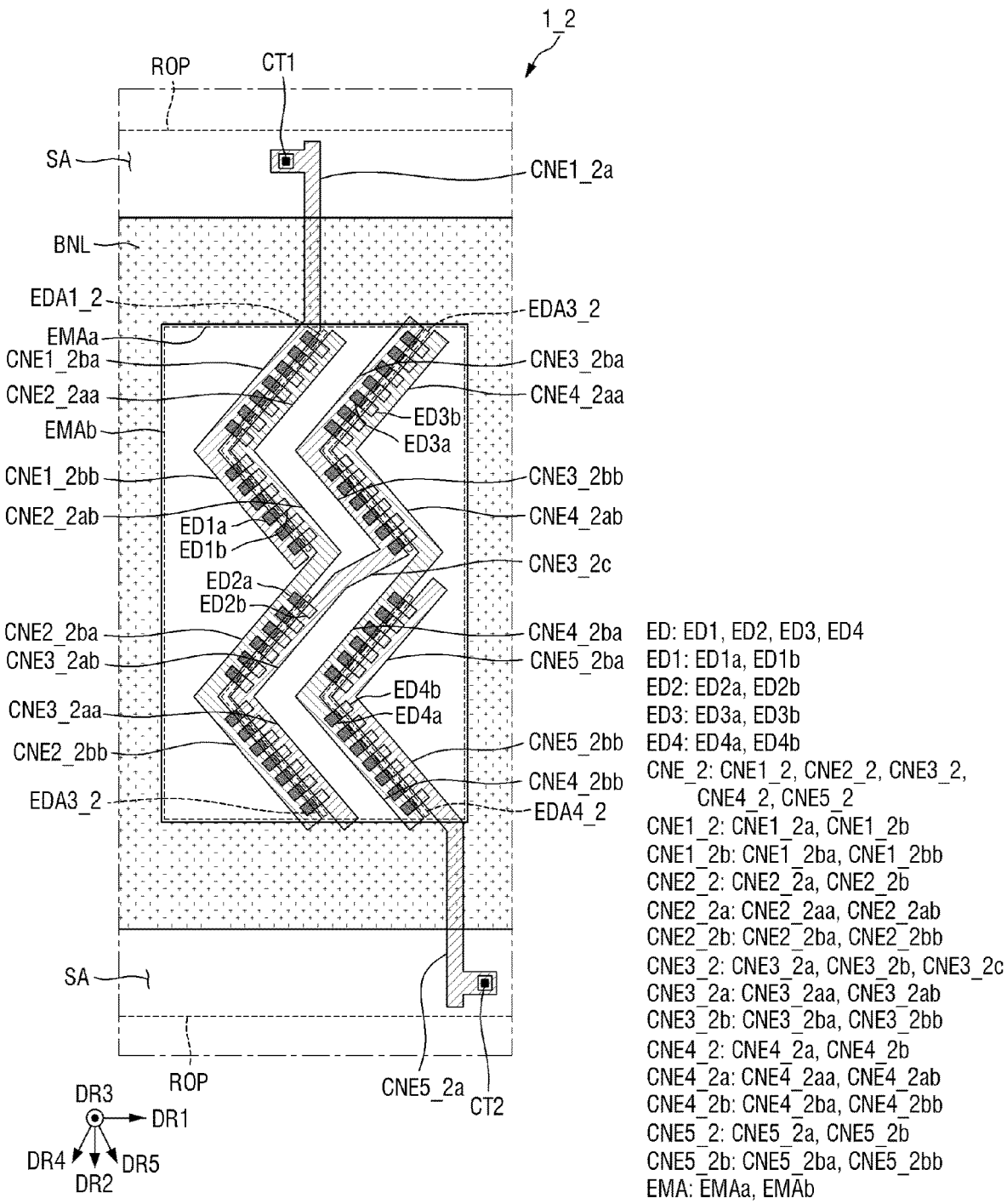
FIG. 17 is a schematic plan view illustrating the disposition of the connection electrode and the light emitting element of FIG. 15.

FIG. 15 is a schematic plan view illustrating a structure of a pixel of a display device according to yet another embodiment. FIG. 16 is a schematic plan view illustrating the disposition of the alignment electrode of FIG. 15. FIG. 17 is a schematic plan view illustrating the disposition of the connection electrode and the light emitting element of FIG. 15.

Referring to FIGS. 15 to 17, a display device 1_2 according to another embodiment is illustrated as an example that each of passages EDA1_2, EDA2_2, EDA3_2, and EDA4_2 on which the light emitting element ED is disposed, may be curved at least once. An internal bank BP_2, an alignment electrode RME_2, and a connection electrode CNE_2 included in the display device 1_2 according to another embodiment may be arranged to correspond to a shape in which the passages are disposed.

The internal banks BP_2 may be disposed in the emission area EMA and may have a shape bent twice in an inequality sign (<) shape convex toward the other side in the first direction DR1. The internal bank BP_2 may include a first internal bank BP1_2, a second internal bank BP2_2, and a third internal bank BP3_2.

Each of the first internal bank BP1_2, the second internal bank BP2_2, and the third internal bank BP3_2 may have a portion extending in the fourth direction DR4 and a portion extending in the fifth direction DR5.

The first internal bank BP1_2, the second internal bank BP2_2, and the third internal bank BP3_2 may extend in the fourth direction DR4 or the fifth direction DR5, such that separation spaces among the first internal bank BP1_2, the second internal bank BP2_2, and the third internal bank BP3_2 may also extend in the fourth direction DR4 or the fifth direction DR5. Accordingly, the light emitting elements ED may also be arranged in the fourth direction DR4 or the fifth direction DR5.

Alignment electrodes RME_2 may be disposed on the internal bank BP_2. The alignment electrode RME_2 may include a first alignment electrode RME1_2, a second alignment electrode RME2_2, a third alignment electrode RME3_2, and a fourth alignment electrode RME4_2 that are disposed to be spaced apart from each other. The first alignment electrode RME1_2 may be disposed on the first internal bank BP1_2, the second alignment electrode RME2_2 and the third alignment electrode RME3_2 may be disposed on the second internal bank BP2_2, and the fourth alignment electrode RME4_2 may be disposed on the third internal bank BP3_2.

The first alignment electrode RME1_2 may have a twice-curved shape in an inequality sign (<) shape protruding substantially toward the other side in the first direction DR1. The first alignment electrode RME1_2 may include a first portion RME1_2a extending in the second direction DR2, a second portion RME1_2b curved in an inequality sign (<) shape, a third portion RME1_2c curved in an inequality sign (<) shape, and a fourth portion RME1_2d extending in the second direction DR2.

Since the description of the first portion RME1_2a and the fourth portion RME1_2d of the first alignment electrode RME1_2 may be substantially the same as the description of the first portion RME1_1a and the fourth portion RME1_1d of the first alignment electrode RME1_1 according to the embodiment of FIG. 12, the description thereof will be omitted.

The second portion RME1_2b of the first alignment electrode RME1_2 may be a portion disposed in the emission area EMA, and may have a twice-curved shape in an inequality sign (<) shape protruding to the other side in the first direction DR1. The second portion RME1_2b may include a first inclined portion RME1_2ba extending in the fourth direction DR4 from the emission area EMA and a second inclined portion RME1_2bb extending in the fifth direction DR5.

The third portion RME1_2c of the first alignment electrode RME1_2 may be a portion disposed in the emission area EMA, and may have a curved shape in an inequality sign (<) shape protruding to the other side in the first direction DR1. The third portion RME1_2c may include a first inclined portion RME1_2ca extending in the fourth direction DR4 from the emission area EMA and a second inclined portion RME1_2cb extending in the fifth direction DR5.

The second alignment electrode RME2_2 may have a twice-curved shape in an inequality sign (<) shape protruding substantially toward the other side in the first direction DR1. The second alignment electrode RME2_2 may include a first portion RME2_2a extending in the second direction DR2, a second portion RME2_2b curved in an inequality sign (<) shape, a third portion RME2_2c curved in an inequality sign (<) shape, and a fourth portion RME2_2d extending in the second direction DR2.

Since the description of the first portion RME2_2a and the fourth portion RME2_2d of the second alignment electrode RME2_2 may be substantially the same as the description of the first portion RME2_1a and the fourth portion RME2_1d of the second alignment electrode RME2_1 according to the embodiment of FIG. 12, the description thereof will be omitted.

The second portion RME2_2b of the second alignment electrode RME2_2 may be a portion disposed in the emission area EMA, and may have a twice-curved shape in an inequality sign (<) shape protruding to the other side in the first direction DR1. The second portion RME2_2b may include a first inclined portion RME2_2ba extending in the fourth direction DR4 from the emission area EMA and a second inclined portion RME2_2bb extending in the fifth direction DR5.

The third portion RME2_2c of the second alignment electrode RME2_2 may be a portion disposed in the emission area EMA, and may have a curved shape in an inequality sign (<) shape protruding to the other side in the first direction DR1. The third portion RME2_2c may include a first inclined portion RME2_2ca extending in the fourth direction DR4 from the emission area EMA and a second inclined portion RME2_2cb extending in the fifth direction DR5.

The third alignment electrode RME3_2 may have a twice-curved shape in an inequality sign (<) shape protruding substantially toward the other side in the first direction DR1. The third alignment electrode RME3_2 may include a first portion RME3_2a extending in the second direction DR2, a second portion RME3_2b curved in an inequality sign (<) shape, a third portion RME3_2c curved in an inequality sign (<) shape, and a fourth portion RME3_2d extending in the second direction DR2.

Since the description of the first portion RME3_2a and the fourth portion RME3_2d of the third alignment electrode RME3_2 may be substantially the same as the description of the first portion RME3_1a and the fourth portion RME3_1d of the third alignment electrode RME3_1 according to the embodiment of FIG. 12, the description thereof will be omitted.

The second portion RME3_2b of the third alignment electrode RME3_2 may be a portion disposed in the emission area EMA, and may have a twice-curved shape in an inequality sign (<) shape protruding to the other side in the first direction DR1. The second portion RME3_2b may include a first inclined portion RME3_2ba extending in the fourth direction DR4 from the emission area EMA and a second inclined portion RME3_2bb extending in the fifth direction DR5.

The third portion RME3_2c of the third alignment electrode RME3_2 may be a portion disposed in the emission area EMA, and may have a curved shape in an inequality sign (<) shape protruding to the other side in the first direction DR1. The third portion RME3_2c may include a first inclined portion RME3_2ca extending in the fourth direction DR4 from the emission area EMA and a second inclined portion RME3_2cb extending in the fifth direction DR5.

The fourth alignment electrode RME4_2 may have a twice-curved shape in an inequality sign (<) shape protruding substantially toward the other side in the first direction DR1. The fourth alignment electrode RME4_2 may include a first portion RME4_2a extending in the second direction DR2, a second portion RME4_2b curved in an inequality sign (<) shape, a third portion RME4_2c curved in an inequality sign (<) shape, and a fourth portion RME4_2d extending in the second direction DR2.

Since the description of the first portion RME4_2a and the fourth portion RME4_2d of the fourth alignment electrode RME4_2 may be substantially the same as the description of the first portion RME4_1a and the fourth portion RME4_1d of the fourth alignment electrode RME4_1 according to the embodiment of FIG. 12, the description thereof will be omitted.

The second portion RME4_2b of the fourth alignment electrode RME4_2 may be a portion disposed in the emission area EMA, and may have a twice-curved shape in an inequality sign (<) shape protruding to the other side in the first direction DR1. The second portion RME4_2b may include a first inclined portion RME4_2ba extending in the fourth direction DR4 from the emission area EMA and a second inclined portion RME4_2bb extending in the fifth direction DR5.

The third portion RME4_2c of the second alignment electrode RME4_2 may be a portion disposed in the emission area EMA, and may have a curved shape in an inequality sign (<) shape protruding to the other side in the first direction DR1. The third portion RME4_2c may include a first inclined portion RME4_2ca extending in the fourth direction DR4 from the emission area EMA and a second inclined portion RME4_2cb extending in the fifth direction DR5.

As illustrated in FIG. 16, the first alignment electrode RME1_2, the second alignment electrode RME2_2, the third alignment electrode RME3_2, and the fourth alignment electrode RME4_2 may be spaced apart from each other in the first direction DR1, and the separation space between the first alignment electrode RME1_2 and the second alignment electrode RME2_2, and the separation space between the third alignment electrode RME3_2 and the fourth alignment electrode RME4_2 in the emission area EMA may define the passages EDA1_2, EDA2_2, EDA3_2, and EDA4_2 in which the light emitting elements ED are arranged.

The first passage EDA1_2 may be disposed in the separation space between the first portion RME1_2a of the first alignment electrode RME1_2 and the first portion RME2_2a of the second alignment electrode RME2_2, the second passage EDA2_2 may be disposed in the separation space between the second portion RME1_2b of the first alignment electrode RME1_2 and the second portion RME2_2b of the second alignment electrode RME2_2, the third passage EDA3_2 may be disposed in the separation space between the first portion RME3_2a of the third alignment electrode RME3_2 and the first portion RME4_2a of the fourth alignment electrode RME4_2, and the fourth passage EDA4_2 may be disposed in the separation space between the second portion RME3_2b of the third alignment electrode RME3_2 and the second portions RME4_2b of the fourth alignment electrode RME4_2.

Accordingly, the first passage EDA1_2, the second passage EDA2_2, the third passage EDA3_2, and the fourth passage EDA4_2 may have an inequality sign (<) shape, which is convex toward the other side in the first direction DR1, including a portion extending in the fourth direction DR4 and a portion extending in the fifth direction DR5. A separation space between the first passage EDA1_2 and the second passage EDA2_2 may be a space in which a first inclined portion CNE2_2ba of a second connection electrode CNE2_2 to be described below is disposed, and the separation space between the third passage EDA3_2 and the fourth passage EDA4_2 may be a space in which a first inclined portion CNE4_2*ba* of a fourth connection electrode CNE4_2 to be described below is disposed. The separation space between the first passage EDA1_2 and the second passage EDA2_2, and the separation space between the third passage EDA3_2 and the fourth passage EDA4_2 may be positioned in the central portion of the emission area EMA.

Since the orientation relationship of the light emitting element ED of the display device 1_2 according to this embodiment may be substantially the same as the orientation relationship of the light emitting element ED of the display device 1_1 according to the embodiment of FIG. 12, the description thereof will be omitted.

The connection electrode CNE_2 may be disposed on the light emitting element ED. The connection electrode CNE_2 may include a first connection electrode CNE1_2, a second connection electrode CNE2_2, a third connection electrode CNE3_2, a fourth connection electrode CNE4_2, and a fifth connection electrode CNE5_2 that are disposed to be spaced apart from each other.

The first connection electrode CNE1_2 may include a first portion CNE1_2*a* extending substantially in the second direction DR2 and a second portion CNE1_2*b* having an inequality sign (<) shape convex toward the other side in the first direction DR1 in the emission area EMA.

The first portion CNE1_2*a* of the first connection electrode CNE1_2 may overlap the first alignment electrode RME1_2 in the third direction DR3, and may be electrically connected to the first alignment electrode RME1_2 through the first contact portion CT1.

The second portion CNE1_2*b* of the first connection electrode CNE1_2 may contact an end ED1*a* of each of the first light emitting elements ED1. The second portion CNE1_2*b* may include a first inclined portion CNE1_2*ba* extending in the fourth direction DR4 and a second inclined portion CNE1_2*bb* extending in the fifth direction DR5.

The second connection electrode CNE2_2 may have a twice-curved shape in an inequality sign (<) shape protruding substantially toward the other side in the first direction DR1. The second connection electrode CNE2_2 may serve to electrically connect another end ED1*b* of the first light emitting element ED1 with an end ED2*a* of the second light emitting element ED2. The second connection electrode CNE2_2 may include a first portion CNE2_2*a* curved in an inequality sign (<) shape protruding to the other side in the first direction DR1, and a second portion CNE2_2*b* curved in an inequality sign (<) shape protruding to the other side in the first direction DR1.

The first portion CNE2_2*a* of the second connection electrode CNE2_2 may contact another end ED1*b* of each of the first light emitting elements ED1. The first portion CNE2_2*a* may include a first inclined portion CNE2_2*aa* extending in the fourth direction DR4 and a second inclined portion CNE2_2*ab* extending in the fifth direction DR5.

The second portion CNE2_2*b* of the second connection electrode CNE2_2 may contact an end ED2*a* of each of the second light emitting elements ED2. The second portion CNE2_2*b* may include a first inclined portion CNE2_2*ba* extending in the fourth direction DR4 and a second inclined portion CNE2_2*bb* extending in the fifth direction DR5.

The first inclined portion CNE2_2*ba* of the second portion CNE2_2*b* may be connected to the first portion CNE2_2*a* across the separation space between the first passage EDA1_2 and the second passage EDA2_2 described above.

The third connection electrode CNE3_2 may serve to electrically connect another end ED2*b* of the second light emitting element ED2 with an end ED3*a* of the third light emitting element ED3. The third connection electrode CNE3_2 may include a first portion CNE3_2*a* curved in an inequality sign (<) shape protruding to the other side in the first direction DR1, a second portion CNE3_2*b* curved in an inequality sign (<) shape protruding to the other side in the first direction DR1, and a connection portion CNE3_2*c* connecting the first portion CNE3_2*a* with the second portion CNE3_2*b*.

The first portion CNE3_2*a* of the third connection electrode CNE3_2 may contact another end ED2*b* of each of the second light emitting elements ED2. The first portion CNE3_2*a* may include a first inclined portion CNE3_2*aa* extending in the fourth direction DR4 and a second inclined portion CNE3_2*ab* extending in the fifth direction DR5.

The second portion CNE3_2*b* of the third connection electrode CNE3_2 may contact an end ED3*a* of each of the third light emitting elements ED3. The second portion CNE3_2*b* may include a first inclined portion CNE3_2*ba* extending in the fourth direction DR4 and a second inclined portion CNE3_2*bb* extending in the fifth direction DR5.

The connection portion CNE3_2*c* of the third connection electrode CNE3_2 may serve to connect the first portion CNE3_2*a* with the second portion CNE3_2*b*. The third connection electrode CNE3_2 may extend in a direction crossing the fourth direction DR4 or the fifth direction DR5 to connect the first portion CNE3_2*a* with the second portion CNE3_2*b*. In some embodiments, the connection portion CNE3_2*c* may be positioned at the central portion of the emission area EMA.

The fourth connection electrode CNE4_2 may have a twice-curved shape in an inequality sign (<) shape protruding substantially toward the other side in the first direction DR1. The fourth connection electrode CNE4_2 may serve to electrically connect another end ED3*b* of the third light emitting element ED3 with an end ED4*a* of the fourth light emitting element ED4. The fourth connection electrode CNE4_2 may include a first portion CNE4_2*a* curved in an inequality sign (<) shape protruding to the other side in the first direction DR1, and a second portion CNE4_2*b* curved in an inequality sign (<) shape protruding to the other side in the first direction DR1.

The first portion CNE4_2*a* of the fourth connection electrode CNE4_2 may contact another end ED3*b* of each of the third light emitting elements ED3. The first portion CNE4_2*a* may include a first inclined portion CNE4_2*aa* extending in the fourth direction DR4 and a second inclined portion CNE4_2*ab* extending in the fifth direction DR5.

The second portion CNE4_2*b* of the fourth connection electrode CNE4_2 may contact an end ED4*a* of each of the fourth light emitting elements ED4. The second portion CNE4_2*b* may include a first inclined portion CNE4_2*ba* extending in the fourth direction DR4 and a second inclined portion CNE4_2*bb* extending in the fifth direction DR5.

The first inclined portion CNE4_2*ba* of the second portion CNE4_2*b* may be connected to the first portion CNE4_2*a* across the separation space between the third passage EDA3_2 and the fourth passage EDA4_2 described above.

The fifth connection electrode CNE5_2 may include a first portion CNE5_2*a* extending substantially in the second direction DR2 and a second portion CNE5_2*b* having an inequality sign (<) shape convex toward the other side in the first direction DR1 in the emission area EMA.

The first portion CNE5_2*a* of the fifth connection electrode CNE5_2 may overlap the fourth alignment electrode RME4_2 in the third direction DR3, and may be electrically connected to the fourth alignment electrode RME4_2 through the second contact portion CT2.

The second portion CNE5_2b of the fifth connection electrode CNE5_2 may contact another end ED1b of each of the fourth light emitting elements ED4. The second portion CNE5_2b may include a first inclined portion CNE5_2ba extending in the fourth direction DR4 and a second inclined portion CNE5_2bb extending in the fifth direction DR5.

On the other hand, each of the first passage EDA1_2, the second passage EDA2_2, the third passage EDA3_2, and the fourth passage EDA4_2 that have an inequality sign (<) shape convex to the other side in the first direction DR1, including a portion extending in the fourth direction DR4 and a portion extending in the fifth direction DR5, may have a length substantially equal to or greater than the first width H1. A length L1_2 of the first passage EDA1_2 may be about the sum of the length of a portion extending in the fourth direction DR4 and the length of a portion extending in the fifth direction DR5, a length L2_2 of the second passage EDA2_2 may be about the sum of the length of a portion extending in the fourth direction DR4 and the length of a portion extending in the fifth direction DR5, a length L3_2 of the third passage EDA3_2 may be about the sum of the length of a portion extending in the fourth direction DR4 and the length of a portion extending in the fifth direction DR5, and a length L4_2 of the fourth passage EDA4_2 may be about the sum of the length of a portion extending in the fourth direction DR4 and the length of a portion extending in the fifth direction DR5.

Each of the length L1_2 of the first passage EDA1_2 in the fourth direction DR4, the length L2_2 of the second passage EDA2_2 in the fifth direction DR5, the length L3_2 of the third passage EDA3_2 in the fourth direction DR4, and the length L4_2 of the fourth passage EDA4_2 in the fifth direction DR5 may be substantially equal to or greater than about 44 µm.

With the above-described configuration, it is possible to more readily secure the number of light emitting elements ED providing the minimum luminous efficiency required for a display device.

Figure 18:
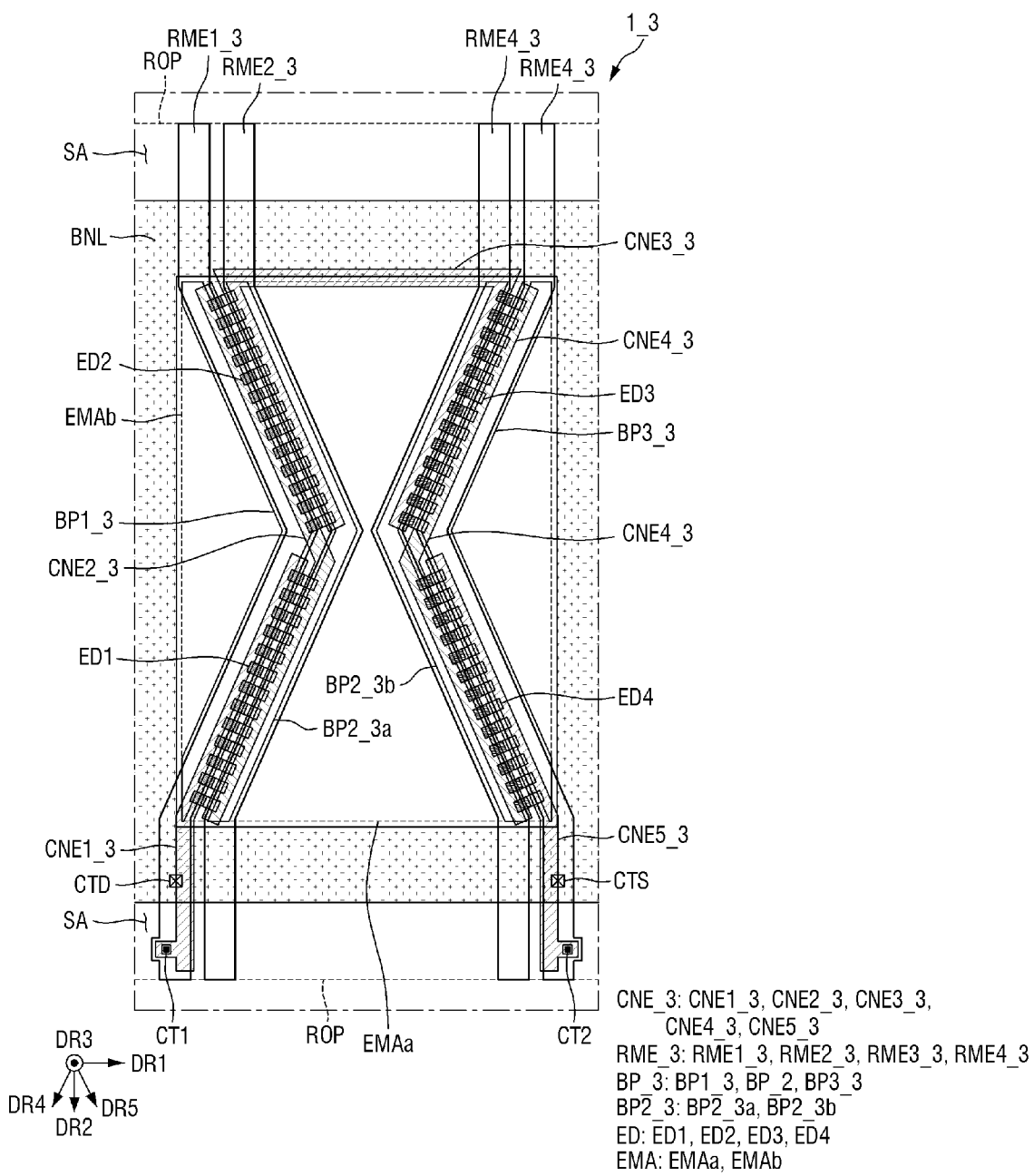
FIG. 18 is a schematic plan view illustrating a structure of a pixel of a display device according to yet another embodiment.
Figure 19:
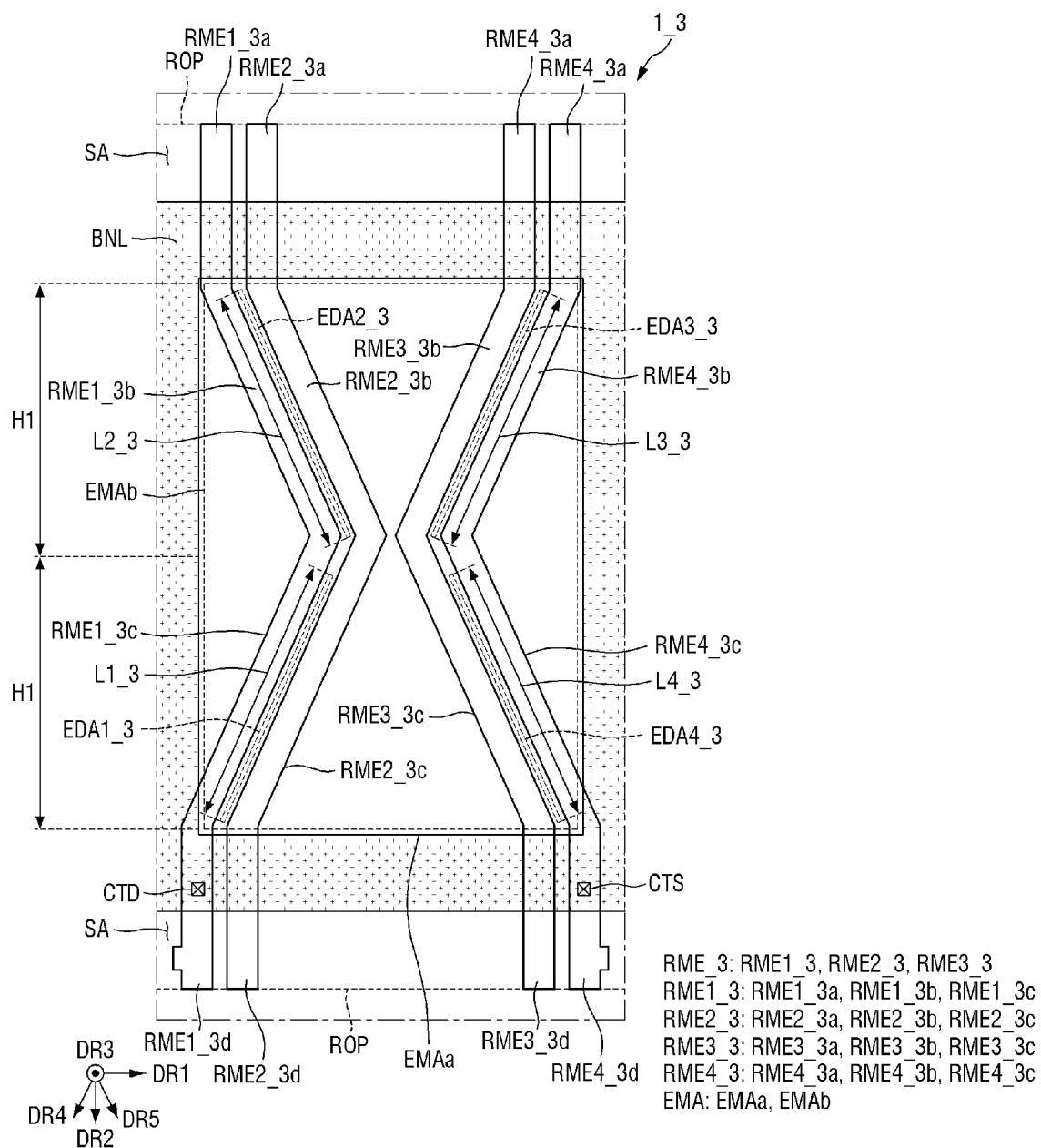
FIG. 19 is a schematic plan view illustrating the disposition of the alignment electrode of FIG. 18.
Figure 20:
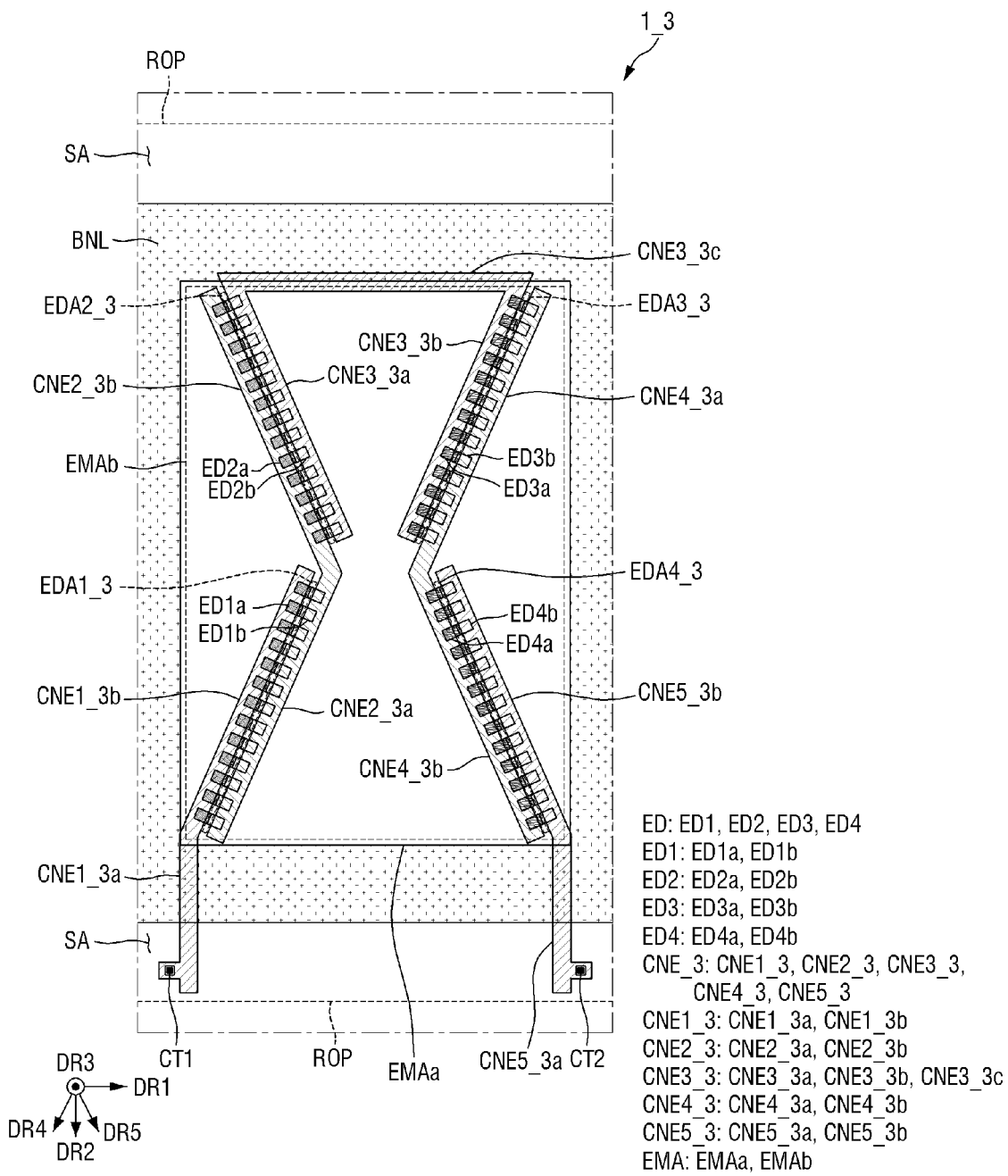
FIG. 20 is a schematic plan view illustrating the disposition of the connection electrode and the light emitting element of FIG. 18.

FIG. 18 is a schematic plan view illustrating a structure of a pixel of a display device according to yet another embodiment. FIG. 19 is a schematic plan view illustrating the disposition of the alignment electrode of FIG. 18. FIG. 20 is a schematic plan view illustrating the disposition of the connection electrode and the light emitting element of FIG. 18.

Referring to FIGS. 18 and 19, it is illustrated as an example that in a display device 1_3 according to this embodiment, passages EDA1_3, EDA2_3, EDA3_3, and EDA4_3 in which the light emitting element ED is disposed may form an 'X' shape. An internal bank BP_3, an alignment electrode RME_3, and a connection electrode CNE_3 included in the display device 1_3 according to this embodiment may be arranged to correspond to a shape in which the passages EDA1_3, EDA2_3, EDA3_3, and EDA4_3 are disposed.

The internal banks BP_3 may be disposed in the emission area EMA, and may have a shape bent in an inequality sign (<) shape convex to the other side in the first direction DR1 or an inequality sign (>) shape convex to one side in the first direction DR1. The internal bank BP_3 may include a first internal bank BP1_3, a second internal bank BP2_3, and a third internal bank BP3_3.

The first internal bank BP1_3 may have a shape bent in an inequality sign (>) shape convex to one side in the first direction DR1. The first internal bank BP1_3 may be disposed on another side of the emission area EMA in the first direction DR1.

The second internal bank BP2_3 may include a first-side internal bank BP2_3a having a shape bent in an inequality sign (>) shape convex in one side in the first direction DR1 and a second-side internal bank BP2_3b having a shape bent an inequality sign (<) shape convex in the other side in the first direction DR1.

The first-side internal bank BP2_3a may be disposed on a side of the first internal bank BP1_3 in the first direction DR1 to be engaged with the shape of the first internal bank BP1_3, and the second-side internal bank BP2_3b may be disposed on a side of the first-side internal bank BP2_3a in the first direction DR1 to be symmetrical with the shape of the first-side internal bank BP2_3a.

The third internal bank BP_3 may have a shape bent in an inequality sign (<) shape convex toward the other side in the first direction DR1. The third internal bank BP3_3 may be disposed on a side of the emission area EMA in the first direction DR1, for example, a side of the second-side internal bank BP2_3b in the first direction DR1, to be engaged with a shape of the second-side internal bank BP2_3b.

Each of the first internal bank BP1_3, the second internal bank BP2_3, and the third internal bank BP3_3 may have a portion extending in the fourth direction DR4 and a portion extending in the fifth direction DR5.

The first internal bank BP1_3, the second internal bank BP2_3, and the third internal bank BP3_3 extend in the fourth direction DR4 or the fifth direction DR5, such that separation spaces among the first internal bank BP1_3, the second internal bank BP2_3, and the third internal bank BP3_3 may also extend in the fourth direction DR4 or the fifth direction DR5. Accordingly, the light emitting elements ED may also be arranged in the fourth direction DR4 or the fifth direction DR5.

Alignment electrodes RME_3 may be disposed on the internal bank BP_3. The alignment electrode RME_3 may include a first alignment electrode RME1_3, a second alignment electrode RME2_3, a third alignment electrode RME3_3, and a fourth alignment electrode RME4_3 that are disposed to be spaced apart from each other. The first alignment electrode RME1_3 may be disposed on the first internal bank BP1_3, the second alignment electrode RME2_3 may be disposed on the first-side internal bank BP2_3a of the second internal bank BP2_3, the third alignment electrode RME3_3 may be disposed on the second-side internal bank BP2_3b of the second internal bank BP2_3, and the fourth alignment electrode RME4_3 may be disposed on the third internal bank BP3_3.

The first alignment electrode RME1_3 may have a curved shape in an inequality sign (>) shape protruding substantially toward a side in the first direction DR1. The first alignment electrode RME1_3 may include a first portion RME1_3a extending in the second direction DR2, a second portion RME1_3b extending in the fifth direction DR5, a third portion RME1_3c extending in the fourth direction DR4, and a fourth portion RME1_3d extending in the second direction DR2.

The first portion RME1_3a of the first alignment electrode RME1_3 may cross the external bank BNL and the sub-region SA disposed on the upper side of the emission area EMA, for example, on the other side in the second direction DR2. The first portion RME1_3a may extend to the separation portion ROP.

The second portion RME1_3b of the first alignment electrode RME1_3 may be a portion disposed in the emission area EMA, and may extend in the fifth direction DR5 in the emission area EMA. The second portion RME1_3b may extend from a side of the first portion RME1_3a in the second direction DR2 to another side of the third portion RME1_3c in the second direction DR2.

The third portion RME1_3c of the first alignment electrode RME1_3 may be a portion disposed in the emission area EMA, and may extend in the fourth direction DR4 in the emission area EMA. The third portion RME1_3c may extend from a side of the second portion RME1_3b in the second direction DR2 to another side of the fourth portion RME1_3d in the second direction DR2.

The fourth portion RME1_3d of the first alignment electrode RME1_3 may cross the external bank BNL and the sub-region SA disposed on the lower side of the emission area EMA, for example, on a side in the second direction DR2. The fourth portion RME1_3d may extend to the separation portion ROP. The fourth portion RME1_3d may be electrically connected to the above-described circuit element layer through the first electrode contact hole CTD penetrating the external bank BNL.

The second alignment electrode RME2_3 may have a curved shape in an inequality sign (>) shape protruding substantially toward one side in the first direction DR1. The second alignment electrode RME2_3 may include a first portion RME2_3a extending in the second direction DR2, a second portion RME2_3b extending in the fifth direction DR5, a third portion RME2_3c extending in the fourth direction DR4, and a fourth portion RME2_3d extending in the second direction DR2.

The first portion RME2_3a of the second alignment electrode RME2_3 may cross the external bank BNL and the sub-region SA disposed on the upper side of the emission area EMA, for example, on the other side in the second direction DR2. The first portion RME2_3a may extend to the separation portion ROP.

The second portion RME2_3b of the second alignment electrode RME2_3 may be a portion disposed in the emission area EMA, and may extend in the fifth direction DR5 in the emission area EMA. The second portion RME2_3b may extend from a side of the first portion RME2_3a in the second direction DR2 to another side of the third portion RME2_3c in the second direction DR2.

The third portion RME2_3c of the second alignment electrode RME2_3 may be a portion disposed in the emission area EMA, and may extend in the fourth direction DR4 in the emission area EMA. The third portion RME2_3c may extend from a side of the second portion RME2_3b in the second direction DR2 to another side of the fourth portion RME2_3d in the second direction DR2.

The fourth portion RME2_3d of the second alignment electrode RME2_3 may cross the external bank BNL and the sub-region SA disposed on the lower side of the emission area EMA, for example, on a side in the second direction DR2. The fourth portion RME2_3d may extend to the separation portion ROP.

The third alignment electrode RME3_3 may have a curved shape in an inequality sign (<) shape protruding substantially toward the other side in the first direction DR1. The third alignment electrode RME3_3 may include a first portion RME3_3a extending in the second direction DR2, a second portion RME3_3b extending in the fourth direction DR4, a third portion RME3_3c extending in the fifth direction DR5, and a fourth portion RME3_3d extending in the second direction DR2.

The first portion RME3_3a of the third alignment electrode RME3_3 may cross the external bank BNL and the sub-region SA disposed on the upper side of the emission area EMA, for example, on the other side in the second direction DR2. The first portion RME3_3a may extend to the separation portion ROP.

The second portion RME3_3b of the third alignment electrode RME3_3 may be a portion disposed in the emission area EMA, and may extend in the fourth direction DR4 in the emission area EMA. The second portion RME3_3b may extend from a side of the first portion RME3_3a in the second direction DR2 to another side of the third portion RME3_3c in the second direction DR2.

The third portion RME3_3c of the third alignment electrode RME3_3 may be a portion disposed in the emission area EMA, and may extend in the fifth direction DR5 in the emission area EMA. The third portion RME3_3c may extend from a side of the second portion RME3_3b in the second direction DR2 to another side of the fourth portion RME3_3d in the second direction DR2.

The fourth portion RME3_3d of the third alignment electrode RME3_3 may cross the external bank BNL and the sub-region SA disposed on the lower side of the emission area EMA, for example, on one side in the second direction DR2. The fourth portion RME3_3d may extend to the separation portion ROP.

The fourth alignment electrode RME4_3 may have a curved shape in an inequality sign (<) shape protruding substantially toward the other side in the first direction DR1. The fourth alignment electrode RME4_3 may include a first portion RME4_3a extending in the second direction DR2, a second portion RME4_3b extending in the fourth direction DR4, a third portion RME4_3c extending in the fifth direction DR5, and a fourth portion RME4_3d extending in the second direction DR2.

The first portion RME4_3a of the fourth alignment electrode RME4_3 may cross the external bank BNL and the sub-region SA disposed on the upper side of the emission area EMA, for example, on the other side in the second direction DR2. The first portion RME4_3a may extend to the separation portion ROP.

The second portion RME4_3b of the fourth alignment electrode RME4_3 may be a portion disposed in the emission area EMA, and may extend in the fourth direction DR4 in the emission area EMA. The second portion RME4_3b may extend from a side of the first portion RME4_3a in the second direction DR2 to another side of the third portion RME4_3c in the second direction DR2.

The third portion RME4_3c of the fourth alignment electrode RME4_3 may be a portion disposed in the emission area EMA, and may extend in the fifth direction DR5 in the emission area EMA. The third portion RME4_3c may extend from a side of the second portion RME4_3b in the second direction DR2 to another side of the fourth portion RME4_3d in the second direction DR2.

The fourth portion RME4_3d of the fourth alignment electrode RME4_3 may cross the external bank BNL and the sub-region SA disposed on the lower side of the emission area EMA, for example, on one side in the second direction DR2. The fourth portion RME4_3d may extend to the separation portion ROP. The fourth portion RME4_3d may be electrically connected to the above-described circuit element layer through the second electrode contact hole CTS penetrating the external bank BNL.

As illustrated in FIG. 19, the first alignment electrode RME1_3, the second alignment electrode RME2_3, the third alignment electrode RME3_3, and the fourth alignment electrode RME4_3 may be spaced apart from each other in the first direction DR1, and the separation space between the first alignment electrode RME1_3 and the second alignment electrode RME2_3, and the separation space between the third alignment electrode RME3_3 and the fourth alignment electrode RME4_3 in the emission area EMA may define the passages EDA1_3, EDA2_3, EDA3_3, and EDA4_3 in which the light emitting elements ED are arranged.

The second passage EDA2_3 may be disposed in the separation space between the first portion RME1_3a of the first alignment electrode RME1_3 and the first portion RME2_3a of the second alignment electrode RME2_3, the first passage EDA1_3 may be disposed in the separation space between the second portion RME1_3b of the first alignment electrode RME1_3 and the second portion RME2_3b of the second alignment electrode RME2_3, the third passage EDA3_3 may be disposed in the separation space between the first portion RME3_3a of the third alignment electrode RME3_3 and the first portion RME4_3a of the fourth alignment electrode RME4_3, and the fourth passage EDA4_3 may be disposed in the separation space between the second portion RME3_3b of the third alignment electrode RME3_3 and the second portions RME4_3b of the fourth alignment electrode RME4_3.

Accordingly, the first passage EDA1_3 and the third passage EDA3_3 may extend in the fourth direction DR4, and the second passage EDA2_3 and the fourth passage EDA4_3 may extend in the fifth direction DR5. The first passage EDA1_3 may be disposed on a side of the second passage EDA2_3 in the second direction DR2, and accordingly, the shape of the passages EDA1_3, EDA2_3, EDA3_3, and EDA4_3 may have an 'X' shape. On the other hand, the separation space between the first passage EDA1_3 and the second passage EDA2_3 may be a space in which a second portion CNE2_3b of a second connection electrode CNE2_3 to be described below is disposed, and the separation space between the third passage EDA3_3 and the fourth passage EDA4_3 may be a space in which a first portion CNE4_3a of a fourth connection electrode CNE4_3 to be described below is disposed. The separation space between the first passage EDA1_3 and the second passage EDA2_3, and the separation space between the third passage EDA3_3 and the fourth passage EDA4_3 may be positioned in the central portion of the emission area EMA.

Since the orientation relationship of the light emitting element ED of the display device 1_3 according to this embodiment may be substantially the same as the orientation relationship of the light emitting element ED of the display device 1_1 according to the embodiment of FIG. 12, the description thereof will be omitted.

An end and another end of each of the different light emitting elements ED may be electrically connected by the connection electrode CNE_3.

The connection electrode CNE_3 may be disposed on the light emitting element ED. The connection electrode CNE_3 may include a first connection electrode CNE1_3, a second connection electrode CNE2_3, a third connection electrode CNE3_3, a fourth connection electrode CNE4_3, and a fifth connection electrode CNE5_3 that are disposed to be spaced apart from each other.

The first connection electrode CNE1_3 may include a first portion CNE1_3a extending substantially in the second direction DR2 and a second portion CNE1_3b extending in the fourth direction DR4 in the emission area EMA.

The first portion CNE1_3a of the first connection electrode CNE1_3 may be disposed on one side in the second direction DR2 in the emission area EMA to overlap the first alignment electrode RME1_3 in the third direction DR3, and may be electrically connected to the first alignment electrode RME1_3 through the first contact portion CT1.

The second portion CNE1_3b of the first connection electrode CNE1_3 may contact an end ED_1a of each of the first light emitting elements ED1. The second portion CNE1_3b may extend in the fourth direction DR4, and may extend to a portion in which the first passage EDA1_3 is disposed. In other words, the second portion CNE1_3b may extend to only a vicinity of the center of the emission area EMA, for example, a vicinity in which the first light emitting elements ED1 are arranged.

The second connection electrode CNE2_3 may have a curved shape in an inequality sign (>) shape protruding substantially toward one side in the first direction DR1. The second connection electrode CNE2_3 may serve to electrically connect another end ED1b of the first light emitting element ED1 with an end ED2a of the second light emitting element ED2. The second connection electrode CNE2_3 may include a first portion CNE2_3a extending in the fourth direction DR4 and the second portion CNE2_3b extending in the fifth direction DR5.

The first portion CNE2_3a of the second connection electrode CNE2_3 may contact another end ED1b of each of the first light emitting elements ED1. The first portion CNE2_3a may extend in the fourth direction DR4 to a vicinity in which the second portion CNE1_3b of the first connection electrode CNE1_3 extends, for example, to a vicinity in which the first light emitting elements ED1 are arranged.

The second portion CNE2_3b of the second connection electrode CNE2_3 may contact an end ED2a of each of the second light emitting elements ED2. The second portion CNE2_3b may extend in the fifth direction DR5 to a vicinity in which the second light emitting elements ED2 are arranged, in the emission area EMA. The second portion CNE2_3b may be connected to the first portion CNE2_3a across the separation space between the first passage EDA1_3 and the second passage EDA2_3 described above.

The third connection electrode CNE3_3 may serve to electrically connect another end ED2b of the second light emitting element ED2 with an end ED3a of the third light emitting element ED3. The third connection electrode CNE3_3 may include a first portion CNE3_3a extending in the fifth direction DR5, a second portion CNE3_3b extending in the fourth direction DR4, and a connection portion CNE3_3c connecting the first portion CNE3_3a with the second portion CNE3_3b.

The first portion CNE3_3a of the third connection electrode CNE3_3 may contact another end ED2b of each of the second light emitting elements ED2. The first portion CNE3_3a may extend in the fifth direction DR5 to a vicinity in which the second light emitting elements ED2 are arranged, in the emission area EMA. In other words, the first portion CNE3_3a of the third connection electrode CNE3_3 may extend to a vicinity in which the second portion CNE2_3b of the second connection electrode CNE2_3 is disposed.

The second portion CNE3_3b of the third connection electrode CNE3_3 may contact an end ED3a of each of the third light emitting elements ED3. The second portion CNE3_3b may extend in the fourth direction DR4 to a vicinity in which the third light emitting element ED3 is arranged in the emission area EMA.

The connection portion CNE3_3c of the third connection electrode CNE3_3 may serve to connect the first portion CNE3_3a with the second portion CNE3_3b. The third connection electrode CNE3_3 may connect another side of the first portion CNE3_3a in the second direction DR2 with another side of the second portion CNE3_2b in the second direction DR2. The third connection electrode CNE3_3 may extend in the first direction DR1 to connect the first portion CNE3_3a with the second portion CNE3_3b. In some embodiments, the connection portion CNE3_3c may be positioned on another side of the emission area EMA in the second direction DR2.

The fourth connection electrode CNE4_3 may have a curved shape in an inequality sign (<) shape protruding substantially toward the other side in the first direction DR1. The fourth connection electrode CNE4_3 may serve to electrically connect another end ED3b of the third light emitting element ED3 with an end ED4a of the fourth light emitting element ED4. The fourth connection electrode CNE4_3 may include the first portion CNE4_3a extending in the fourth direction DR4 and a second portion CNE4_3b extending in the fifth direction DR5.

The first portion CNE4_3a of the fourth connection electrode CNE4_3 may contact another end ED3b of each of the third light emitting elements ED3. The first portion CNE4_3a may extend in the fourth direction DR4 to a vicinity in which the second portion CNE3_3b of the third connection electrode CNE3_3 extends, for example, to a vicinity in which the third light emitting elements ED3 are arranged. The first portion CNE4_3a may be connected to the second portion CNE4_3b across the separation space between the third passage EDA3_3 and the fourth passage EDA4_3 described above.

The second portion CNE4_3b of the fourth connection electrode CNE4_3 may contact an end ED4a of each of the fourth light emitting elements ED4. The second portion CNE4_3b may extend in the fifth direction DR5 to a vicinity in which the fourth light emitting elements ED4 are arranged in the emission area EMA.

The fifth connection electrode CNE5_3 may include a first portion CNE5_3a extending substantially in the second direction DR2 and a second portion CNE5_3b extending in the fifth direction DR5 in the emission area EMA.

The first portion CNE5_3a of the fifth connection electrode CNE5_3 may overlap the fourth alignment electrode RME4_3 in the third direction DR3, and may be electrically connected to the fourth alignment electrode RME4_3 through the second contact portion CT2.

The second portion CNE5_3b of the fifth connection electrode CNE5_3 may contact another end ED1b of each of the fourth light emitting elements ED4. The second portion CNE5_3b may extend in the fifth direction DR5, and may extend to a portion in which the fourth passage EDA4_3 is disposed. In other words, the second portion CNE5_3b may extend to only a vicinity of the center of the emission area EMA, for example, a vicinity in which the fourth light emitting elements ED4 are arranged.

Similar to the case of the display device 1 according to an embodiment, the length of each of the first passage EDA1_3, the second passage EDA2_3, the third passage EDA3_3, and the fourth passage EDA4_3 in the fourth direction DR4 according to this embodiment may be substantially equal to or greater than a half of the length of the long side EMAb of the emission area EMA in the second direction DR2. A length L1_3 of the first passage EDA1_3 in the fourth direction DR4, a length L2_3 of the second passage EDA2_3 in the fifth direction DR5, a length L3_3 of the third passage EDA3_3 in the fourth direction DR4, and a length L4_3 of the fourth passage EDA4_3 in the fifth direction DR5 may be substantially equal to or greater than the length of the first width H1.

Each of the length L1_3 of the first passage EDA1_3 in the fourth direction DR4, the length L2_3 of the second passage EDA2_3 in the fifth direction DR5, the length L3_3 of the third passage EDA3_3 in the fourth direction DR4, and the length L4_3 of the fourth passage EDA4_3 in the fifth direction DR5 may be substantially equal to or greater than about 44 μm.

With the above-described configuration, the number of light emitting elements ED that provides the minimum luminous efficiency required by the display device while the light emitting elements ED are freely disposed, may be readily secured.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
   a bank disposed on a substrate and defining an emission area;
   a first passage in which a first light emitting element is disposed in the emission area;
   a second passage in which a second light emitting element is disposed in the emission area;
   a third passage in which a third light emitting element is disposed in the emission area; and
   a fourth passage in which a fourth light emitting element is disposed in the emission area, wherein
   the emission area has a rectangular shape comprising a first side extending in a first direction and a second side extending in a second direction intersecting the first direction and having a length longer than the first side, and
   the first passage, the second passage, the third passage, and the fourth passage are spaced apart from each other, and each extends in a third direction intersecting the first direction and the second direction.

2. The display device of claim 1, wherein a length of each of the first passage, the second passage, the third passage, and the fourth passage is substantially equal to or greater than one half of a length of the second side of the emission area.

3. The display device of claim 2, wherein the length of each of the first passage, the second passage, the third passage, and the fourth passage is substantially equal to or greater than about 44 μm.

4. The display device of claim 1, wherein
   each of the first light emitting element, the second light emitting element, the third light emitting element and the fourth light emitting element comprises:
   an end having a first polarity; and
   another end having a second polarity different from the first polarity, and the another end of the first light emitting element is electrically connected to the end of the second light emitting element, the another end of the second light emitting element is electrically connected to the end of the third light emitting element, and the another end of the third light emitting element is electrically connected to the end of the fourth light emitting element.

5. The display device of claim 4, further comprising:

an alignment electrode disposed between the substrate and the bank, wherein the alignment electrode comprises:

a first alignment electrode on which the end of the first light emitting element and the end of the second light emitting element are disposed;

a second alignment electrode on which the another end of the first light emitting element, the another end of the second light emitting element, the another end of the third light emitting element, and the another end of the fourth light emitting element are disposed; and a third alignment electrode on which the another end of the third light emitting element and the another end of the fourth light emitting element are disposed, the first alignment electrode, the second alignment electrode, and the third alignment electrode are spaced apart from each other, and each extends in the third direction in the emission area, and the first light emitting element, the second light emitting element, the third light emitting element and the fourth light emitting element are spaced apart from each other.

6. The display device of claim 5, further comprising:

a circuit element layer disposed between the substrate and the alignment electrode, wherein the first alignment electrode is electrically connected to the circuit element layer and receives a first voltage, and the second alignment electrode is electrically connected to the circuit element layer and receives a second voltage.

7. The display device of claim 6, further comprising:

a first connection electrode electrically connected to the first alignment electrode and supplying the first voltage to the end of the first light emitting element;

a second connection electrode that electrically connects the another end of the first light emitting element with the end of the second light emitting element;

a third connection electrode that electrically connects the another end of the second light emitting element with the end of the third light emitting element;

a fourth connection electrode that electrically connects the another end of the third light emitting element with the end of the fourth light emitting element; and a fifth connection electrode electrically connected to the second alignment electrode and supplying the second voltage to the another end of the fourth light emitting element, wherein the first connection electrode, the second connection electrode, the third connection electrode, the fourth connection electrode, and the fifth connection electrode are each spaced apart from each other.

8. The display device of claim 7, wherein the second connection electrode comprises:

a first portion disposed on the another end of the first light emitting element;

a second portion disposed on the end of the second light emitting element; and a first connection portion that connects the first portion with the second portion, the fourth connection electrode comprises:

a third portion disposed on the end of the third light emitting element;

a fourth portion disposed on the another end of the fourth light emitting element; and a second connection portion that connects the third portion with the fourth portion, the first connection portion passes through a separation space between the first passage and the second passage, and the second connection portion passes through a separation space between the third passage and the fourth passage.

9. The display device of claim 8, wherein the first alignment electrode and the circuit element layer are electrically connected through a first contact hole that does not overlap the emission area in plan view, the second alignment electrode and the circuit element layer are electrically connected through a second contact hole that does not overlap the emission area in plan view, the first connection electrode and the first alignment electrode are electrically connected through a third contact hole that does not overlap the emission area in plan view, and the fifth connection electrode and the second alignment electrode are electrically connected through a fourth contact hole that does not overlap the emission area in plan view.

\* \* \* \* \*